(12) United States Patent
Nakane et al.

(10) Patent No.: US 8,400,099 B2
(45) Date of Patent: Mar. 19, 2013

(54) METER SYSTEM WITH INDICATOR FOR VEHICLE

(75) Inventors: Hideyuki Nakane, Nishio (JP); Masaaki Niwa, Nagoya (JP); Takashi Mizutani, Yokkaichi (JP); Hironori Watarai, Obu (JP); Teruyuki Anjima, Tokai (JP)

(73) Assignee: Denso Corporation, Kariya (JP)

( * ) Notice: Subject to any disclaimer, the term of this patent is extended or adjusted under 35 U.S.C. 154(b) by 370 days.

(21) Appl. No.: 12/925,698

(22) Filed: Oct. 27, 2010

(65) Prior Publication Data

US 2011/0100290 A1    May 5, 2011

(30) Foreign Application Priority Data

| Oct. 30, 2009 | (JP) | 2009-251188 |
| Oct. 30, 2009 | (JP) | 2009-251189 |
| Oct. 30, 2009 | (JP) | 2009-251190 |
| Oct. 30, 2009 | (JP) | 2009-251191 |
| Nov. 13, 2009 | (JP) | 2009-260196 |
| Mar. 29, 2010 | (JP) | 2010-76073 |

(51) Int. Cl.
*H02P 8/00* (2006.01)

(52) U.S. Cl. ........ 318/696; 318/685; 318/603; 318/599; 318/164; 318/163

(58) Field of Classification Search .................. 318/696, 318/685, 163, 164, 599, 603
See application file for complete search history.

(56) References Cited

U.S. PATENT DOCUMENTS

| 6,014,075 | A | 1/2000 | Fujimori et al. |
| 7,034,495 | B2 * | 4/2006 | Sasaki ........................... 318/685 |
| 2002/0117988 | A1 | 8/2002 | Komura |

FOREIGN PATENT DOCUMENTS

| JP | 6-38593 | 2/1994 |
| JP | 9-42996 | 2/1997 |
| JP | 2000-203310 | 7/2000 |
| JP | 2002-5698 | 1/2002 |
| JP | 2003-125599 | 4/2003 |
| JP | 2010-60470 | 3/2010 |

* cited by examiner

*Primary Examiner* — Walter Benson
*Assistant Examiner* — David Luo
(74) *Attorney, Agent, or Firm* — Harness, Dickey & Pierce, PLC

(57) ABSTRACT

A meter system includes: an indicator including a pointer, a step motor, a stopper mechanism and a driving controller; and a flasher function unit including a flasher switch, a flasher and a flasher controller. The driving controller has: a stopper position detection operation executing element for executing a pointer moving away operation when a stopper position detection operation executing condition is satisfied and for executing a voltage detection type zero point stopper position detection operation when the executing condition is satisfied, and the flasher switch does not turn on and off, and a zero point return enforcement type zero point stopper position detection operation when the executing condition is satisfied, and the flasher switch turns on and off; a zero point setting element; and an applying element for applying the driving signal having the zero point.

41 Claims, 16 Drawing Sheets

| | | OPERATION | | |
|---|---|---|---|---|
| | | AUTO RES FUNC | HAZARD | TURN |
| +B | WAKE UP | FLASHER 1 | FLASHER 2 | — |
| | RESET | FLASHER 1 | — | — |
| | ZPD | FLASHER 1 | ZPD | — |
| IG | RESET | — | ZPD | FLASHER 3 |
| | ZPD | — | ZPD | FLASHER 3 |

T2

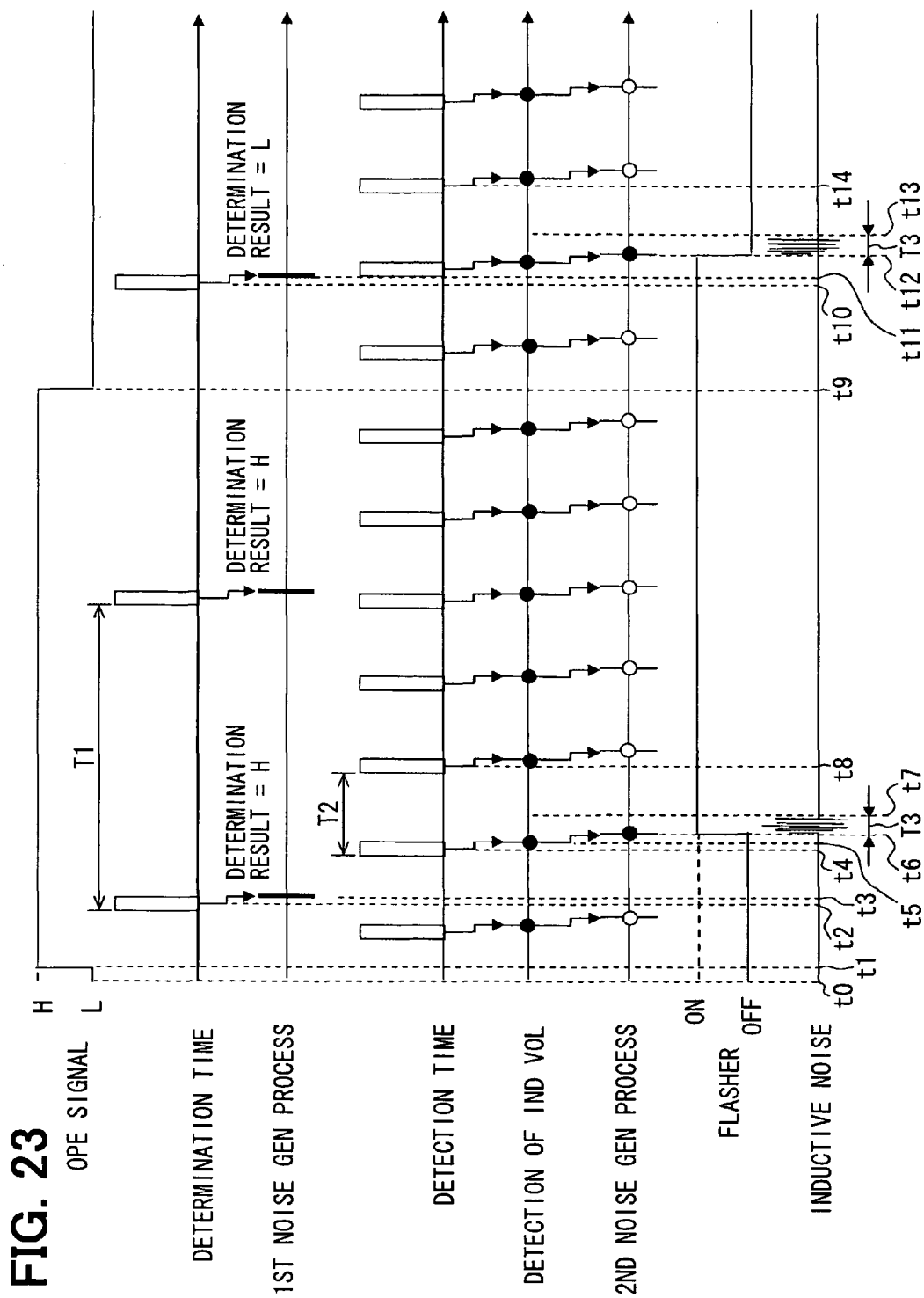

METER SYSTEM WITH INDICATOR FOR VEHICLE

CROSS REFERENCE TO RELATED APPLICATIONS

This application is based on Japanese Patent Applications No. 2009-251188 filed on Oct. 30, 2009, No. 2009-251189 filed on Oct. 30, 2009, No. 2009-251190 filed on Oct. 30, 2009, No. 2009-251191 filed on Oct. 30, 2009, No. 2009-260196 filed on Nov. 13, 2009, No. 2010-76073 filed on Mar. 29, 2010, the disclosures of which are incorporated herein by reference.

FIELD OF THE INVENTION

The present invention relates to a meter system for a vehicle including an indicator that drives a pointer with using a step motor.

BACKGROUND OF THE INVENTION

Conventionally, an indicator for a vehicle that indicates a vehicle condition value according to a rotation position of a pointer is well known. A driving signal is applied to a field winding of a step motor so that the pointer is rotated. The driving signal is alternately oscillated according to an electric angle. In this indicator, the pointer rotates toward a zero point returning direction so that the pointer returns to a zero point position, which shows a zero value of the vehicle condition value.

In an indicator for a vehicle described in JP-A-H06-38593, a pointer rotates toward a zero point return direction that shows zero value of a vehicle condition so that the pointer returns to the zero point. A driving signal is applied to a field winding of a step motor, and is controlled to rotate the pointer toward the zero point return direction by a zero point angle of an electric angle corresponding to a scale angle equal to or larger than a maximum scale angle. Then, a stopper system stops the pointer at a stopper position, which is disposed in a predetermined range from the zero point toward the zero point return direction. Specifically, in this case, a zero point stopper position detection with zero point return enforcement function is executed. Here, the electric angle corresponding to the stopper position is defined as a reference angle of driving signal control.

In an indicator for a vehicle described in JP-B2-3770095 corresponding to US 2002/0117988, a driving signal is applied to a field winding of a step motor and is controlled to rotate a pointer toward a zero point return direction. In this case, an induced voltage generated in the field winding is detected thus, when the pointer is rotating, the induced voltage is generated in the field winding. When the pointer stops rotating, the induced voltage in the field winding is reduced. Thus, when the detected induced voltage in the field winding is equal to or smaller than a predetermined value, the indicator estimates that the pointer stops at the stopper position. Specifically, a voltage type zero point stopper position detection is executed. An electric angle corresponding to the stopper position is updated and registered. In this process, it is possible to control the driving signal accurately according to the updated and registered electric angle even if the step motor malfunctions because of external disturbance such as vibration so that the rotation position of the pointer is shifted from a certain position before the indicator starts to function.

A meter system includes an indicator for a vehicle, a turn lamp or a hazard lamp, a buzzer and a flasher device for controlling a lamp to turn on and off and for controlling a buzzer to outputting sound in conjunction with the lamp. Here, the turn lamp, the hazard lamp the buzzer and the flasher device may generate a noise. The noise generates magnetic field, which influences the field winding. Recently, the flasher device is integrated with the indicator so that the indicator has a flasher function. Thus, the meter system is much integrated, and a manufacturing cost is reduced.

However, when the indicator has the flasher function, it is necessary to arranged a flasher semiconductor switch around the field winding of the indicator. The flasher semiconductor switch turns on and off the flasher device. Further, the switch turns on and off when the flasher device switches on and off. An inductive noise may be generated when the switch turns on and off.

Accordingly, when the semiconductor switch of a flasher function unit functions while the voltage type zero point stopper position detection is executed, detection error of the stopper position may occur because of the inductive noise. Thus, the stopper position may shift, and therefore, the indicator does not show a correct value of the vehicle condition value. Specifically, even if the pointer does not contact the stopper, the system mistakes to determine that the pointer contacts and stops at the stopper. Alternatively, even if the pointer contacts and stops at the stopper, the system mistakes to determine that the pointer rotates. In these cases, the pointer does not indicate the correct vehicle condition value.

On the other hand, even when the semiconductor switch of the flasher function unit functions while the zero point stopper position detection with zero point return enforcement function is executed, the detection error of the stopper position caused by the inductive noise is not generated, and the stopper position does not shift. However, in the zero point stopper position detection with zero point return enforcement function, loss of synchronism and zero point return operation are alternately repeated under a condition that the pointer stops at the stopper position. Thus, the pointer may vibrate. In this case, visual quality of the meter system is not good, and or abnormal noise may be generated. Thus, a user may feel strangeness, so that the user may consider that the meter system is broken.

Further, it is necessary to satisfy a predetermined stopper position detection operation executing condition when the stopper position detection operation is executed. The stopper position detection operation executing condition includes a high necessity executing condition and a confirmation executing condition. The high necessity executing condition provides high necessity for executing the stopper position detection operation rapidly since a possibility that the pointer is spaced apart from the stopper position is high. The confirmation executing condition provides necessity for executing the stopper position detection operation in order to confirm the zero point although a possibility that the pointer is spaced apart from the stopper position is low. When the high necessity executing condition is satisfied, the necessity for executing the stopper position detection operation is high. When the confirmation executing condition is satisfied, the necessity for executing the stopper position detection operation is not high. When the stopper position detection operation is executed, the vehicle condition value is indicated with high accuracy. However, the user may feel strangeness since the pointer rotates toward the zero point returning direction although the user does not operate the meter system.

Further, in view of the above difficulty, it is considered that the stopper position detection operation is executed in priority to the flasher function. However, the user merely recognizes the operation of the flasher when the flasher blinks. Accordingly, when the user operates the combination lever or when the user switches the hazard lamp on, if the blink of the flasher is delayed, the user may misunderstand that the flasher is broken.

SUMMARY OF THE INVENTION

In view of the above-described problem, it is an object of the present disclosure to provide a meter system for a vehicle including an indicator that drives a pointer with using a step motor. A pointing error of a vehicle condition value is reduced, and a user does not feel strangeness of operation of the meter system.

According to a first aspect of the present disclosure, a meter system for a vehicle includes: an indicator including a pointer, a step motor, a stopper mechanism and a driving control unit; and a flasher function unit including a flasher semiconductor switch, a flasher and a flasher control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element executes a pointer moving away operation for controlling the driving signal to rotate the pointer toward a moving away direction opposite to the zero point returning direction when a predetermined stopper position detection operation executing condition is satisfied. The stopper position detection operation executing element executes further executes a voltage detection type zero point stopper position detection operation after the stopper position detection operation executing element executes the pointer moving away operation. The voltage detection type zero point stopper position detection operation provides to control the driving signal for rotating the pointer toward the zero point returning direction, and provides to detect an inductive voltage generated in the field winding. The voltage detection type zero point stopper position detection operation provides to determine based on the induction voltage whether the pointer stops at the stopper position. The zero point setting element sets the zero point to be an electric angle corresponding to the stopper position, which is detected in the voltage detection type zero point stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The flasher semiconductor switch is disposed adjacent to the field winding. The stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position. The stopper position detection operation executing element executes the zero point return enforcement type zero point stopper position detection operation when the stopper position detection operation executing condition is satisfied, and the flasher semiconductor switch turns on and off to blink the flasher. The stopper position detection operation executing element executes the voltage detection type zero point stopper position detection operation when the stopper position detection operation executing condition is satisfied, and the flasher semiconductor switch does not turn on and off to blink the flasher.

In the above system, when there is a low possibility that the induction voltage of the field winding is influenced, by the induction noise generated by the flasher semiconductor switch, the voltage detection type zero point stopper position detection operation is performed. Then, the electric angle corresponding to the stopper position detected in the voltage detection type zero point stopper position detection operation is set as the zero point. When there is a high possibility that the induction voltage of the field winding is influenced by the induction noise generated by the flasher semiconductor switch, the zero point return enforcement type zero point stopper position detection operation is performed. Then, the zero point in the zero point return enforcement type zero point stopper position detection operation is set. Thus, the user pays attention to the blink of the flasher, the user does not feel strangeness even if the vibration and abnormal noise of the pointer are generated. Thus, the system is integrated, and the indication of the vehicle speed is improved, and further, the strange feeling of the user is reduced.

According to a second aspect of the present disclosure, a meter system for a vehicle includes: an indicator including a pointer, a step motor, a stopper mechanism and a driving control unit; and a flasher function unit including a flasher semiconductor switch, a flasher, a flasher control unit, a buzzer semiconductor switch, a buzzer and a buzzer control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element executes a pointer moving away operation for controlling the driving signal to rotate the pointer toward a moving away direction opposite to the zero point returning direction when a predetermined stopper position detection operation executing condition is satisfied. The stopper position detection operation executing element executes further executes a voltage detection type zero point stopper position detection operation after the stopper position detection operation executing element executes the pointer moving away operation. The voltage detection type zero point stopper position detection operation provides to control the driving signal for rotating the pointer toward the zero point returning direction, and provides to detect an inductive voltage generated in the field winding. The voltage detection type zero point stopper position detection operation provides to determine based on the induction voltage whether the pointer stops at the stopper position. The zero point setting element sets the zero point to be an electric angle corresponding to the stopper position, which is detected in the voltage detection type zero point stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The buzzer outputs sound when the buzzer semiconductor switch turns on and off. The buzzer control unit controls the buzzer semiconductor switch to turn on and off in association with the flasher semiconductor switch. At least one of the flasher semiconductor switch and the buzzer semiconductor switch is disposed adjacent to the field winding. The stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position. The stopper position detection operation executing element executes the zero point return enforcement type zero point stopper position detection operation when the stopper position detection operation executing condition is satisfied, and the at least one of the flasher semiconductor switch and the buzzer semiconductor switch turns on and off to blink the flasher or to output the sound from the buzzer. The stopper position detection operation executing element executes the voltage detection type zero point stopper position detection operation when the stopper position detection operation executing condition is satisfied, and the at least one of the flasher semiconductor switch and the buzzer semiconductor switch does not turn on and off to blink the flasher or to output the sound from the buzzer.

In the above system, when there is a low possibility that the induction voltage of the field winding is influenced by the induction noise generated by the at least one of the flasher semiconductor switch and the buzzer semiconductor switch turns on and off to blink the flasher or to output the sound from the buzzer, the voltage detection type zero point stopper position detection operation is performed. Then, the electric angle corresponding to the stopper position detected in the voltage detection type zero point stopper position detection operation is set as the zero point. When there is a high possibility that the induction voltage of the field winding is influenced by the induction noise generated by the at least one of the flasher semiconductor switch and the buzzer semiconductor switch turns on and off to blink the flasher or to output the sound from the buzzer, the zero point return enforcement type zero point stopper position detection operation is performed. Then, the zero point in the zero point return enforcement type zero point stopper position detection operation is set. Thus, the user pays attention to the blink of the flasher or the output of the sound, the user does not feel strangeness even if the vibration and abnormal noise of the pointer are generated. Thus, the system is integrated, and the indication of the vehicle speed is improved, and further, the strange feeling of the user is reduced.

According to a third aspect of the present disclosure, a meter system for a vehicle includes: an indicator including a pointer, a step motor, a stopper mechanism and a driving control unit; and a flasher function unit including a flasher semiconductor switch, a flasher and a flasher control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element controls the driving signal to rotate the pointer toward the zero point returning direction when a predetermined stopper position detection operation executing condition is satisfied, detects an inductive voltage generated in the field winding of the step motor, and determines based on the inductive voltage whether the pointer stops at the stopper position. The zero point setting element sets the zero point to be an electric angle corresponding to the stopper position, which is detected in the stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The flasher semiconductor switch is disposed adjacent to the field winding. The stopper position detection operation is not executed when the flasher semiconductor switch turns on and off.

Thus, the stopper position is detected by the stopper position detection operation without being affected by the inductive noise generated by the on and off operation of the flasher semiconductor switch. Thus, the driving control unit sets the zero point to be the electric angle corresponding to the stopper position, which has a low possibility to be affected by the inductive noise. Thus, the possibility that an inaccurate zero point becomes the standard of the driving signal is low. The system indicates the vehicle condition value accurately. Accordingly, the system is integrated, and further, indicates the accurate vehicle condition value.

According to a fourth aspect of the present disclosure, a meter system for a vehicle includes: an indicator including a pointer, a step motor, a stopper mechanism and a driving control unit; and a flasher function unit including a flasher semiconductor switch, a flasher and a flasher control unit, a buzzer semiconductor switch, a buzzer and a buzzer control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element controls the driving signal to rotate the pointer toward the zero point returning direction when a predetermined stopper position detection operation executing condition is satisfied, detects an inductive voltage generated in the field winding of the step motor, and determines based on the inductive voltage whether the pointer stops at the stopper position. The zero point setting element sets the zero point to be an electric angle corresponding to the stopper position, which is detected in the stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The buzzer outputs sound when the buzzer semiconductor switch turns on and off. The buzzer control unit controls the buzzer semiconductor switch to turn on and off in association with the flasher semiconductor switch. At least one of the flasher semiconductor switch and the buzzer semiconductor switch is disposed adjacent to the field winding. The stopper position detection operation is not executed when the at least one of the flasher semiconductor switch and the buzzer semiconductor switch turns on and off.

Thus, the stopper position is detected by the stopper position detection operation without being affected by the inductive noise generated by the on and off operation of the at least one of the flasher semiconductor switch and the buzzer semiconductor switch, which is disposed adjacent to the field winding. Thus, the driving control unit sets the zero point to be the electric angle corresponding to the stopper position, which has a low possibility to be affected by the inductive noise. Thus, the possibility that an inaccurate zero point becomes the standard of the driving signal is low. The system indicates the vehicle condition value accurately. Accordingly, the system is integrated, and further, indicates the accurate vehicle condition value.

According to a fifth aspect of the present disclosure, a meter system for a vehicle includes: a pointer for indicating a vehicle condition value according to a rotation position of the pointer, wherein the pointer is rotatable along with a display surface of a scale plate for displaying the vehicle condition value; a step motor for rotating the pointer, wherein the step motor includes a stator and a magnet rotor, the stator has a field winding for generating a first magnetic field when a driving signal is applied to the field winding in accordance with the vehicle condition value, and, the magnet rotor is supported coaxially with the stator and is rotatable according to the first magnetic field; a stopper mechanism for stopping rotating the pointer at a stopper position, which is disposed within a predetermined range from a zero point position toward a zero point returning direction, when the pointer rotates toward the zero point returning direction, wherein the zero point position shows a zero point of the vehicle condition value; a detection element for detecting an inductive voltage at predetermined detection intervals, wherein the inductive voltage is generated in the field winding; a driving control unit for controlling the driving signal with using the zero point as a standard, wherein the driving control unit executes a zero point stopper position detection operation for detecting an electric angle of the pointer based on the inductive voltage when the pointer stops at the stopper position, and the driving control unit sets the zero point to be equal to the electric angle; and a noise generating element for generating a second magnetic field during a generation period when a noise generating signal is input into the noise generating element, wherein the generation period has a starting time, at which the noise generating signal is input into the noise generating element. The detection time interval is longer than the generation period, and the driving control unit controls the noise generating signal to input into the noise generating element in such a manner that the generation period is disposed in the detection time interval.

In the above system, the driving control unit controls the driving signal to be applied to the field winding according to the vehicle condition value with using the zero point as a standard. When the driving signal is controlled with using the zero point as the standard, the pointer rotates to a certain position, which corresponds to the vehicle condition value. The driving control unit executes the zero point stopper position detection operation for detecting the electric angle of the pointer, which stops at the stopper position, with using the inductive voltage. The driving control unit sets the zero point to be equal to the electric angle. The driving control unit detects the inductive voltage at detection time intervals. When the noise generating element generates an inductive noise, the inductive voltage may be affected by the inductive noise so that the inductive voltage is not proper. Thus, the system may not detect accurately that the pointer stops at the stopper position. However, the driving control unit inputs the noise generating signal into the noise generating element so that the generation period of the noise is disposed in the detection interval, in which the detection is not performed. Accordingly, even when the noise generating signal is input from the external element, the driving control unit does not operate the noise generating element immediately. Instead, the driving control unit operates the noise generating element to satisfy a predetermined condition. Since the generation period of the inductive noise is shorter than the detection interval, the control unit controls the generation period in the detection interval, in which the detection is not performed. Thus, the detection time is not disposed in the generation period. For example, when the noise generating signal is input into the noise generating element just after the detection element detects the inductive voltage, the generation period ends before the next detection time. Thus, the time difference between the end of the generation period and the next detection time exists. Thus, the inductive noise is not generated at the detection time. Thus, the inductive voltage is detected without influence of the inductive noise. The zero point stopper position detection operation is executed with using the inductive voltage, which is not affected by the noise. Accordingly, the correct zero point becomes the standard of the driving signal. The vehicle condition value is accurately indicated.

BRIEF DESCRIPTION OF THE DRAWINGS

The above and other objects, features and advantages of the present invention will become more apparent from the following detailed description made with reference to the accompanying drawings. In the drawings:

FIG. 23 is a timing chart showing operation of a flasher function unit.

Figure 1:
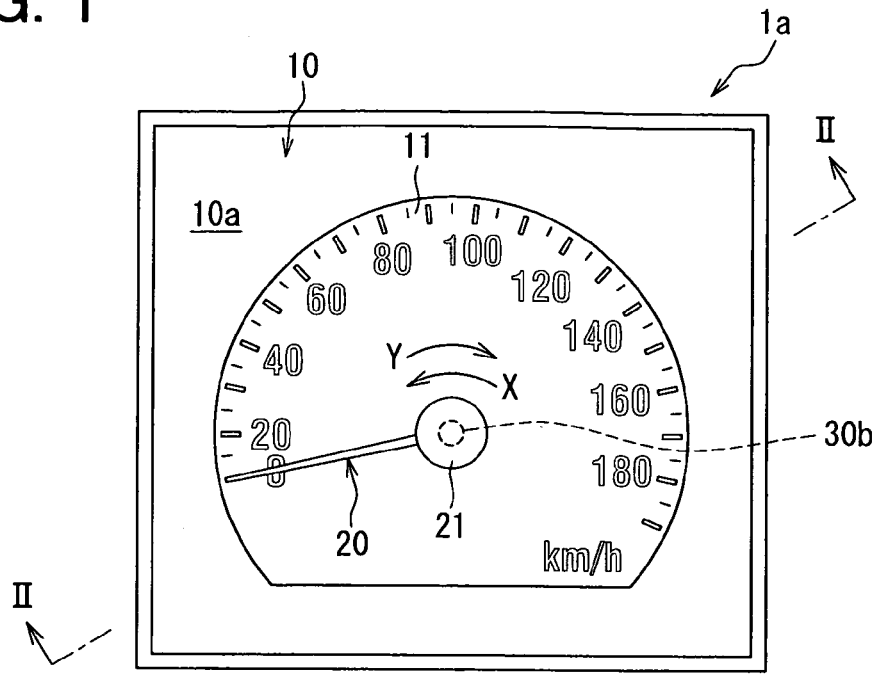
FIG. 1 is a diagram showing a front view of a structure of a meter system according to a first embodiment.

DETAILED DESCRIPTION OF THE PREFERRED EMBODIMENTS (First Embodiment)

A meter system 1 according to a first embodiment will be explained with reference to FIGS. 1 to 8. The meter system 1 is arranged as a vehicle speed meter on a front side of a driver seat in a compartment of a vehicle.

The meter system 1 includes an indicator 1a for a vehicle. The indicator 1a includes an instrument board 10, a pointer 20, a rotation device 30, a substrate 40 and a control unit 60.

As shown in FIG. 1, the instrument board 10 has a scale surface 10a, on which a vehicle speed display unit 11 is arranged. The display unit 11 shows a vehicle speed. The scale surface 10a faces the driver seat. The vehicle speed display unit 11 displays multiple vehicle speed values in an arc fashion. The vehicle speed values are, for example, 0 km/h, 20 km/h, 40 km/h and so on. In this embodiment, the zero value equal to 0 km/h is defined as a reference value, and the upper limit of the speed value is 180 km/h. Thus, the vehicle speed value corresponds to a vehicle condition value, and the instrument board 10 corresponds to a scale board.

Figure 2:
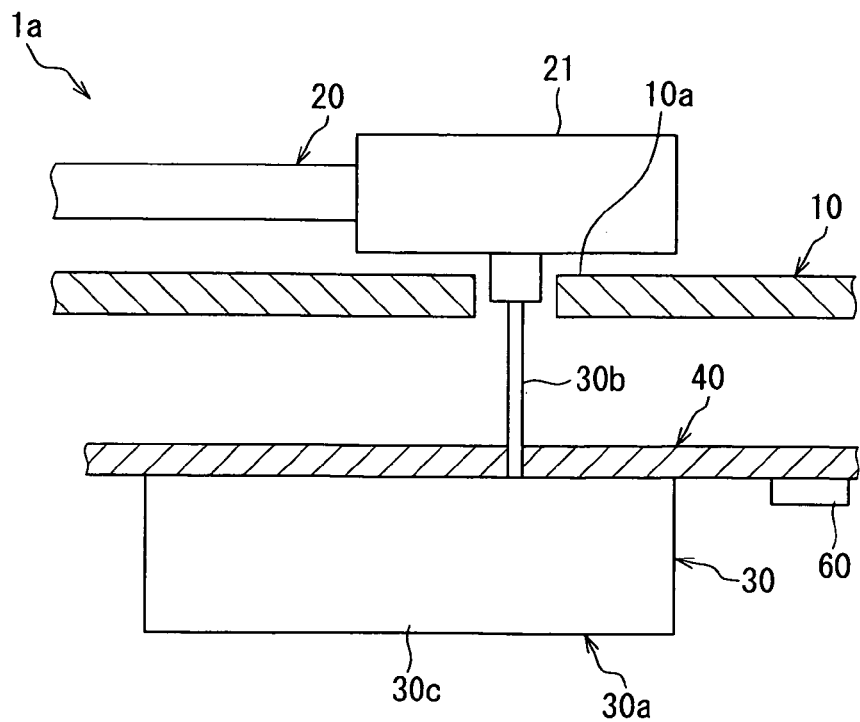
FIG. 2 is a diagram showing a cross sectional view of the structure taken along line II-II in FIG. 1.

As shown in FIGS. 1 and 2, the pointer 20 is connected to a pointer shaft 30b of the rotation device 30 via a base element 21. Here, a zero point returning direction, i.e., a decreasing value direction is defined as X, and a moving away direction, i.e., an increasing value direction, which is opposite to the returning direction X, is defined as Y. The pointer 20 is rotatable around the shaft 30b in the returning direction X and the moving away direction Y along with the scale surface 10a of the instrument board 10. When the pointer 20 rotates toward the returning direction X or the moving away direction Y, the pointer 20 indicates a certain speed value corresponding to a rotation position of the pointer 20. The certain speed value is one of the vehicle speed values shown on the vehicle speed display unit 11. The pointer 20 is capable of returning to the zero position showing the zero value when the pointer 20 rotates toward the returning direction X. In the present embodiment, the returning direction X is defined as a direction from the upper limit speed value to the zero value, and the moving away direction Y is defined as a direction from the zero value to the upper limit speed value.

As shown in FIG. 2, the rotation device 30 includes a body 30a, the pointer shaft 30b and a casing 30c. The body 30a is arranged on a backside of the substrate 40, which is substantially in parallel to the surface of the instrument board 10. The body 30a includes a two-phase step motor M, a speed reduction gear mechanism G and a stopper mechanism S, which are accommodated in the casing 30c. The pointer shaft 30b is supported on the casing 30c, which is fixed to the backside of the substrate 40. Specifically, the pointer shaft 30b penetrates the substrate 40 and the instrument board 10, and supports the base element 21 of the pointer 20. The body 30a rotates and drives the pointer shaft 30b so that the pointer 20 is rotated by the body 30a via the pointer shaft 30b. Specifically, the reduction speed gear mechanism G reduces the rotation speed of the step motor M, and the pointer shaft 30b is coaxially mounted on an output stage gear 34 in the reduction speed gear mechanism G.

Figure 4:
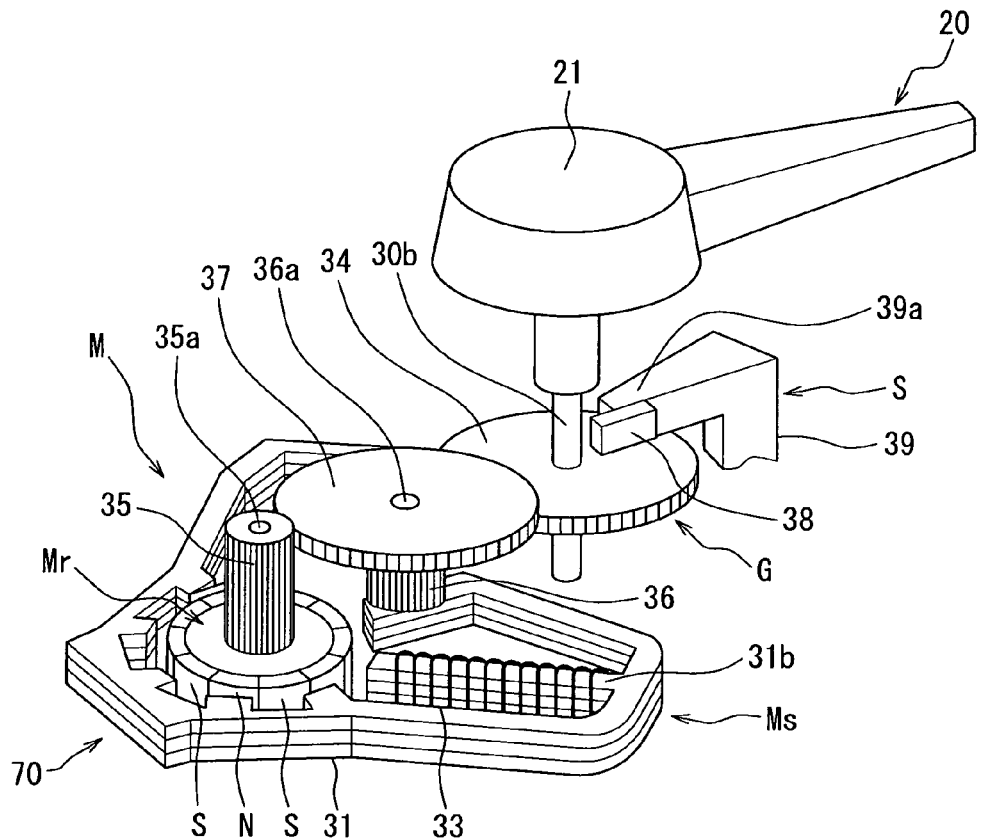
FIG. 4 is a diagram showing a perspective view of a main part of the meter system viewing from an oblique direction.
Figure 5:
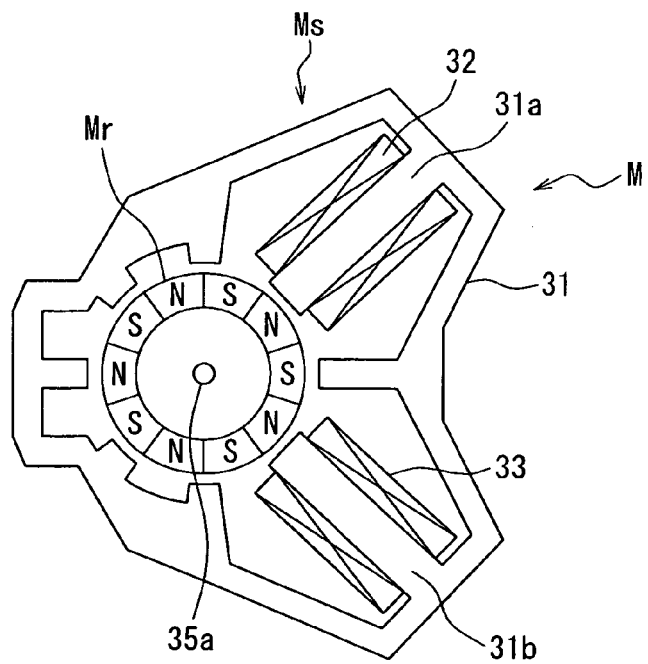
FIG. 5 is a diagram showing a plan view of the main part of the meter system.

As shown in FIGS. 4 and 5, the step motor M includes a stator Ms and a magnet rotor Mr, which are assembled with each other. The stator Ms includes a yoke 31 and two magnetic field windings 32, 33 corresponding to two phases. The yoke 31 includes a pair of magnetic poles 31a, 31b having a ball shape. The field winding 32 having a A-phase is winded on the magnetic pole 31a, and the field winding 33 having a B-phase is winded on the magnetic pole 31b. The magnet rotor Mr is coaxially fixed to a rotation shaft 35a of the speed reduction gear mechanism G. N poles and S poles as magnetic pole are alternately arranged in a rotation direction on the outer surface of the magnet rotor Mr, which is space apart from the top surface of the magnetic poles 31a, 31b of the yoke 31.

Figure 6:
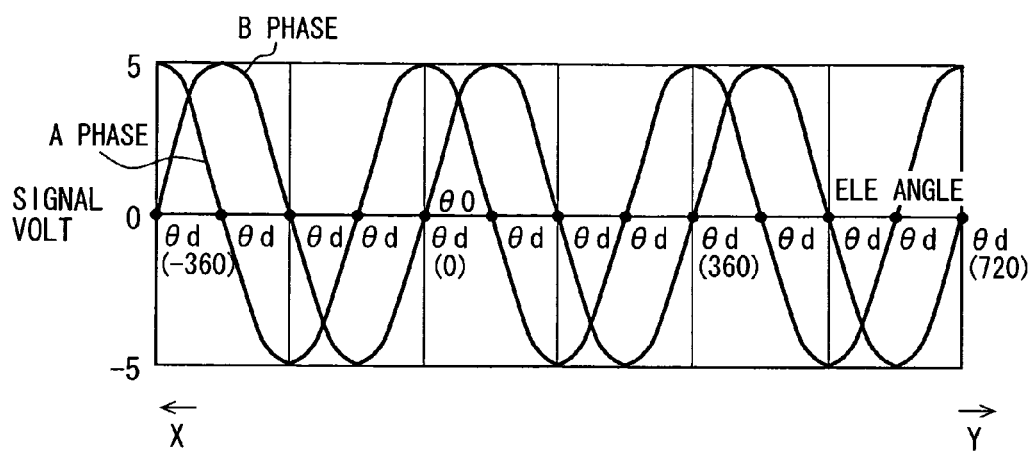
FIG. 6 is a diagram showing graph of a driving signal to be applied to a field winding of a step motor in the system.

As shown in FIG. 6, in the step motor M, the A-phase driving signal with an alternate current is applied to the A-phase field winding 32, and the B-phase driving signal with an alternate current is applied to the B-phase field winding 33. The voltage of the A-phase driving signal is alternately oscillated in a cosine function manner according to the electric angle, and the voltage of the B-phase driving signal is alternately oscillated in a sine function manner according to the electric angle. When the A-phase driving signal and the B-phase driving signal, which respectively have phases deviated from each other by ninety degrees, are applied to the windings 32, 33, the alternating magnetic flux is generated at the windings 32, 33. The generated magnetic flux passes between the magnetic poe of the yoke 31 and the magnetic pole of the magnet rotor Mr. Thus, the magnet rotor Mr rotates according to the voltages of the A-phase and B-phase driving signals, which correspond to the electric angle.

As shown in FIG. 4, the speed reduction gear mechanism G includes multiple gears 34-37, which are formed from a spur wheel gear. The output stage gear 34 is coaxially connected to the pointer shaft 30b. The input stage gear 35 is coaxially fixed to the rotation shaft 35a, which is supported on the casing 30c. The intermediate stage gears 36, 37 are coaxially supported on the rotation shaft 36a, which is fixed to the casing 30c. Thus, the gears 34-37 are integrally rotated. The first intermediate stage gear 36 is engaged with the output stage gear 34, and the second intermediate stage gear 37 is engaged with the input stage gear 35.

The speed reduction gear mechanism G reduces the rotation of the magnetic rotor Mr of the step motor M, and then, transmits the reduced rotation to the pointer 20. Accordingly, when the rotation position of the magnetic rotor Mr is changed according to the A-phase and B-phase driving signals, which correspond to the electric angle, the rotation position of the pointer 20 is changed. In the present embodiment, the direction for reducing the electric angle corresponds to the zero point return direction X of the pointer 20, and the direction for increasing the electric angle corresponds to the moving away direction Y of the pointer 20.

As shown in FIG. 4, the stopper mechanism S includes a contact portion 38 and a stopper portion 39. The contact portion 38 protrudes from the surface of the output stage gear 34 and has a rectangular plate shape. The contact portion 38 is integrally rotatable together with the gear 34. The stopper portion 39 has a I shape so that the stopper portion 39 protrudes from the casing 30c over the gear 34. The top end 39a of the stopper portion 39, which protrudes over the gear 34, is disposed on a rotational trajectory of the contact portion 38. The top end 39a is arranged on a side of the returning direction X from the contact portion 38 at the zero point.

Figure 7:
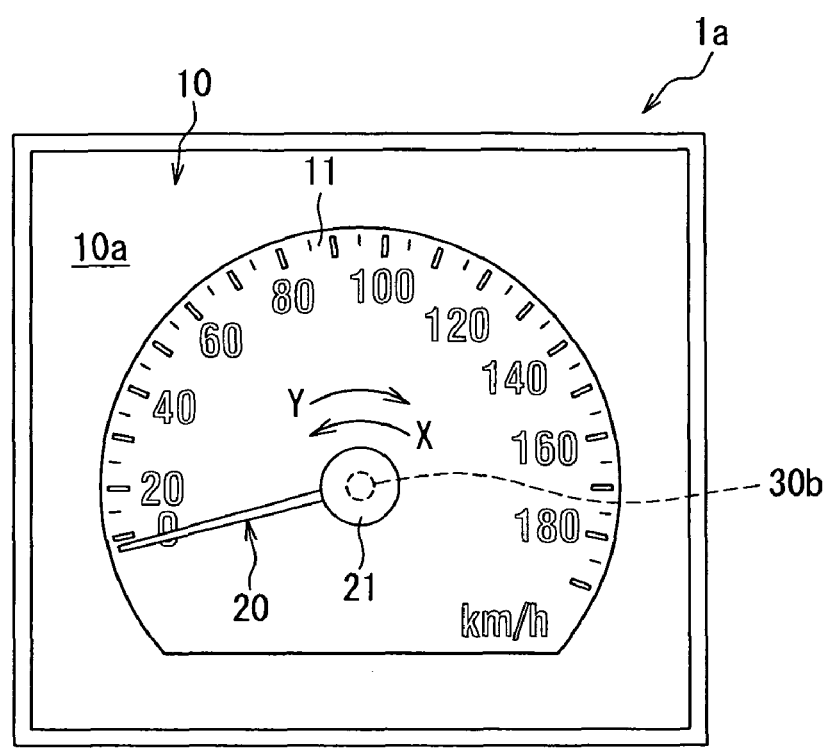
FIG. 7 is a diagram showing a front view of the system when a pointer stops at a stopper position.

As shown in FIG. 7, the pointer 20 stops at a stopper position, which is disposed in a predetermined range from the zero point in the returning direction X when the pointer 20 rotates in the returning direction X, and the contact: portion 38 contacts the top end 39a of the stopper portion 39. In the present embodiment, in a ZPD process, the electric angle corresponding to the stopper position is updated and set to be the zero point $\theta 0$, which corresponds to zero degree of the electric angle. The stopper position is set to be in a range of, for example, 450 degrees of the electric angle of the step motor M from the zero position of the pointer 20 in the returning direction X when the meter system 1 is manufactured.

Figure 3:
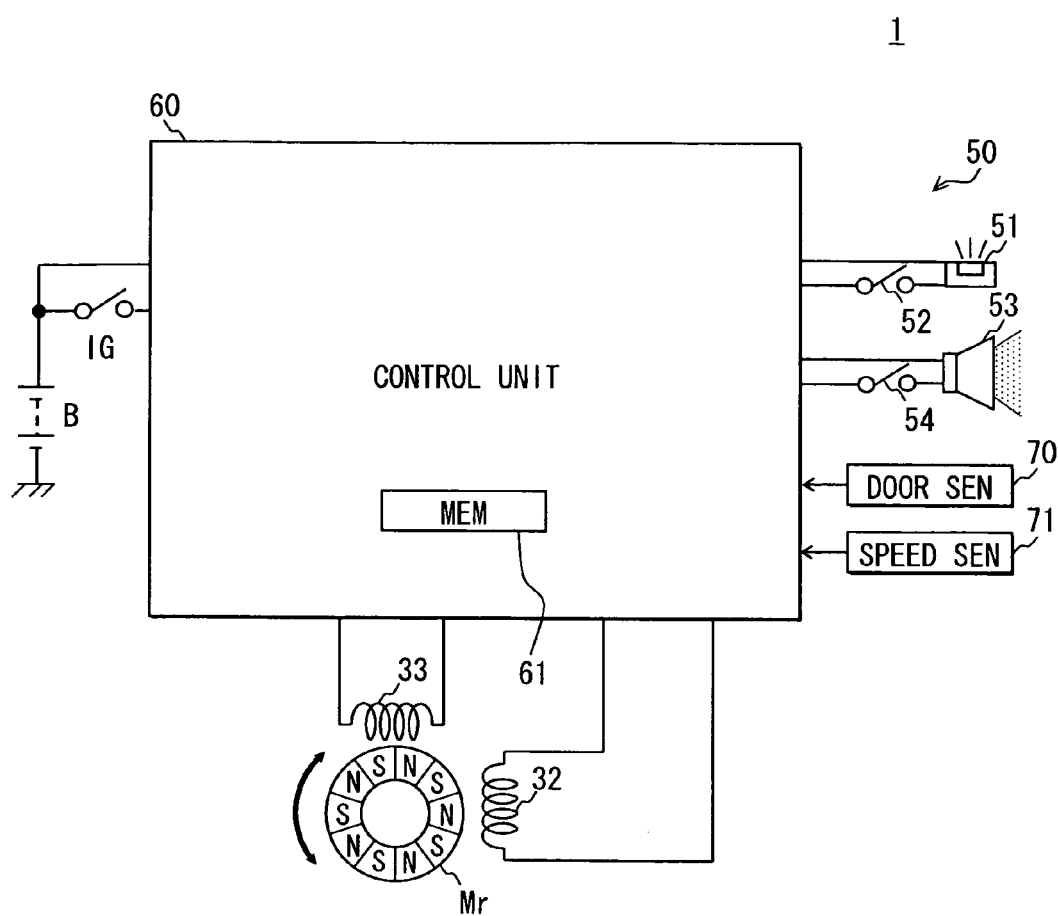
FIG. 3 is a block diagram showing an electric circuit diagram of the meter system.

As shown in FIG. 3, the meter system 1 includes a flasher function unit 50 having an indicator 51, a flasher semiconductor switch 52, a buzzer 53 and a buzzer semiconductor switch 54.

The indicator 51 as an operation unit is arranged on the scale surface 10a (not shown). The indicator 51 is connected to the control unit 60 via the flasher semiconductor switch 52. When the flasher semiconductor switch 52 turns on, the indicator 51 is energized from the control unit 60 so that the indicator 51 lights up. When the flasher semiconductor switch 52 turns off, the control unit 60 stops energizing the indicator 51 so that the indicator 51 lights off. Thus, the control unit 60 controls the flasher semiconductor switch 52 to turn on and off so that the indicator 51 blinks on and off.

The buzzer 53 as an operation unit is connected to the control unit 60 via the buzzer semiconductor switch 54. When the buzzer semiconductor switch 54 turns on, the control unit 60 energizes the buzzer 53 so that the buzzer 53 outputs sound. When the buzzer semiconductor switch 54 turns off, the control unit 60 stops energizing the buzzer 53 so that the buzzer 53 does not output sound. When the flasher semiconductor switch 52 turns on and off, and the buzzer semiconductor switch 54 turns on and off in conjunction with the flasher semiconductor switch 52, the buzzer 53 in conjunction with the indicator 51 outputs sound.

The indicator 51 is shown as a single indicator in FIG. 3 for sake of simplicity. Actually, the indicator 51 includes a right turn indicator and a left turn indicator. The right turn indicator lights up when a right turn blinker turns on so as to represent the right turn of the vehicle. The left turn indicator lights up when a left turn blinker turns on so as to represent the left turn of the vehicle. The indicator 51 corresponds to a flasher.

The control unit 60 includes a micro computer having a memory 61. The control unit 60 is mounted on the substrate 40, as shown in FIG. 2. The memory 61 stores various program for executing a meter activation process S1. The meter activation process S1 includes a voltage detection type zero point stopper position detection operation, a zero point return enforcement type zero point stopper position detection operation, a zero point setting operation and a ZPD operation. When the meter activation process S1 is executed, the updated or set zero point $\theta 0$, which is the latest value, is stored. The memory 61 stored a memory region for a ZPD flag, which shows execution of the ZPD operation while the control unit 60 is activated.

The control unit 60 is electrically coupled with the flasher function unit 50, a door sensor 70, a vehicle speed sensor 71, a vehicle side device (not shown), an ignition switch IG and a battery B. The control unit 60 is energized directly from the battery B so-that the control unit 60 is activated when the door sensor 70 detects the opening of the door of the vehicle, or when the vehicle side device inputs an unlock signal or a lock signal into the control unit 60. When the ignition switch IG turns on after the control unit 60 is activated and before a predetermined setting time such as two minutes elapses, the control unit 60 maintains the activation status to be energized from the battery B. After that, when the ignition switch IG turns off, the control unit 60 switches to a sleep mode. When the ignition switch IG does not turn on before the predetermined setting time elapses since the activation, the control unit 60 switches to the sleep mode. When the ignition switch IG turns on after the sleep mode, the control unit 60 is activated again. Alternatively, the control unit 60 may be activated again after the sleep mode when the door of the vehicle opens or when the driver of the vehicle puts on the brake pedal. Further, the control unit 60 sets a ZPD flag when the ZPD process is executed during the activation of the control unit 60. The control unit 60 resets the ZPD flag just before the control unit 60 switches to the sleep mode.

The control unit 60 determines whether a condition for driving the flasher is met when a condition for executing the stopper position detection operation is met. Then, when the control unit 60 determines that the condition for driving the flasher is met, the control unit 60 executes the zero point return enforcement type zero point stopper position detection operation. When the control unit 60 determines that the condition for driving the flasher is not met, the control unit 60 executes the pointer moving away operation, and then, executes the voltage detection type zero point stopper position detection operation.

The zero point return enforcement type zero point stopper position detection operation will be explained as follows. The A-phase driving signal and the B-phase driving signal to be applied to the field windings 32, 33 of the step motor M are controlled so that the pointer 20 rotates by a certain zero point returning angle toward the returning direction X. Thus, it is determined that the pointer 20 stops at the stopper position. Here, the certain zero point returning angle is the electric angle corresponding to the scale angle equal to or larger than the maximum scale angle. In this embodiment, the maximum scale angle corresponds to 180 km/h. The voltage detection type zero point stopper position detection operation is well known. Therefore, the voltage detection type zero point stopper position detection operation is not explained.

The pointer moving away operation will be explained as follows. The A-phase driving signal and the B-phase driving signal to be applied to the field windings 32, 33 of the step motor M are controlled so that the pointer 20 temporally rotates toward the moving away direction Y, and then, stops at a rotated position. The voltage detection type zero point stopper position detection operation in this case will be explained. After the pointer moving away operation ends, the A-phase driving signal and the B-phase driving signal to be applied to the field windings 32, 33 of the step motor M are controlled so that the pointer 20 rotates toward the returning direction X. Further, the induced voltage generated in the field windings 32, 33 is detected. When the detected voltage is equal to or smaller than a predetermined value, it is determined (i.e., estimated) that the pointer 20 stops at the stopper position. Specifically, detection that the pointer 20 stops at the stopper position is performed. The pointer moving away operation and the voltage detection type zero point stopper position detection operation are also well know. Thus, the detail of the pointer moving away operation and the voltage detection type zero point stopper position detection operation is not described here.

The condition for executing the stopper position detection operation is to activate the control unit 60. The control unit 60 is activated when the door of the vehicle is opened, when the ignition switch IG turns on, or when the brake pedal is put on. The control unit 60 executes the zero point setting operation such that the electric angle corresponding to the stopper position, which is detected in the stopper position detection operation, is set (i.e., updated) as the zero point θO. Accordingly, the control unit 60 corresponds to the zero point setting means. Here, both of the zero point return enforcement type zero point stopper position detection operation and the zero point setting operation are defined as a zero point return enforcement type ZPD process. Both of the voltage detection type zero point stopper position detection operation and the zero point setting operation are defined as a voltage detection type ZPD process. The control unit 60 applies the A-phase driving signal and the B-phase driving signal to the field windings 32, 33 of the step motor M with reference to the zero point θ0, which is set in the ZPD process. The control unit 60 corresponds to the stopper position detection operation executing means, a zero point setting means, a signal applying means, a driving control means and control device.

When the control unit 60 is activated after the ZPD process is performed, the control unit 60 controls the A-phase driving signal and the B-phase driving signal with reference to the zero point θ0 of the electric angle, which is stored in the memory 61, so that the control unit 60 controls the pointer 20 to show the detected vehicle speed of the vehicle speed sensor 71.

The control unit 60 determines whether the flasher driving condition is met according to the manual operation of the user. When the control unit 60 determines that the flasher driving condition is met, the control unit 60 controls the flasher semiconductor switch 52 and the buzzer semiconductor switch 54 to turn on and off so that the flasher blinks in accordance with the flasher driving condition, which is determined by the control unit 60.

Specifically, the flasher driving condition includes a condition that a combination lever (not shown) is set to a blinker lamp turning on position or off position, which is deviated from a certain reference position by a predetermined angle in an up-down direction. The combination lever controls the right blinker lamp to turn on and off or the left blinker lamp to turn on and off. The right blinker lamp is arranged on the right side of the vehicle, on which the meter system 1 is mounted. The left blinker lamp is arranged on the left side of the vehicle. For example, when the combination lever is set to the blinker lamp turning on position of the right blinker lamp, the right blinker lamp turns on, i.e., blinks. When the combination lever is set to the blinker lamp turning on position of the left blinker lamp, the left blinker lamp turns on, blinks.

Further, the flasher driving condition includes a condition that a hazard lamp switch is set to a hazard lamp turning on position or off position, which is back from a reference position. The hazard lamp switch controls the hazard lamp to turn on and off. For example, when the hazard lamp switch is set to the hazard lamp turning on position, both of the right blinker lamp and the left blinker lamp turn on, i.e., blinks.

Further, the flasher driving condition includes a condition that an instruction signal is input from a mobile element (not shown) to the control unit 60. The mobile element remote-controls a device of the vehicle via wireless communication between the vehicle and the mobile. Specifically, the mobile element includes an unlock button for unlocking the door of the vehicle and a lock button for locking the door. When the lock button or the unlock button is pushed, an unlock signal or a lock signal is transmitted from the mobile element to the vehicle. The unlock signal and the lock signal are received by an in-vehicle device (not shown) mounted on the vehicle. Then, the signals are input into the control unit 60. The flasher driving condition includes a condition that the unlock signal and the lock signal are input into the control unit 60.

When the combination lever is set to the right blinker lamp turning on position, the control unit 60 controls the flasher semiconductor switch 52 and the buzzer semiconductor switch 54 to turn on and off so that the right turn indicator blinks in association with the blink of the right blinker lamp, and the buzzer 53 outputs sound. Similarly, when the combination lever is set to the left blinker lamp turning on position, the control unit 60 controls the flasher semiconductor switch 52 and the buzzer semiconductor switch 54 to turn on and off so that the left turn indicator blinks in association with the blink of the left blinker lamp, and the buzzer 53 outputs sound. Further, when the hazard lamp switch turns on, the control unit 60 controls the flasher semiconductor switch 52 and the buzzer semiconductor switch 54 to turn on and off so that both of the right turn indicator and the left turn indicator, i.e., the indicator 51 blinks in association with the blink of both of the right blinker lamp and the left blinker lamp, and the buzzer 53 outputs sound. Furthermore, when the unlock signal or the lock signal is input into the control unit 60 from the mobile element, the control unit 60 controls the flasher semiconductor switch 52 and the buzzer semiconductor switch 54 to turn on and off so that both of the right turn indicator and the left turn indicator, i.e., the indicator 51 blinks in association with the blink of both of the right blinker lamp and the left blinker lamp, and the buzzer 53 outputs sound. Thus, the user recognizes that the lock signal or the unlock signal is input into the control unit 60. This performance is defined as an automatic response function. The control unit 60 corresponds to a flasher on and off switching unit and a buzzer on and off switching unit.

In the meter system 1, the field windings 32, 33 for providing the step motor M are disposed on the substrate 40. The flasher semiconductor switch 52 and the buzzer semiconductor switch 54 for providing the flasher function unit 50 are disposed on the same substrate 40.

In the meter system 1, only one control unit 60 executes the ZPD process and the control of switching on and off both of the flasher semiconductor switch 52 and the buzzer semiconductor switch 54.

The indicator 1a and the flasher function unit 50 are integrated into the meter system 1, so that the manufacturing cost and the running cost are reduced. The field windings 32, 33, the flasher semiconductor switch 52 and the buzzer semiconductors witch 54 are proximally position.

When the field windings 32, 33, the flasher semiconductor switch 52 and the buzzer semiconductors witch 54 are proximally position, and the flasher function unit 50 is operated during the execution of the ZPD process of the step motor M, the stopper position may be detected incorrectly attributed to an inductive noise, which is generated by the switching on and off of the flasher semiconductor switch 52 and the buzzer semiconductors witch 54, so that the stopper position may shift. Specifically, when the flasher semiconductor switch 52 and the buzzer semiconductor switch 54 turn on and off according to the operation signal, the switches 52, 54 provides a noise generating element for generating an inductive noise, which provides a magnetic field for reducing the detection accuracy of the inductive voltage. The inductive voltage is detected by the zero position detection circuit 81. Accordingly, the operation signal corresponds to the noise generating signal. The inductive noise provides the magnetic field for affecting the field windings. Specifically, the flasher function device 50 includes the flasher semiconductor switch 52 and the buzzer semiconductor switch 54. When the semiconductor switches switch according to the operation signals, the switches generate the inductive noise. Specifically, when the switches switch from the on state to the off state, the inductive noise is generated. Further, when the switches switch from the off state to the on state, the inductive noise is generated. The inductive noise is continuously generated during a generation period such as two milliseconds after the operation signal is input into the flasher function device 50. In this case, the meter system 1 may not indicate the correct vehicle speed.

In view of the above difficulty, the control unit 60 executes the meter activation process S1 just after the activation. The stopper position detection operation executing condition includes a condition that the control unit 60 is activated. Thus, the stopper position detection operation executing condition is satisfied at a time when the control unit 60 is activated.

Figure 8:
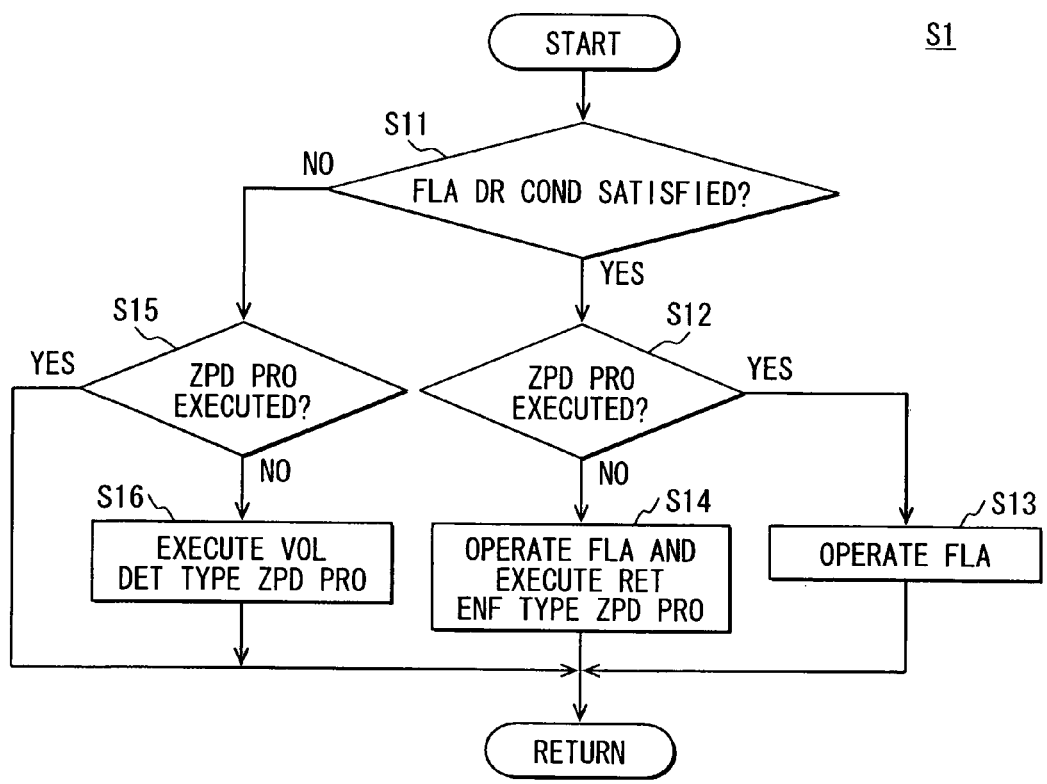
FIG. 8 is a flowchart showing a meter activation process executed by the meter system.

When the control unit 60 starts to execute the meter activation process S1, the control unit 60 determines in step S11 whether the flasher driving condition is satisfied, as shown in FIG. 8. When the control unit 60 determines that the flasher driving condition is satisfied, i.e., when the determination of step S11 is "Yes," the control unit 60 proceeds to step S12. In step S12, the control unit 60 determines whether the ZPD process has been already executed. Specifically, the control unit 60 determines whether the ZPD flag stored in the memory 61 is set or reset.

When the control unit 60 determines that the ZPD flag is set so that the ZPD process has been executed, i.e., when the determination of step S12 is "Yes," the control unit 60 proceeds to step S13. In step S13, the control unit 60 operates the flasher. Specifically, the control unit 60 controls the flasher semiconductor switch 52 and the buzzer semiconductor switch 54 to turn on and off so that the indicator 51 blinks in accordance with the flasher driving condition, which is determined in step S11, and the buzzer 53 outputs sound in association with the blink of the indicator 51. After the control unit 60 controls the flasher semiconductor switch 52 and the buzzer semiconductor switch 54 to turn on and off, the control unit 60 returns the process. Specifically, the control unit 60 proceeds to step S11, and repeats to execute step S11.

When the control unit 60 determines that the ZPD flag is reset so that the ZPD process has not been executed yet, i.e., when the determination of step S12 is "No," the control unit 60 proceeds to step S14. In step S14, the control unit 60 operates the flasher. Specifically, the control unit 60 controls the flasher semiconductor switch 52 and the buzzer semiconductor switch 54 to turn on and off so that the indicator 51 blinks in accordance with the flasher driving condition, which is determined in step S11, and the buzzer 53 outputs sound in association with the blink of the indicator 51. Further, the control unit 60 executes the zero point return enforcement type ZPD process in addition to the control of the switching on and off the semiconductor switches 52, 54. After the control unit 60 controls the flasher semiconductor switch 52 and the buzzer semiconductor switch 54 to turn on and off, and executes the zero point return enforcement type ZPD process, the control unit 60 returns the process. Specifically, the control unit 60 proceeds to step S11, and repeats to execute step S11.

In step S11, when the control unit 60 determines that the flasher driving condition is not satisfied, i.e., when the determination of step S11 is "No," the control unit 60 proceeds to step S15. In step S15, the control unit 60 determines whether the ZPD process has been already executed. Specifically, the control unit 60 determines whether the ZPD flag stored in the memory 61 is set or reset.

When the control unit 60 determines that the ZPD flag is set so that the ZPD process has been executed, i.e., when the determination of step S15 is "Yes," the control unit 60 returns the process. Specifically, the control unit 60 proceeds to step S11, and repeats to execute step S11. When the control unit 60 determines that the ZPD flag is reset so that the ZPD process has not been executed, i.e., when the determination of step S15 is "No," the control unit 60 proceeds to step S16. In step S16, the control unit 60 executes the voltage detection type ZPD process. After the control unit 60 executes the voltage detection type ZPD process, the control unit 60 returns the process. Specifically, the control unit 60 proceeds to step S11, and repeats to execute step S11.

Thus, when the control unit 60 controls the flasher semiconductor switch 52 and the buzzer semiconductor switch 54 to turn on and off so that the indicator 51 blinks, and the buzzer 53 outputs sound in association with the blink of the indicator 51, the control unit 60 executes the zero point return enforcement type ZPD process. When the control unit 60 does not control the flasher semiconductor switch 52 and the buzzer semiconductor switch 54 to turn on and off, the control unit 60 executes the voltage detection type ZPD process. Thus, when the influence of the inductive noise generated by the on and off operation of the semiconductor switches 52, 54 is small, the control unit 60 executes the voltage detection type ZPD process, the influence of the noise being applied to the induction voltage of the field windings 32, 33. Under a condition that the influence of the noise to the field windings 32, 33 is low, the stopper position is detected by the voltage detection type ZPD process, and the electric angle corresponding to the detected stopper position is set to be the zero point θ0. When the influence of the inductive noise generated by the on and off operation of the semiconductor switches 52, 54 is high, the control unit 60 executes the zero point return enforcement type ZPD process, the influence of the noise being applied to the induction voltage of the field windings 32, 33. Under a condition that the influence of the noise to the field windings 32, 33 is high, the stopper position is detected by the zero point return enforcement type ZPD process, and the electric angle corresponding to the detected stopper position is set to be the zero point 80. The control unit 60 controls the semiconductor switches 52, 54 to turn on and off in addition to the zero point return enforcement type ZPD process. Accordingly, since the user pays attention to the blink of the indicator 51 and the sound output of the buzzer 53, the user does not feel strangeness even if the vibration and abnormal noise of the pointer 20 are generated. Thus, the system is integrated, and the indication of the vehicle speed is improved, and further, the strange feeling of the user is reduced.

(Second Embodiment)

A meter system according to a second embodiment will be explained with reference to FIGS. 9-11.

In the first embodiment, the control unit 60 determines in step S11 whether the flasher driving condition is satisfied just after the control unit 60 is activated. Then, the voltage detection type ZPD process in step S16 or the zero point return enforcement type ZPD process in step S14 is performed. In some cases, the flasher driving condition may be satisfied so that the control unit 60 controls the flasher semiconductor switch 52 and the buzzer semiconductor switch 54 to turn on and off while the voltage detection type ZPD process is executed in step S16. In this case, the voltage detection type ZPD process may not be executed under a condition that the possibility of the influence of the inductive noise to the field windings 32, 33 is low.

Figure 9:
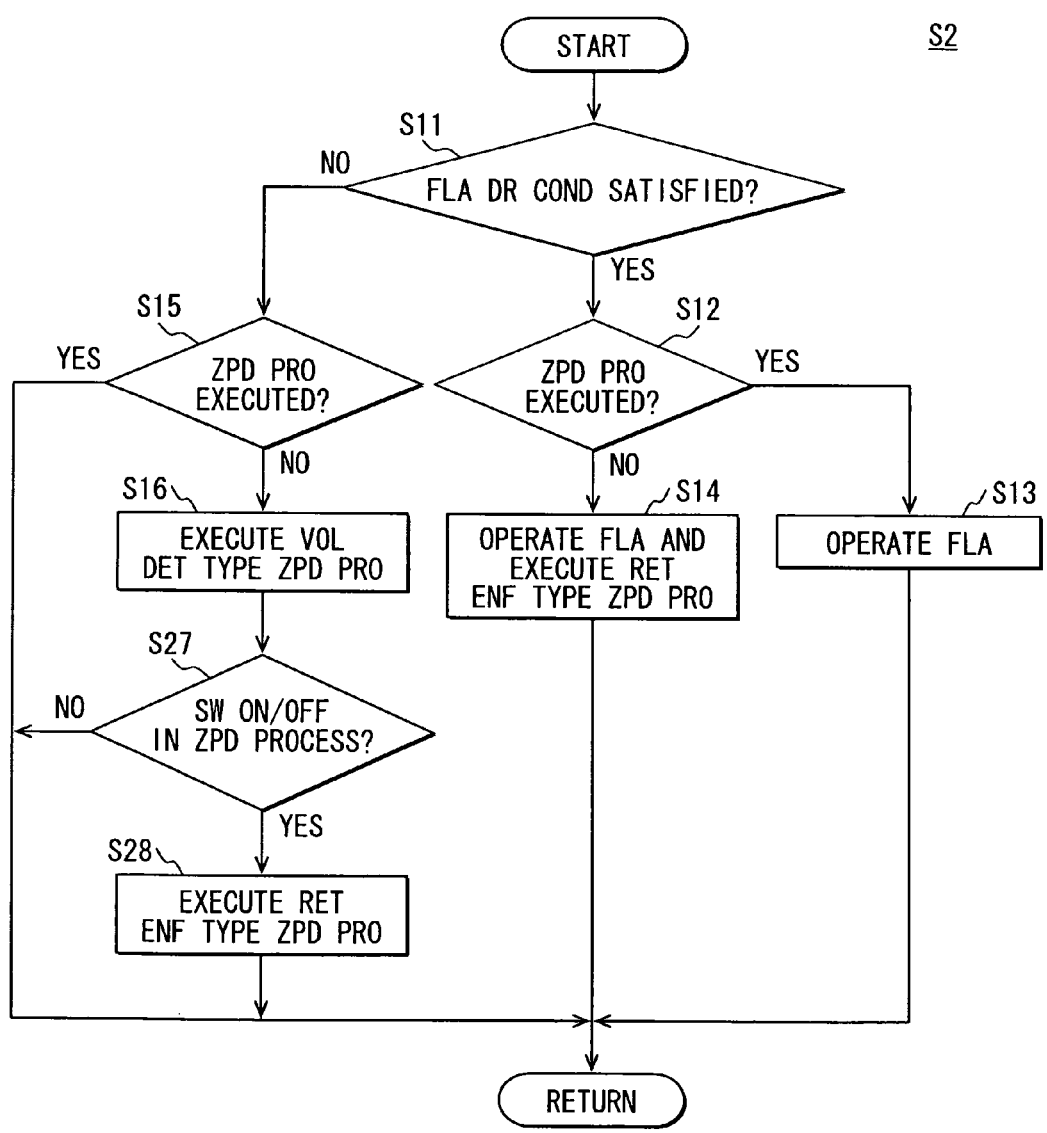
FIG. 9 is a flowchart showing another activation process executed by a meter system according to a second embodiment.

In the present embodiment, the control unit 60 executes a meter activation process S2 shown in FIG. 9, which corresponds to the meter activation process S1 in FIG. 8.

The control unit 60 executes and completes the voltage detection type ZPD process in step S16. Then, the control unit 60 determines in step S27 whether the semiconductor switches 52, 54 turn on and off during the voltage detection type ZPD process. Specifically, the control unit 60 determines whether the switches 52, 54 are switched while the voltage detection type zero point stopper position detection operation is executed.

When the control unit 60 determines that the semiconductor switches 52, 54 do not turn on and off during the voltage detection type ZPD process, i.e., the determination of step S27 is "No," the control unit 6 sets the electric angle corresponding to the stopper position detected in step S16 to be the zero point θ0. After that, the control unit 60 returns the process. Specifically, the control unit 60 proceeds to step S11, and repeats to execute step S11.

When the control unit 60 determines that the semiconductor switches 52, 54 turn on and off during the voltage detection type ZPD process, i.e., the determination of step S27 is "Yes," the control unit 60 proceeds to step S28. In step S28, the control unit 60 executes the zero point return enforcement type ZPD process. After the control unit 60 executes the zero point return enforcement type ZPD process, the control unit 60 sets the electric angle corresponding to the stopper position detected in the zero point return enforcement type ZPD process to be the zero point θ0. After that, the control unit 60 returns the process. Specifically, the control unit 60 proceeds to step S11, and repeats to execute step S11.

Thus, the control unit 60 executes steps S27 and S28, so that the control unit 60 does not set the electric angle corresponding to the stopper position detected by the voltage detection type ZPD process to be the zero point when the semiconductor switches 52, 54 turn on and off while the voltage detection type ZPD process is executed. Instead, after the voltage detection type ZPD process is completed, the control unit 60 executes the zero point return enforcement type ZPD process. Thus, even when the semiconductor switches 52, 54 turn on and off while the voltage detection type ZPD process is executed, the indication of the correct vehicle speed is improved.

Figure 10A:
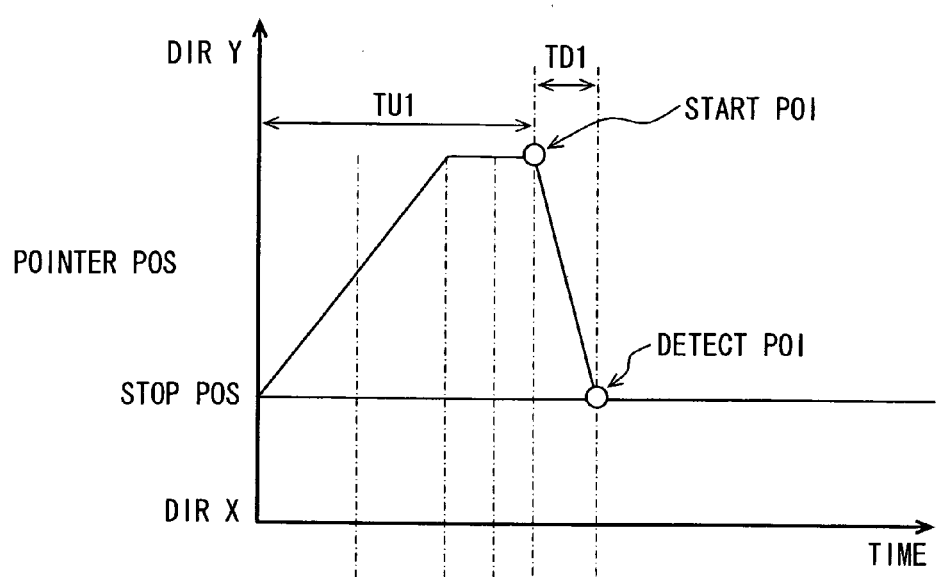
FIG. 10A is a timing chart showing a pointer position in an operation of the meter system when a semiconductor switch is not controlled to turn on and off during a voltage detection type ZPD process.
Figure 10B:
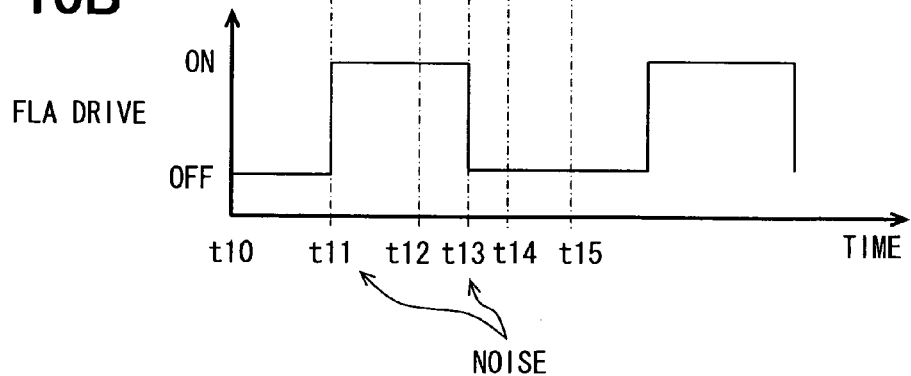
FIG. 10B is a timing chart showing an turning on time and turning off time of the semiconductor switch when the semiconductor switch is not controlled to turn on and off during the voltage detection type ZPD process.

FIGS. 10A and 10B show an example of operation of the meter system 1 in a case where the semiconductor switches 52, 54 do not turn on and off during the voltage detection type ZPD process.

In FIGS. 10A and 10B, the control unit 60 is activated from the sleep mode when the door opens. The control unit 60 starts to execute the voltage detection type ZPD process at time t10. Since the hazard lamp switch turns on after time t10, the semiconductor switches 52, 54 turn on and off. However, the semiconductor switches 52, 54 do not turn on and off while the zero point stopper position detection operation in the voltage detection type ZPD process is executed.

Specifically, the control unit 60 is activated from the sleep mode at time t10 since the door of the vehicle opens before time t10. Further, the control unit 60 starts to execute the pointer moving away operation in the voltage detection type ZPD process.

When the control unit 60 executes the pointer moving away operation, the pointer 20 rotates by a predetermined electric angle such as 273 degrees toward the moving away direction Y with a constant speed. Then, the pointer 20 stops rotating at time t12. Then, the pointer 20 maintains at the predetermined electric angle until t14, at which a predetermined time has elapsed. The predetermined time is defined from time t12, at which the pointer 20 moves away and stops moving, to time; at which a certain time has elapsed since all of multiple pointers including the pointer 20 and another pointer rotates by the predetermined electric angle toward the moving away direction Y and then stop rotating in a case where the control unit 60 controls another pointer (not shown). Here, the moving away interval from time t10 to t12, in which the pointer 20 moves away, and the stand-by interval from time t12 to t14, in which the pointer stands by, are defined as a moving-away and stand-by period TU1.

Next, the control unit 60 starts to execute the zero point stopper position detection operation in the voltage detection type ZPD process at time t14, at which the predetermined time has elapsed since time t12. Since the control unit 60 executes the zero point stopper position detection operation in the voltage detection type ZPD process, the pointer 20 rotates toward the returning direction X with another constant speed, which is higher than the constant speed in the pointer moving away operation. Then, the pointer 20 stops rotating at the stopper position at time t15. The time t14, at which the voltage detection type zero point stopper position detection operation starts to be executed, is defined as a starting point of detection period. The time t15, at which the pointer stops at the stopper position, is defined as a detection point of the stopper position. A period from the starting point of detection period to the detection point of the stopper position is defined as a detection period TD1.

Since the control unit 60 controls the hazard lamp switch to turn on and off after time t10, the control unit 60 controls the semiconductor switches 52, 54 to switch from an off state to an on state at time t11. The control unit 60 controls the semiconductor switches 52, 54 to switch from the on state to the off state at time t13. After time t13, the control unit 60 continues to control the semiconductor switches 52, 54 to switch from one state to another state.

At time t15 when the zero point stopper position detection operation in the voltage detection type ZPD process ends, the control unit 60 determines whether the semiconductors witches 52, 54 turn on and off during the detection period TD1. Here, the control unit 60 determines that the semiconductors witches 52, 54 do not turn on and off during the detection period TD1. In this case, the control unit 60 sets the zero point 80 to be the electric angle corresponding to the stopper position detected by the voltage detection type ZPD process.

Figure 11A:
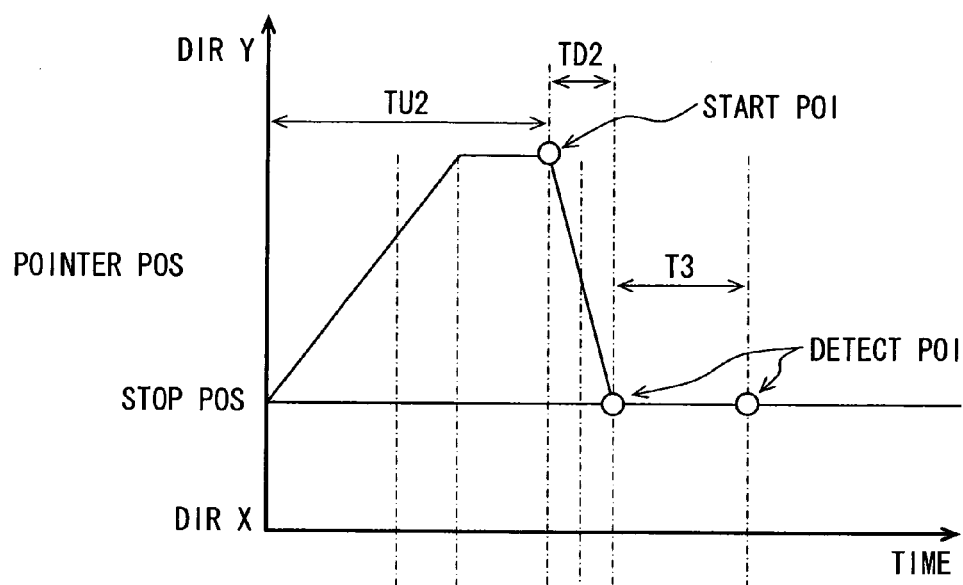
FIG. 11A is a timing chart showing a pointer position in an operation of the meter system when a semiconductor switch is controlled to turn on and off during a voltage detection type ZPD process.
Figure 11B:
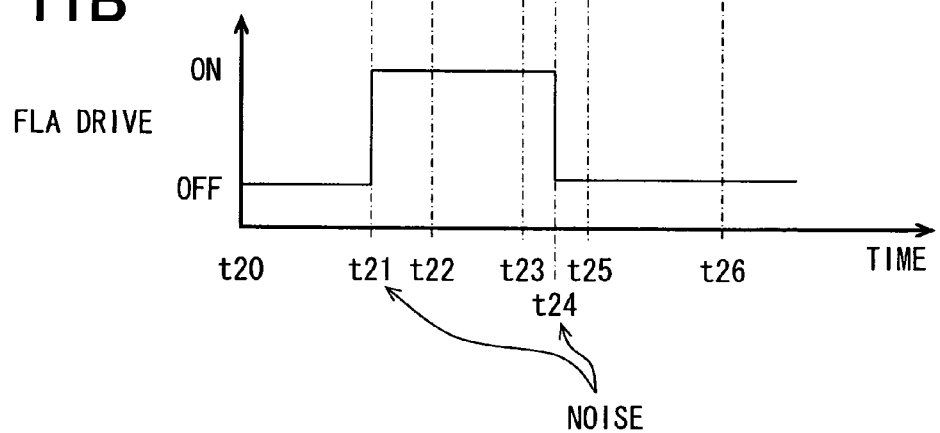
FIG. 11B is a timing chart showing an turning on time and turning off time of the semiconductor switch when the semiconductor switch is controlled to turn on and off during the voltage detection type ZPD process.
Figure 12:
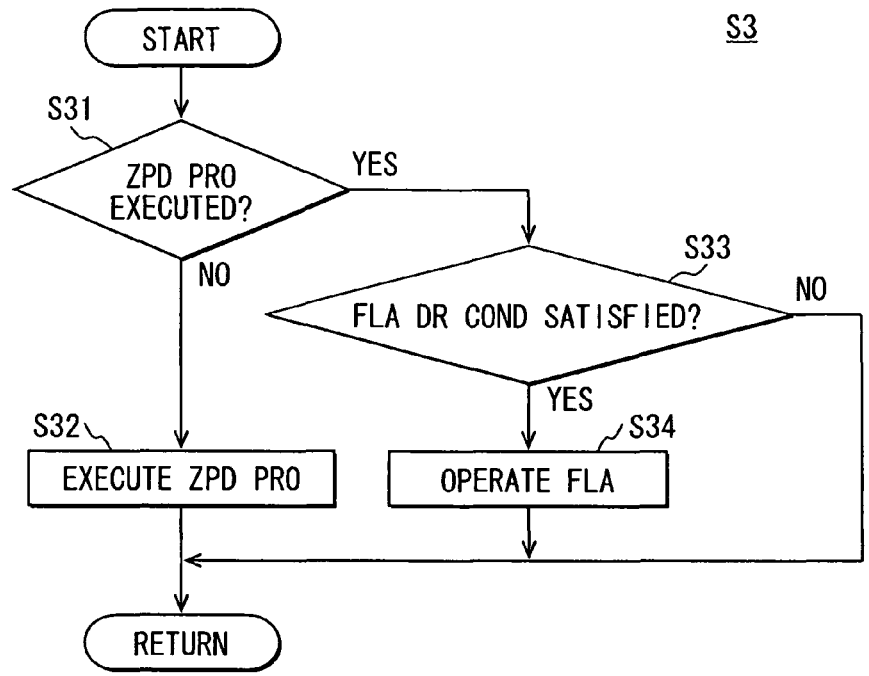
FIG. 12 is a flowchart showing a meter activation process executed by a meter system according to a third embodiment.
Figure 13:
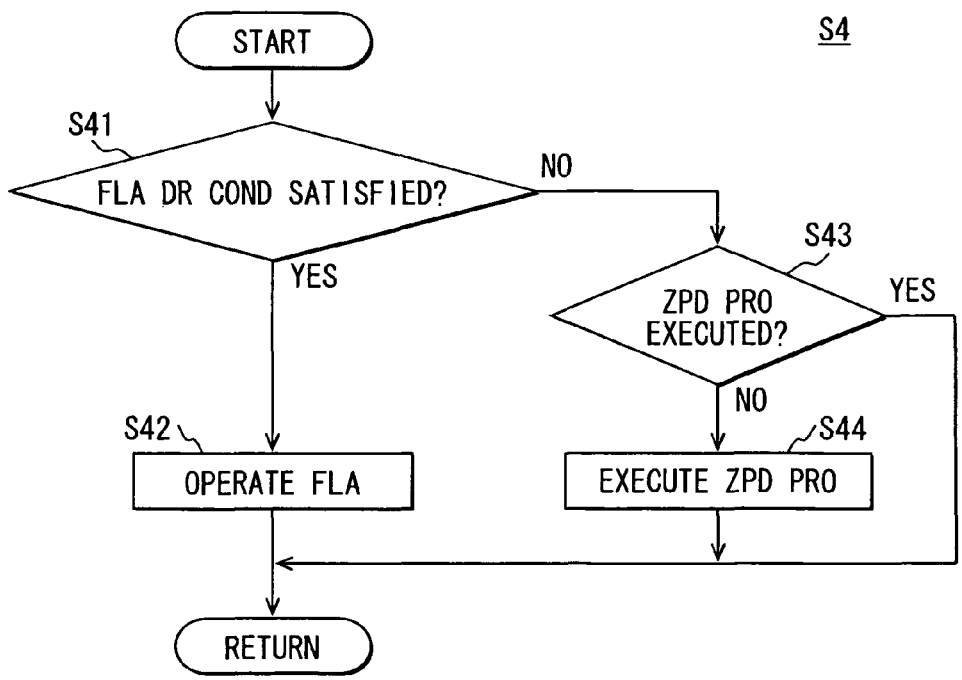
FIG. 13 is a flowchart showing a meter activation process executed by a meter system according to a fourth embodiment.
Figure 14:
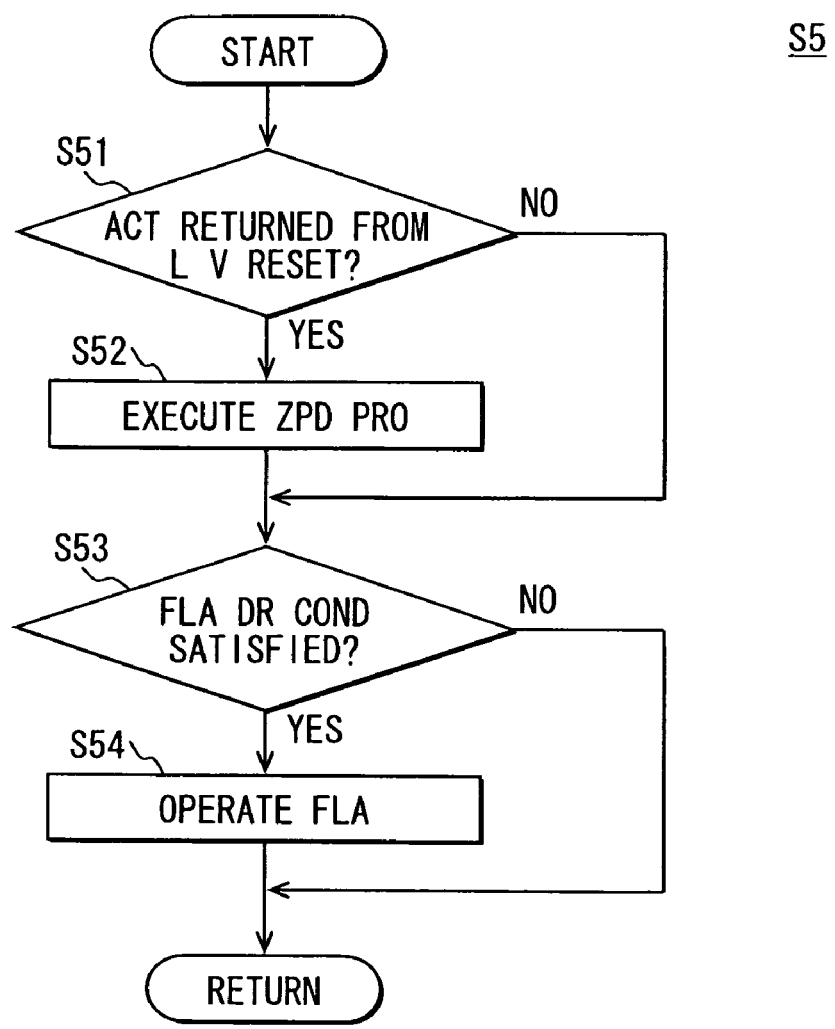
FIG. 14 is a flowchart showing a meter activation process executed by a meter system according to a fifth embodiment.

FIGS. 11A and 11B show another example of the operation of the meter system 1 in a case where the semiconductor switches 52, 54 turn on and off during the voltage detection type ZPD process.

In FIGS. 11A and 11B, the control unit 60 is activated from the sleep mode when the door opens. The control unit 60 starts to execute the voltage detection type ZPD process at time t20. Since the hazard lamp switch turns on after time t20, the semiconductor switches 52, 54 turn on and off. Further, the semiconductor switches 52, 54 turn on and off while the zero point stopper position detection operation in the voltage detection type ZPD process is executed.

Specifically, the control unit 60 is activated from the sleep mode at time t20 since the door of the vehicle opens before time t20. Further, the control unit 60 starts to execute the pointer moving away operation in the voltage detection type ZPD process.

When the control unit 60 executes the pointer moving away operation, the pointer 20 rotates by a predetermined electric angle such as 273 degrees toward the moving away direction Y with a constant speed. Then, the pointer 20 stops rotating at time t22. Then, the pointer 20 maintains at the predetermined electric angle until t23, at which a predetermined time has elapsed. Here, the moving away interval from time t20 to t22, in which the pointer 20 moves away, and the stand-by interval from time t22 to t23, in which the pointer stands by, are defined as a moving-away and stand-by period TU2.

Next, the control unit 60 starts to execute the zero point stopper position detection operation in the voltage detection type ZPD process at time t23, at which the predetermined time has elapsed since time t22. Since the control unit 60 executes the zero point stopper position detection operation in the voltage detection type ZPD process, the pointer 20 rotates toward the returning direction X with another constant speed, which is higher than the constant speed in the pointer moving away operation. Then, the pointer 20 stops rotating at the stopper position at time t25. The time t23, at which the voltage detection type zero point stopper position detection operation starts to be executed, is defined as a starting point of detection period. The time t25, at which the pointer 20 stops at the stopper position, is defined as a detection point of the stopper position. A period from the starting point of detection period to the detection point of the stopper position is defined as a detection period TD2.

Since the control unit 60 controls the hazard lamp switch to turn on and off after time t20, the control unit 60 controls the semiconductor switches 52, 54 to switch from an off state to an on state at time t21. The control unit 60 controls the semiconductor switches 52, 54 to switch from the on state to the off state at time t24. After time t24, the control unit 60 continues to control the semiconductor switches 52, 54 to switch from one state to another state (which is not shown in FIGS. 11A and 11B).

At time t25 when the zero point stopper position detection operation in the voltage detection type ZPD process ends, the control unit 60 determines whether the semiconductors witches 52, 54 turn on and off during the detection period TD2. Here, the control unit 60 determines that the semiconductors witches 52, 54 turn on and off during the detection period TD2. In this case, the control unit 60 does not set the zero point 80 to be the electric angle corresponding to the stopper position detected by the voltage detection type ZPD process at time t25. Instead, the control unit 60 starts to execute the zero point return enforcement type ZPD process.

When the control unit 60 starts to execute the zero point return enforcement type ZPD process at time t25, the A-phase driving signal and the B-phase driving signal are applied to the field windings 32, 33 of the step motor M, respectively, so that the pointer 20 rotates by a predetermined returning angle toward the returning direction X. Since the pointer 20 is disposed almost at the stopper position since the voltage detection type ZPD process is completed from time t20 to time t25, the pointer 20 vibrates around the stopper position and generates abnormal noise until time t26, at which the zero point return enforcement type ZPD process ends. Here, a period from time t25 to time t26 is defined as an execution period T3.

At time t26, at which the zero point return enforcement type ZPD process ends, the control unit 60 sets the zero point θ0 to be the electric angle corresponding to the stopper position detected at time t26.

As described above with reference to FIGS. 10A to 11B, the detection period TD1, TD2, in which the voltage detection type zero point stopper position detection operation is executed, may be shorter than the moving away period TU1, TU2, in which the pointer moving away operation is executed. In the meter system 1, only when the semiconductor switches 52, 54 turn on and off during the short detection period TD1, TD2, the control unit 60 executes the zero point return enforcement type ZPD process. Even when the semiconductor switches 52, 54 turn on and off during the long moving away period TU1, TU2, the control unit 60 does not execute the zero point return enforcement type ZPD process. Thus, the moving away period TU1, TU2 is effectively used.

In the meter system 1, the field windings 32, 33, the flasher semiconductor switch 52, and the buzzer semiconductor switch 54 are disposed on the same substrate 40. Further, one control unit 60 executes the ZPD process and the control of switching on and off the flasher semiconductor switch 52 and the buzzer semiconductor switch 54. Alternatively, although the field windings 32, 33, the flasher semiconductor switch 52, and the buzzer semiconductor switch 54 are disposed on the same substrate 40, the control unit 60 may include a first control unit for executing the ZPD process and a second control unit for executing the control of switching on and off the flasher semiconductor switch 52 and the buzzer semiconductor switch 54. Here, the first control unit is independent from the second control unit. Alternatively, although one control unit 60 executes the ZPD process and the control of switching on and off the flasher semiconductor switch 52 and the buzzer semiconductor switch 54, the field windings 32, 33, the flasher semiconductor switch 52, and the buzzer semiconductor switch 54 may not be disposed on the same substrate 40.

Alternatively, one of the field windings 32, 33 and one of the flasher semiconductor switch 52 and the buzzer semiconductor switch 54 may be disposed on the same substrate 40. The other one of the field windings 32, 33 and the other one of the flasher semiconductor switch 52 and the buzzer semiconductor switch 54 may be disposed on a different substrate.

Alternatively, the control unit 60 may execute one of the ZPD process and the control of switching on and off the flasher semiconductor switch 52 and the buzzer semiconductor switch 54.

(Third Embodiment)

In a meter system according to a third embodiment, the control unit 60 includes the micro computer having the memory 61. The control unit 60 is mounted on the substrate 40, as shown in FIG. 2. The memory 61 stores various program for executing a meter activation process S3. The meter activation process S3 includes a stopper position detection operation, a zero point setting operation and a ZPD operation. When the meter activation process S3 is executed, the updated or set zero point θ0, which is the latest value, is stored. The memory 61 stored a memory region for a ZPD flag, which shows execution of the ZPD operation while the control unit 60 is activated.

The control unit 60 is electrically coupled with the flasher function unit 50, the door sensor 70, the vehicle speed sensor 71, the ignition switch IG and the battery B. The control unit 60 is energized directly from the battery B so that the control unit 60 is activated when the door sensor 70 detects the opening of the door of the vehicle. When the ignition switch IG turns on after the control unit 60 is activated and before a predetermined setting time such as two minutes elapses, the control unit 60 maintains the activation status to be energized from the battery B. After that, when the ignition switch IG turns off, the control unit 60 switches to a sleep mode. When the ignition switch IG does not turn on before the predetermined setting time elapses since the activation, the control unit 60 switches to the sleep mode. When the ignition switch IG turns on after the sleep mode, the control unit 60 is activated again. Alternatively, the control unit 60 may be activated again after the sleep mode when the door of the vehicle opens or when the driver of the vehicle puts on the brake pedal. Further, the control unit 60 sets a ZPD flag when the ZPD process is executed during the activation of the control unit 60. The control unit 60 resets the ZPD flag just before the control unit 60 switches to the sleep mode.

The control unit 60 executes a stopper position detection operation when a predetermined stopper position detection operation executing condition is satisfied. Here, the stopper position detection operation is as follows. After the pointer 20 temporally rotates toward the moving away direction Y, the A-phase driving signal and the B-phase driving signal are controlled so as to rotate toward the returning direction X. The A-phase driving signal and the B-phase driving signal are applied to the field windings 32, 33 of the step motor M. Further, the induction voltage generated in the field windings 32, 33 is detected. With using the detected induction voltage, the system detects that the pointer 20 stops at the stopper position. Here, the stopper position detection operation is well known.

The condition for executing the stopper position detection operation is to activate the control unit 60. The control unit 60 is activated when the door of the vehicle is opened, when the ignition switch IG turns on, or when the brake pedal is put on. The control unit 60 executes the zero point setting operation such that the electric angle corresponding to the stopper position, which is detected in the stopper position detection operation, is set (i.e., updated) as the 25 zero point θ0. Accordingly, the control unit 60 corresponds to the zero point setting means. Here, both of the stopper position detection operation and the zero point setting operation are defined as a ZPD process. The control unit 60 applies the A-phase driving signal and the B-phase driving signal to the field windings 32, 33 of the step motor M with reference to the zero point θ0, which is set in the ZPD process. The control unit 60 corresponds to the stopper position detection operation executing means, a zero point setting means, a signal applying means, a driving control means and control device.

The control unit 60 executes the meter activation process S3 just after the activation. The stopper position detection operation executing condition includes a condition that the control unit 60 is activated. Thus, the stopper position detection operation executing condition is satisfied at a time when the control unit 60 is activated.

The control unit starts to execute the meter activation process S3 just after the control unit 60 is activated. In step S31, the control unit 60 determines whether the ZPD flag stored in the memory 61 is set or reset so that the control unit 60 determines whether the ZPD process has been already executed.

When the control unit 60 determines that the ZPD flag is reset so that the ZPD process has not been executed yet, i.e., when the determination of step S31 is "No," the control unit 60 proceeds to step S32. In step S32, the control unit 60 executes the ZPD process. After the control unit 60 executes the ZPD process, the control unit 60 returns the process. Specifically, the control unit 60 proceeds to step S31, and repeats to execute step S31.

When the control unit 60 determines that the ZPD flag is set so that the ZPD process has been executed, i.e., when the determination of step S31 is "Yes," the control unit 60 proceeds to step S33. In step S33, the control unit 60 determines whether the flasher driving condition is satisfied. When the control unit 60 determines that the flasher driving condition is satisfied, i.e., when the determination of step S33 is "Yes," the control unit 60 proceeds to step S34. In step S34, the control unit 60 operates the flasher. Specifically, the control unit 60 controls the flasher semiconductor switch 52 and the buzzer semiconductor switch 54 to turn on and off so that the indicator 51 blinks in accordance with the flasher driving condition, which is determined in step S33. After the control unit 60 controls the flasher semiconductor switch 52 and the buzzer semiconductor switch 54 to turn on and off, the control unit 60 returns the process. Specifically, the control unit 60 proceeds to step S31, and repeats to execute step S31. When the control unit 60 determines that the flasher driving condition is not satisfied, i.e., when the determination of step S33 is "No," the control unit 60 returns the process. Specifically, the control unit 60 proceeds to step S31, and repeats to execute step S31.

Thus, the control unit 60 does not control the flasher semiconductor switch 52 and the buzzer semiconductor switch 54 to turn on and off so that the indicator 51 blinks without determining whether the flasher driving condition is satisfied while the control unit 60 executes the ZPD process. Thus, the stopper position detected by the stopper position detection operation is not affected by the inductive noise generated by the switching on and off of the flasher semiconductor switch 52 and the buzzer semiconductor switch 54. Thus, the control unit 60 sets the electric angle as the zero point θ0, the electric angle having a low possibility of being affected by the inductive noise. Thus, since the possibility that the incorrect zero point is set to be the standard of the riving signal is low, the vehicle condition value, i.e., the vehicle speed, is accurately indicated.

In the present embodiment, the control unit 60 does not control the flasher semiconductor switch 52 and the buzzer semiconductor switch 54 to turn on and off so that the indicator 51 blinks without determining whether the flasher driving condition is satisfied while the control unit 60 executes the ZPD process. Alternatively, even when the control unit 60 executes the ZPD process, the control unit 60 may determine whether the flasher driving condition is satisfied. When the control unit 60 determines that the flasher driving condition is satisfied, the control unit 60 may control the flasher semiconductor switch 52 and the buzzer semiconductor switch 54 to turn on and off so that the indicator 51 blinks after the control unit 60 completes the ZPD process.

(Fourth Embodiment)

The control unit 60 executes the meter activation process S4 according to a fourth embodiment just after the activation. The stopper position detection operation executing condition includes a condition that the control unit 60 is activated. Thus, the stopper position detection operation executing condition is satisfied at a time when the control unit 60 is activated.

The control unit 60 starts to execute the meter activation process S4 just after the control unit 60 is activated. In step S41, the control unit 60 determines whether the flasher driving condition is satisfied. When the control unit 60 determines that the flasher driving condition is satisfied, i.e., when the determination in step S41 is "Yes," the control unit 60 proceeds to step S42. In step S42, the control unit 60 operates the flasher. Specifically, the control unit 60 controls the flasher semiconductor switch 52 and the buzzer semiconductor switch 54 to turn on and off so that the indicator 51 blinks in accordance with the flasher driving condition, which is determined in step S41. After the control unit 60 controls the flasher semiconductor switch 52 and the buzzer semiconductor switch 54 to turn on and off, the control unit 60 returns the process. Specifically, the control unit 60 proceeds to step S41, and repeats to execute step S41.

When the control unit 60 determines that the flasher driving condition is not satisfied, i.e., when the determination of step S41 is "No," the control unit 60 proceeds to step S43. In step S43, the control unit 60 determines whether the ZPD flag stored in the memory 61 is set or reset so that the control unit 60 determines whether the ZPD process has been already executed.

When the control unit 60 determines that the ZPD flag is reset so that the ZPD process has not been executed yet, i.e., when the determination of step S43 is "No," the control unit 60 proceeds to step S44. In step S44, the control unit 60 executes the ZPD process. After the control unit 60 executes the ZPD process, the control unit 60 returns the process. Specifically, the control unit 60 proceeds to step S41, and repeats to execute step S41. When the control unit 60 determines that the ZPD flag is set so that the ZPD process has been executed, i.e., when the determination of step S43 is "Yes," the control unit 60 returns the process. Specifically, the control unit 60 proceeds to step S41, and repeats to execute step S41.

Thus, the control unit 60 does not execute the ZPD process while the flasher semiconductor switch 52 and the buzzer semiconductor switch 54 are controlled to turn on and off in order to blink the indicator 51 even if the stopper position detection operation executing condition is satisfied. Thus, the stopper position detection operation is executed under a condition that the possibility of the inductive voltage in the field windings 32, 33 to be affected by the inductive noise generated by the on and off operation of the flasher semiconductor switch 52 and the buzzer semiconductor switch 54 is low. The control unit 60 sets the electric angle corresponding to the stopper position to be the zero point θ0, the stopper position detected by the stopper position detection operation under the condition that the possibility is low. Accordingly, since the possibility that the incorrect zero point is set to be the standard of the driving signal is low, the vehicle condition value, i.e., the vehicle speed, is accurately indicated.

(Fifth Embodiment)

As described above, it is necessary to satisfy a predetermined stopper position detection operation executing condition when the stopper position detection operation is executed. The stopper position detection operation executing condition includes a high necessity executing condition and a confirmation executing condition. The high necessity executing condition provides high necessity for executing the stopper position detection operation rapidly since a possibility that the pointer is spaced apart from the stopper position is high. The confirmation executing condition provides necessity for executing the stopper position detection operation in order to confirm the zero point although a possibility that the pointer is spaced apart from the stopper position is low. When the high necessity executing condition is satisfied, the necessity for executing the stopper position detection operation is high. When the confirmation executing condition is satisfied, the necessity for executing the stopper position detection operation is not high. When the stopper position detection operation is executed, the vehicle condition value is indicated with high accuracy. However, the user may feel strangeness since the pointer rotates toward the zero point returning direction although the user does not operate the meter system.

In view of the above difficulty, the control unit 60 executes the meter activation process 55 according to a fifth embodiment just after the activation. The stopper position detection operation executing condition includes a condition that the control unit 60 is activated. Thus, the stopper position, detection operation executing condition is satisfied at a time when the control unit 60 is activated.

Here, the control unit 60 determines whether a supply voltage from the battery B is equal to or larger than a predetermined threshold voltage when the control unit 60 is activated. Thus, the control unit 60 determines whether the activation is "normal activation" or "activation returned from low voltage reset process." In the present embodiment, the threshold voltage is, for example, seven volts. Alternatively, the threshold voltage may be eight volts and more or six volts or less.

The control unit 60 starts to execute the meter activation process S5 just after the control unit 60 is activated. In step S51, the control unit 60 determines whether the supply voltage from the battery B is equal to or larger than the predetermined threshold voltage. Specifically, the control unit 60 determines whether the activation is "normal activation" or "activation returned from low voltage reset process."

Here, the "activation returned from low voltage reset process" will be explained as follows. If the performance of the battery B is comparatively low, when the ignition switch IG turns on, various devices including the control unit 60 mounted on the vehicle are temporally activated, and then, the devices stop operating after that. Then, when the user switches the ignition switch IG on again, the various devices are activated normally.

Specifically, before the ignition switch IG turns on, the various devices are not activated. Thus, the load is comparatively low. The supply voltage from the battery B is larger than the operation voltages of the devices, and therefore, the devices are temporally activated. After the devices are activated, the devices start to be operated so that the load is made high. Thus, the supply voltage from the battery B is reduced to be smaller than the operation voltages of the devices. Then, the devices stop operating. This is defined as a low voltage reset process.

However, after the low voltage reset, when the ignition switch IG turns on again, the supply voltage from the battery B increases, and therefore; the supply voltage is made higher than the operation voltages of the devices. Accordingly, the devices start to operate again. In this case, an alternator starts to operate, and the alternator generates electricity. Therefore, the operation of the devices continues. This is defined as activation returned from low voltage reset process.

When the activation is returned from the low voltage reset process, the devices are operated temporally just before the recovery from the low voltage reset process. Thus, the pointer 20 may not return to the stopper position, and then, the meter system stops operating. Thus, the possibility of the pointer 20 spaced apart from the stopper position is high. Accordingly, it is necessary to execute the stopper position detection operation as soon as possible.

When the performance of the battery B is normal, the low voltage reset process may not be performed even when the ignition switch IG turns on. If the low voltage reset process is not performed, the pointer 20 returns to the stopper position, and then, the system stops operating. Thus, the possibility of the pointer 20 spaced apart from the stopper position is low. Accordingly, it is not necessary to execute the stopper position detection operation as soon as possible.

Thus, in step S51, when the control unit 60 determines that the activation is recovery from the low voltage reset process, i.e., when the determination in step S51 is "Yes," the high necessity executing condition is satisfied. In this case, the control unit 60 proceeds to step S52. In step S52, the control unit 60 executes the ZPD process without depending on the flasher driving condition. Then, the unit 60 proceeds to step S53.

When the control unit 60 determines that the activation is not recovery from the low voltage reset process, i.e., when the determination in step S51 is "No," the conformation executing condition is satisfied. In this case, the control unit 60 does not execute the ZPD process, and proceeds to step S53.

In step S53, the control unit 60 determines whether the flasher driving condition is satisfied. When the control unit 60 determines that the flasher driving condition is satisfied, i.e., when the determination in step S53 is "Yes," the control unit 60 proceeds to step S54. In step S54, the control unit 60 operates the flasher. Specifically, the control unit 60 controls the flasher semiconductor switch 52 and the buzzer semiconductor switch 54 to turn on and off so that the indicator 51 blinks in accordance with the flasher driving condition, which is determined in step S53, and further, the buzzer 53 outputs sound in association with the blink of the indicator 51. After the control unit 60 controls the flasher semiconductor switch 52 and the buzzer semiconductor switch 54 to turn on and off, the control unit 60 returns the process. Specifically, the control unit 60 proceeds to step S53, and repeats to execute step S53. When the control unit 60 determines that the flasher driving condition is not satisfied, i.e., when the determination in step S53 is "No," the control unit 60 returns the process. Specifically, the control unit 60 proceeds to step S53, and repeats to execute step S53.

Thus, when the high necessity executing condition is satisfied, the control unit 60 executes the ZPD process regardless of the flasher driving condition. While the control unit 60 executes the ZPD process, the control unit 60 does not control the flasher semiconductor switch 52 and the buzzer semiconductor switch 54 to turn on and off. Accordingly, the stopper position detection operation is executed with high priority. When the control unit 60 determines that both of the high necessity executing condition and the confirmation executing condition are satisfied, the control unit 60 controls the flasher semiconductor switch 52 and the buzzer semiconductor switch 54 to turn on and off. While the control unit 60 controls the flasher semiconductor switch 52 and the buzzer semiconductor switch 54 to turn on and off, the control unit does not execute the ZPD process. Accordingly, the on and off operation of the flasher semiconductor switch 52 and the buzzer semiconductor switch 54 is executed with high priority.

The control unit 60 does not execute the ZPD process and the on and off operation of the flasher semiconductor switch 52 and the buzzer semiconductor switch 54 at the same time even if the high necessity executing condition and or the confirmation executing condition are satisfied. Accordingly, the stopper position detected by the stopper position detection operation is not affected by the inductive noise generated by the on and off operation of the flasher semiconductor switch 52 and the buzzer semiconductor switch 54. Thus, the control unit 60 sets the electric angle corresponding to the stopper position to be the zero point θ0, the stopper position detected by the stopper position detection operation under the condition that the possibility of the influence of the inductive noise is low. Accordingly, since the possibility that the incorrect zero point is set to be the standard of the driving signal is low, the vehicle condition value, i.e., the vehicle speed, is accurately indicated.

Thus, in the meter system 1, the system is integrated, and the system indicates the accurate vehicle condition value. Further, the user does not feel strangeness.

Figure 15:
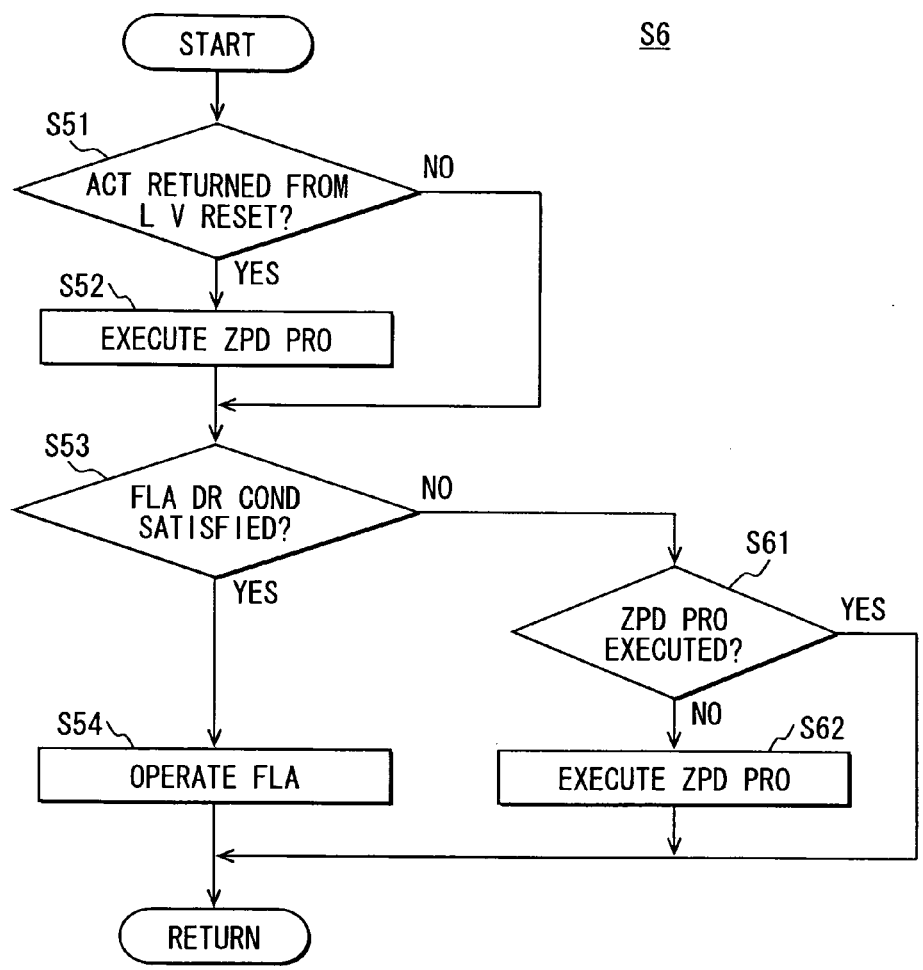
FIG. 15 is a flowchart showing a meter activation process executed by a meter system according to a modification of the fifth embodiment.

In the above embodiment, when the high necessity executing condition is not satisfied, i.e., when the confirmation executing condition is satisfied, the control unit 60 does note execute the ZPD process. As shown in. FIG. 15, alternatively, the meter system may execute the meter activation process S6. Specifically, when the control unit 60 determines in step S53 that the flasher driving condition is not satisfied, i.e., when the determination in step S53 is"No," the confirmation executing condition is satisfied although the high necessity executing condition is not satisfied. Thus, when the control unit 60 determines in step S53 that the flasher driving condition is not satisfied, i.e., when the determination in step S53 is "No," the control unit 60 proceeds to step S61. In step S61, the control unit 60 determines whether the ZPD process has been already executed. Specifically, the control unit 60 determines whether the ZPD flag stored in the memory 61 is set or reset. When the control unit 60 determines that the ZPD flag is reset so that the ZPD process has not been executed yet, i.e., when the determination in step S61 is "No," the unit proceeds to step S62. In step S62, the control unit 60 executes the ZPD process. When the control unit 60 determines that the ZPD flag is set so that the ZPD process has been executed, i.e., when the determination in step S61 is "Yes," the control unit 60 returns the process. Specifically, the control unit 60 proceeds to step S53, and repeats to execute step S53.

(Sixth Embodiment)

It is considered that the stopper position detection operation is executed in priority to the flasher function. However, the user merely recognizes the operation of the flasher when the flasher blinks. Accordingly, when the user operates the combination lever or when the user switches the hazard lamp on, if the blink of the flasher is delayed, the user may misunderstand that the flasher is broken.

In view of the above difficulty, the control unit 60 executes the meter activation process S7 according to a sixth embodiment just after the activation. The stopper position detection operation executing condition includes a condition that the control unit 60 is activated. Thus, the stopper position detection operation executing condition is satisfied at a time when the control unit 60 is activated.

Here, the control unit 60 determines whether a supply voltage from the battery B is equal to or larger than a predetermined threshold voltage when the control unit 60 is activated. Thus, the control unit 60 determines whether the activation is "normal activation" or "activation returned from low voltage reset process." In the present embodiment, the threshold voltage is, for example, seven volts. Alternatively, the threshold voltage may be eight volts and more or six volts or less.

The control unit 60 determines whether the flasher driving condition is met according to the manual operation of the user. When the control unit 60 determines that the flasher driving condition is met, the control unit 60 controls the flasher semiconductor switch 52 and the buzzer semiconductor switch 54 to turn on and off so that the flasher blinks in accordance with the flasher driving condition, which is determined by the control unit 60.

Specifically, the flasher driving condition (i.e., a flasher driving condition for preventing from misjudgment) includes a condition that a combination lever (not shown) is set to a blinker lamp turning on position or off position, which is deviated from a certain reference position by a predetermined angle in an up-down direction. The combination lever controls the right blinker lamp to turn on and off or the left blinker lamp to turn on and off. The right blinker lamp is arranged on the right side of the vehicle, on which the meter system 1 is mounted. The left blinker lamp is arranged on the left side of the vehicle. For example, when the combination lever is set to the blinker lamp turning on position of the right blinker lamp, the right blinker lamp turns on, i.e., blinks. When the combination lever is set to the blinker lamp turning on position of the left blinker lamp, the left blinker lamp turns on, blinks.

Further, the flasher driving condition (i.e., a low necessity flasher driving condition) includes a, condition that a hazard lamp switch is set to a hazard lamp turning on position or off position, which is back from a reference position. The hazard lamp switch controls the hazard lamp to turn on and off. For example, when the hazard lamp switch is set to the hazard lamp turning on position, both of the right blinker lamp and the left blinker lamp turn on, i.e., blinks.

Further, the flasher driving condition (i.e., the flasher driving condition for preventing from misjudgment) includes a condition that an instruction signal is input from a mobile element (not shown) to the control unit 60. The mobile element remote-controls a device of the vehicle via wireless communication between the vehicle and the mobile. Specifically, the mobile element includes an unlock button for unlocking the door of the vehicle and a lock button for locking the door. When the lock button or the unlock button is pushed, an unlock signal or a lock signal is transmitted from the mobile element to the vehicle. The unlock signal and the lock signal are received by an in-vehicle device (not shown) mounted on the vehicle. Then, the signals are input into the control unit 60. The flasher driving condition includes a condition that the unlock signal and the lock signal are input into the control unit 60.

Figure 16:
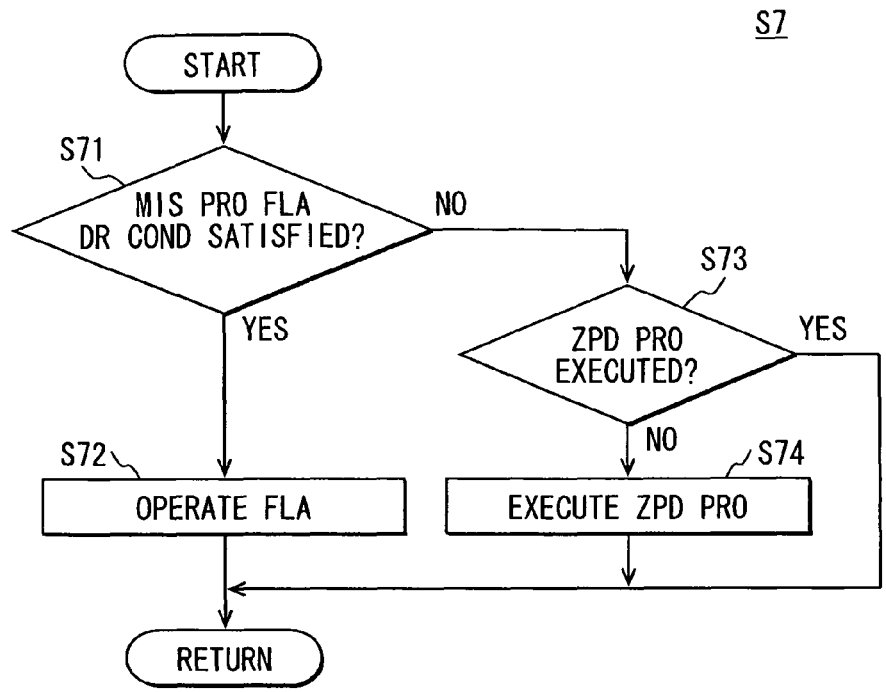
FIG. 16 is a flowchart showing a meter activation process executed by a meter system according to a sixth embodiment.

As shown in FIG. 16, the control unit 60 starts to execute the meter activation process S7 just after the control unit 60 is activated. In step S71, the control unit 60 determines whether the misjudge protection flasher driving condition is satisfied. The misjudge protection flasher driving condition is the flasher driving condition having high necessity for protecting the user from misjudge. Specifically, the misjudge protection flasher driving condition provides to control the flasher semiconductor switch 52 and the buzzer semiconductor switch 54 to turn on and off rapidly so that the indicator 51 blinks. When the misjudge protection flasher driving condition is satisfied, it is necessary to control the flasher semiconductor switch 52 and the buzzer semiconductor switch 54 to turn on and off rapidly. In the present embodiment, the misjudge protection flasher driving condition is such that the combination lever is set to be a turn lamp blinking position, and further, the unlock signal or the lock signal transmitted from the mobile element is input into the control unit 60.

In step S71, when the control unit 60 determines that the misjudge protection flasher driving condition is satisfied, i.e., when the determination in step S71 is "Yes," the control unit 60 proceeds to step S72. In step S72, the control unit 60 controls the flasher semiconductor switch 52 and the buzzer semiconductor switch 54 to turn on and off so that the indicator 51 blinks according to the flasher driving condition and the buzzer 53 outputs sound in association with the blink of the indicator 51. When the flasher semiconductor switch 52 and the buzzer semiconductor switch 54 are controlled to turn on and off, the control unit 60 returns the process. Specifically, the control unit 60 returns to step S71, and then, the control unit 60 repeats step S71.

In step S71, when the control unit 60 determines that the misjudge protection flasher driving condition is not satisfied, i.e., when the determination in step S71 is "No," it is considered that the low necessity flasher driving condition is satisfied or the low necessity flasher driving condition is not satisfied. Here, the low necessity flasher driving condition means the flasher driving condition having low necessity for protecting the user from misjudge. Specifically, the low necessity flasher driving condition does not provide to control the flasher semiconductor switch 52 and the buzzer semiconductor switch 54 to turn on and off rapidly so that the indicator 51 blinks. When the low necessity flasher driving condition is satisfied, the necessity for controlling the flasher semiconductor switch 52 and the buzzer semiconductor switch 54 to turn on and off rapidly is low. In the present embodiment, the low necessity flasher driving condition is such that the hazard lamp switch is set to be the hazard lamp blinking position.

When the control unit 60 determines that the misjudge protection flasher driving condition is not satisfied, i.e., when the determination in step S71 is "No," the control unit 60 proceeds to step S73. In step S73, the control unit 60 determines whether the ZPD flag stored in the memory 61 is set or reset: Thus, the control unit 60 determines whether the ZPD process has been executed. When the control unit 60 determines that the ZPD flag is reset and the ZPD process has not been executed yet, i.e., when the determination in step S73 is "No," the control unit 60 proceeds to step S74. In step S74, the control unit 60 executes the ZPD process. When the control unit 60 determines that the ZPD flag is set and the ZPD process has been executed, i.e., when the determination in step S73 is "Yes," the control unit 60 returns the process. Specifically, the control unit 60 returns to step S71, and then, repeats step S71.

When the control unit 60 determines that the misjudge protection flasher driving condition is satisfied, the control unit 60 controls the flasher semiconductor switch 52 and the buzzer semiconductor switch 54 to turn on and off without depending on the stopper position detection operation executing condition. While the control unit 60 controls the flasher semiconductor switch 52 and the buzzer semiconductor switch 54 to turn on and off, the control unit 60 does not execute the ZPD process. Thus, the on and off operation of the flasher semiconductor switch 52 and the buzzer semiconductor switch 54 is executed in priority to the ZPD process. When the control unit 60 determines that the misjudge protection flasher driving condition is not satisfied, i.e., when the low necessity flasher driving condition is satisfied or the low necessity flasher driving condition is not satisfied, the control unit 60 executes the ZPD process. While the control unit 60 executes the ZPD process, the control unit 60 does not control the flasher semiconductor switch 52 and the buzzer semiconductor switch 54 to turn on and off. Specifically, in this case, the ZPD process is executed in priority to the on and off operation of the flasher semiconductor switch 52 and the buzzer semiconductor switch 54. Accordingly, when the control unit 60 determines that the misjudge protection flasher driving condition is satisfied, the on and off operation of the flasher semiconductor switch 52 and the buzzer semiconductor switch 54 is executed in priority to the ZPD process. Accordingly, delay of the starting of the blink of the indicator 51 is reduced. Thus, the misjudge of the user who misunderstands that the flasher function is failure is reduced.

Even when the misjudge protection flasher driving condition is satisfied, or even when the low necessity flasher driving condition is satisfied, both of the ZPD process and the on and off operation of the flasher semiconductor switch 52 and the buzzer semiconductor switch 54 are not executed at the same time. Accordingly, the stopper position detected by the ZPD process is not affected by the inductive noise generated by the on and off operation of the flasher semiconductor switch 52 and the buzzer semiconductor switch 54. Thus, the electric angle corresponding to the stopper position, which has low possibility of influence of the inductive noise, is set to be the zero point. Further, the possibility that the incorrect zero point becomes a standard of the driving signal is low, and therefore, the vehicle condition value, i.e., the vehicle speed, is correctly indicated.

(Seventh Embodiment)

Figure 17:
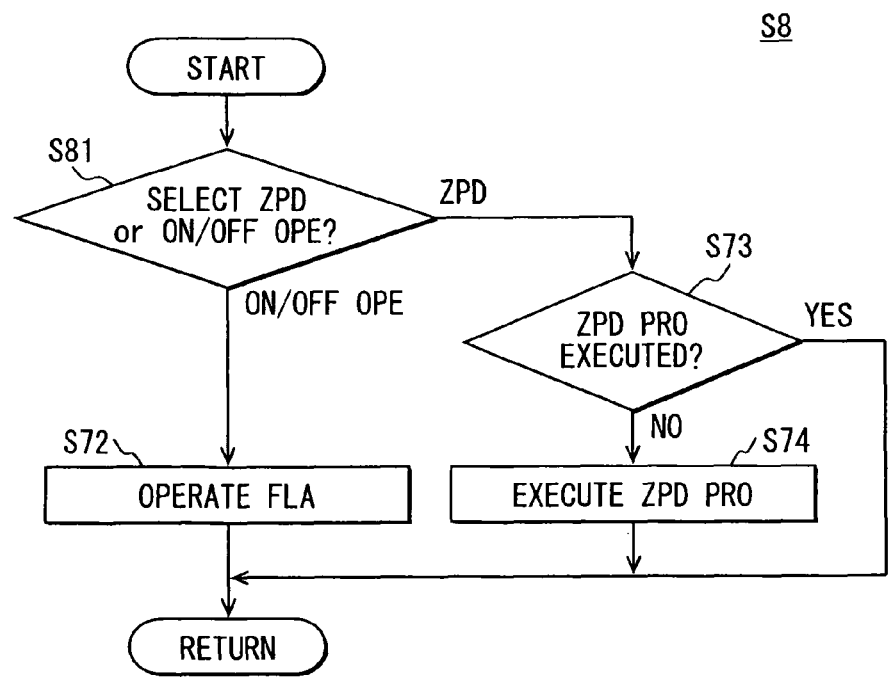
FIG. 17 is a flowchart showing a meter activation process executed by a meter system according to a seventh embodiment.
Figures 18, 19:
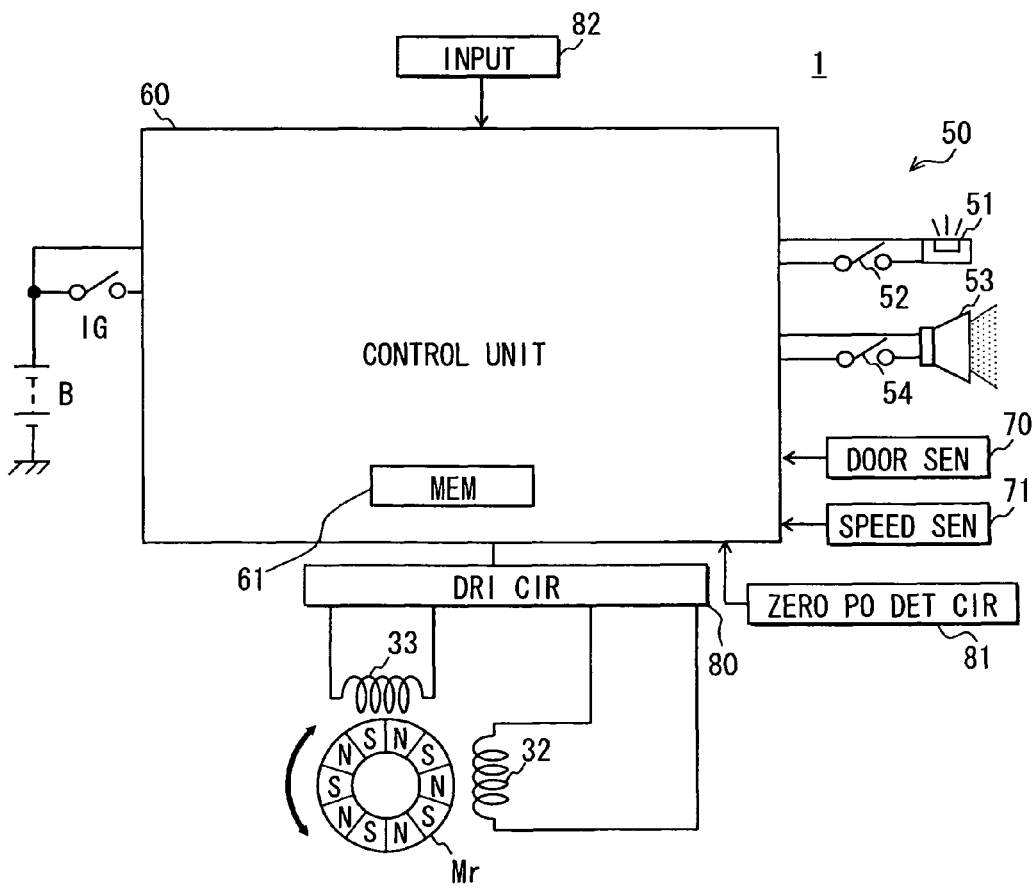
FIG. 18 is a diagram showing priority order used in the meter activation process according to the seventh embodiment.
FIG. 19 is a block diagram showing an electric structure of the meter system according to an eighth embodiment.

A meter system according to a seventh embodiment will be explained with reference to FIGS. 17 and 18.

In the first embodiment, the control unit 60 determines, based on the determination result which of the on and off operation of the flasher semiconductor switch 52 and the buzzer semiconductor switch 54 and the ZPD process is executed in priority, the determination result that the flasher driving condition is the misjudge protection flasher driving condition or the low necessity flasher driving condition. In the present embodiment, in addition to the determination result that the flasher driving condition is the misjudge protection flasher driving condition or the low necessity flasher driving condition, on the basis of the determination result that the stopper position detection operation executing condition is a high necessity stopper position detection operation executing condition or a confirmation stopper position detection operation executing condition, the control unit 60 determines whether the on and off operation of the flasher semiconductor switch 52 or the buzzer semiconductor switch 54 and the ZPD process is executed as a priority.

The memory 61 in the control unit 60 stores a program for executing a meter activation process S8, which includes the stopper position detection operation, the zero point setting operation and the ZPD process. Further, the memory 61 stores a priority order table T2 shown in FIG. 18, which is used for the execution of the meter activation process S8. Furthermore, the control unit 60 stores the current zero point θ0, which is updated or set when the meter activation process S8 is completed.

When the stopper position detection operation is executed, it is necessary to satisfy the. The stopper position detection operation executing condition includes the high necessity stopper position detection operation executing condition and the confirmation stopper position detection operation executing condition. The high necessity stopper position detection operation executing condition has high necessity for executing the stopper position detection operation rapidly since the possibility that the pointer 20 is separated apart from the stopper position is high. The confirmation stopper position detection operation executing condition is used for executing the stopper position detection operation just to be safe although the possibility that the pointer 20 is separated apart from the stopper position is low. When the high necessity stopper position detection operation executing condition is satisfied, the necessity for executing the stopper position detection operation is high. When the confirmation stopper position detection operation executing condition is satisfied, the necessity for executing the stopper position detection operation is not so high. When the stopper position detection operation is executed, the vehicle speed is correctly indicated. However, the user may feel strangeness because the pointer rotates automatically in the zero point returning direction although the user does not perform any operation.

In view of the above difficulty, in the present embodiment, the control unit 60 executes the meter activation process S8 just after the control unit 60 is activated. When the control unit 60 starts to execute the meter activation process S8, in step S81, the control unit 60 determines according to the priority order table T2 whether the on and off operation of the switches 52, 54 or the ZPD process is executed in priority.

Here, the table T2 will be explained. As shown in FIG. 10, in a column of a battery B, "Wake up" means that the control unit 60 is activated under a condition that the supply voltage of the battery B is equal to or larger than the predetermined threshold value, and the stopper position detection operation executing condition is satisfied when the control unit 60 is activated. In the column of the battery B, "Reset" means that the control unit 60 is activated under a condition that the supply voltage of the battery B is smaller than the predetermined threshold value, and the stopper position detection operation executing condition is satisfied when the control unit 60 is activated. In the column of the battery B, "ZPD" means that an instruction for executing the ZPD process forcibly is input into the control unit 60 via a switch or the like (not shown), and therefore, the stopper position detection operation executing condition is satisfied. In a column of an ignition switch IG, "Reset" means that the ignition switch IG turns on under a condition that the supply voltage of the battery B is smaller than the predetermined threshold value, and therefore, the control unit 60 is activated, and the stopper position detection operation executing condition is satisfied when the control unit 60 is activated. In the column of the ignition switch IG, "ZPD" means that the ignition switch IG turns on under a condition that the supply voltage of the battery B is equal to or larger than the predetermined threshold value, and therefore, the control unit 60 is activated, and the stopper position detection operation executing condition is satisfied when the control unit 60 is activated.

The high necessity stopper position detection operation executing condition is such that the control unit 60 is activated under a condition that the supply voltage of the battery B is smaller than the predetermined threshold value (i.e., "Reset" in the column of the battery B is selected), the instruction for executing the ZPD process forcibly is input into the control unit 60 via a switch or the like (not shown) (i.e., "ZPD" in the column of the battery B is selected), the ignition switch IG turns on under a condition that the supply voltage of the battery B is smaller than the predetermined threshold value (i.e., "Reset" in the column of the ignition switch IG is selected), and the ignition switch IG turns on under a condition that the supply voltage of the battery B is equal to or larger than the predetermined threshold value (i.e., "ZPD" in the column of the ignition switch IG is selected). The confirmation stopper position detection operation executing condition is such that the control unit 60 is activated under a condition that the supply voltage of the battery B is equal to or larger than the predetermined threshold value (i.e., "Wake up" in the column of the battery B).

In the table T2, "AUTO RES FUNC" in a column of the operation represents automatic response function, and means that the unlock signal and the lock signal from an in-vehicle device is input into the control unit 60. "HAZARD" in the column of the operation means that the hazard lamp switch is set to be a hazard blinking position. "TURN" in the column of the operation means that the combination lever is set to be the turn lamp blinking position.

The misjudge protection flasher driving condition is such that the lock signal or the unlock signal is input into the control unit 60 from the in-vehicle device (i.e., "AUTO RES FUNC" in the column of the operation is selected), and the combination lever is set to be the turn lamp blinking position ("TURN" in the column of the operation is selected). The low necessity flasher driving condition is such that the hazard lamp switch is set to be the hazard blinking position (i.e., "HAZARD" in the column of the operation is selected).

The control unit 60 determines in step S81 that the on/off operation of the switches 52, 54 is executed in priority to the ZPD process when the "AUTO RES FUNC" is satisfied. In this case, in the priority order table T2, "FLASHER 1" is shown in the vertical column of the "AUTO RES FUNC". Specifically, when the misjudge protection flasher driving condition is satisfied, the control unit 60 controls the switches 52, 54 to turn on and off without depending on the stopper position detection operation executing condition even if the stopper position detection operation executing condition is the high necessity stopper position detection operation executing condition. Further, during a period when the switches 52, 54 are controlled to turn on and off, the control unit 60 does not execute the ZPD process. In this case, the control unit 60 may execute the ZPD process after the on/off operation of the switches 52, 54 is completed. Here, in the table T2, "–" is shown in the vertical column of the "AUTO RES FUNC" since the possibility that the ignition switch IG turns on when the "AUTO RES FUNC" is satisfied.

The control unit 60 determines in step S81 that the on/off operation of the switches 52, 54 is executed in priority to the ZPD process when both of the "HAZARD" and the "Wake up" are satisfied simultaneously. In this case, in the priority order table T2, "FLASHER 2" is shown in the vertical column of the "HAZARD". Specifically, when both of the low necessity flasher driving condition and the confirmation stopper position detection operation executing condition are satisfied, the control unit 60 controls the switches 52, 54 to turn on and off. While the switches 52, 54 are controlled to turn on and off, the control unit 60 does not execute the ZPD process. When the "HAZARD" is satisfied, the possibility that the control unit 60 is activated under a condition that the supply voltage from the battery B is smaller than the threshold value is small. Thus, in the table T2, "–" is shown in the vertical column of the "HAZARD."

The control unit 60 determines in step S81 that the on/off operation of the switches 52, 54 is executed in priority to the ZPD process when the "TURN" is satisfied. In this case, in the priority order table T2, "FLASHER 3" is shown in the vertical column of the "TURN". Specifically, when the control unit 60 determines that the misjudge protection flasher driving condition is satisfied, the control unit 60 controls the switches 52, 54 to turn on and off without depending on the stopper position detection operation executing condition even if the stopper, position detection operation executing condition is the high necessity stopper position detection operation executing condition. While the control unit 60 controls the switches 52, 54 to turn on and off, the control unit 60 does not execute the ZPD process. When the "TURN" is satisfied, the possibility that the control unit 60 is activated under a condition that the supply voltage from the battery B is smaller than the threshold value is small. Thus; in the table T2, "–" is shown in the vertical column of the "TURN."

The control unit 60 determines in step S81 that the ZPD process is executed in priority to the on/off operation of the switches 52, 54 when both of the "HAZARD" and the "ZPD" in the column of the battery B are simultaneously satisfied, when both of the "HAZARD" and the "Reset" in the column of the ignition switch IG are simultaneously satisfied, or when both of the "HAZARD" and the "ZPD" in the column of the ignition switch IG are simultaneously satisfied. In this case, in the priority order table T2, "ZPD" is shown in the vertical column of the "HAZARD". Specifically, the control unit 60 executes the ZPD process when the both of the low necessity flasher driving condition and the high necessity stopper position detection operation executing condition are satisfied. While the control unit 60 executes the ZPD process, the control unit 60 does not execute the on and off operation of the switches 52, 54.

When the control unit 60 determines in step S81 that the on and off operation of the switches 52, 54 is executed in priority to the ZPD process, i.e., when the control unit 60 determines that the blinking of the indicator 51 is priority to the ZPD process, the control unit 60 proceeds to step S72. In step S72, the control unit 60 controls the switches 52, 54 to turn on and off. Then, the control unit 60 returns the process. Specifically, the control unit 60 returns to step S81, and then, repeats step S81.

When the control unit 60 determines in step S81 that the ZPD process is executed in priority to the on and off operation of the switches 52, 54, i.e., when the control unit 60 determines that the ZPD process is priority to the blinking of the indicator 51, the control unit 60 proceeds to step S73. In step S73, the control unit 60 determines whether the ZPD flag stored in the memory 61 is set or reset. Thus, the control unit 60 determines whether the ZPD process has been executed. When the ZPD flag is reset, and the ZPD process has not been executed yet, i.e., when the determination in step S73 is "No," the control unit 60 proceeds to step S74. In step S74, the control unit 60 executes the ZPD process. When the ZPD flag is set, and the ZPD process has been executed, i.e., when the determination in step S73 is "Yes," the control unit 60 returns the process. Specifically, the control unit 60 returns to step S81, and then, repeats step S81.

When both of the low necessity flasher driving condition and the high necessity stopper position detection operation executing condition are simultaneously satisfied, the control unit 60 executes the ZPD process. While the control unit 60 executes the ZPD process, the control unit 60 does note execute the on and off operation of the switches 52, 54. Thus, the control unit 60 executes the ZPD process in priority to the on and off operation of the switches 52, 54. When both of the low necessity flasher driving condition and the confirmation stopper position detection operation are simultaneously satisfied, the control unit 60 controls the switches 52, 54 to turn on and off.

While the control unit 60 executes the on and off operation of the switches 52, 54, the control unit 60 does not execute the ZPD process. Accordingly, the control unit 60 executes the on and off operation of the switches 52, 54 in priority to the ZPD process.

(Eighth Embodiment)

A meter system according to an eighth embodiment will be explained as follows.

The control unit 60 in FIG. 3 according to the eighth embodiment is electrically coupled with the flasher function unit 50, a door sensor 70, a vehicle speed sensor 71, a vehicle side device (not shown), an ignition switch IG, a battery B, a driving circuit 80, a zero position detection circuit 81 and an input element 82. The control unit 60 is energized directly from the battery B so that the control unit 60 is activated when the door sensor 70 detects the opening of the door of the vehicle, or when the vehicle side device inputs an unlock signal or a lock signal into the control unit 60. When the ignition switch IG turns on after the control unit 60 is activated and before a predetermined setting time such as two minutes elapses, the control unit 60 maintains the activation status to be energized from the battery B. After that, when the ignition switch IG turns off, the control unit 60 switches to a sleep mode. When the ignition switch IG does not turn on before the predetermined setting time elapses since the activation, the control unit 60 switches to the sleep mode. When the ignition switch IG turns on after the sleep mode, the control unit 60 is activated again. Alternatively, the control unit 60 may be activated again after the sleep mode when the door of the vehicle opens or when the driver of the vehicle puts on the brake pedal. Further, the control unit 60 sets a ZPD flag when the ZPD process is executed during the activation of the control unit 60. The control unit 60 resets the ZPD flag just before the control unit 60 switches to the sleep mode.

The control unit 60 provides a driving instruction signal to the driving circuit 80. The driving instruction signal provides to control rotation of the magnet rotor Mr. The driving circuit 80 applies the A-phase driving signal and the B-phase driving signal to the field windings 32, 33 based on the driving instruction signal from the control unit 60. Thus, the magnet rotor Mr rotates according to voltage change of the A-phase and B-phase driving signals, which correspond to the electric angle.

The zero position detection circuit 81 as a detection element detects the inductive voltage, which is generated in the field windings 32, 33, at every predetermined interval. The circuit 81 transmits information about the inductive voltage to the control unit 60.

Figure 20:
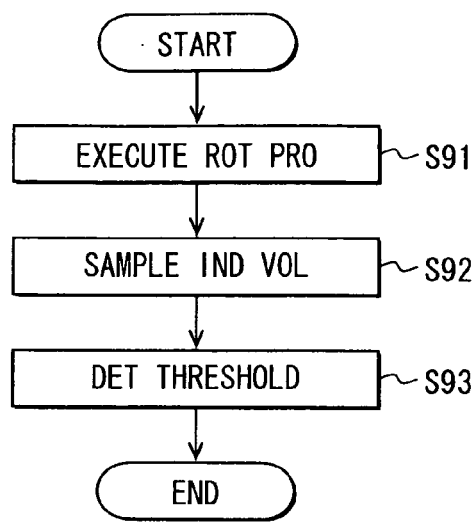
FIG. 20 is a flow chart showing a ZPD process in the eighth embodiment.

Next, the zero position detection process as the ZPD process of the control unit 60 will be explained with reference to FIG. 20. FIG. 20 shows the flow chart of the ZPD process. When the stopper position detection operation executing condition is satisfied, the control unit 60 executes a pointer moving away operation, and then, executes a zero point stopper position detection operation. The stopper position detection operation executing condition is that the control unit 60 is activated. The control unit 60 is activated when the vehicle door is opened, when the ignition switch IG turns on, or when the brake pedal is put on. The process in FIG. 20 starts when the stopper position detection operation executing condition is satisfied. First, the process starts at step S11.

In step S91, a rotation process is executed. Then, the control unit 60 proceeds to step S92. The rotation process is a process for rotating the pointer 20. Specifically, in step S91, the pointer moving away operation and the pointer returning operation are executed. The pointer moving away operation is such that the control unit 60 controls the A-phase and B-phase driving signals to be applied to the field windings 32, 33 of the step motor M so that the pointer 20 rotates toward the moving away direction Y, and then, stops rotating. The pointer returning operation is such that the control unit 60 controls the A-phase and B-phase driving signals to be applied to the field windings 32, 33 of the step motor M so that the pointer 20 rotates toward the returning direction X.

In step S92, a sampling process of the inductive voltage starts. Then, the control unit 60 proceeds to step S93. In step S92, when the pointer returning operation is executed in step S91, the control unit 60 controls the zero point detection circuit 81 to detect (i.e., execute sampling) the detection voltage obtained from the zero point detection circuit 81 at every predetermined sampling time. Then, it proceeds to step S93. Accordingly, the information about the inductive voltage is input into the control unit 60 from the zero point detection circuit 81 at each sampling time.

In step S93, a threshold determination process is executed. Then, the process in FIG. 20 ends. The threshold determination process is a process for determining whether the inductive voltage detected in step S92 is equal to or smaller than a predetermined threshold value. When the inductive voltage is equal to or smaller than the threshold value, the control unit 60 estimates that the pointer 20 stops at the stopper position. Specifically, the control unit 60 detects that the pointer 20 stops at the stopper position. The control unit 60 sets or updates the zero point θ0 to be the electric angle corresponding to the stopper position, which is detected in step S93.

The zero point stopper detection operation is a process for controlling the A-phase and B-phase driving signals to be applied to the windings 32, 33 of the step motor M so that the pointer 20 rotates toward the returning direction X after the pointer moving away operation ends. Further, the operation is a process for estimating that the pointer 20 stops at the stopper position when the detection voltage obtained from the zero position detection circuit 81 is equal to or smaller than the threshold value. Thus, the process provides to detect that the pointer 20 stops at the stopper position.

In step S93 in the ZPD process, the control unit 60 executes the zero point setting operation for setting or updating the zero point θ0 to be the electric angle corresponding to the stopper position. Thus, the pointer moving away operation, the zero point stopper position detection operation and the zero point setting operation provide the ZPD process. When the control unit 60 inputs the driving instruction signal with the zero point θ0 as a standard to the driving circuit 80 so that the driving circuit 80 applies the driving signals to the field windings 32, 33. Accordingly, the control unit 60 provides a driving control unit. The control unit 60 controls the driving instruction signal to the driving circuit 80 with using the zero point θ0 as the standard, which is stored in the memory 61 under a condition that the control unit 60 is activated after the ZPD process is executed. Thus, the control unit 60 controls the pointer 20 to indicate the vehicle speed value of the vehicle speed sensor 71.

The control unit 60 determines whether a predetermined flasher driving condition, which is manually operated by the user, is satisfied. When the flasher driving condition is satisfied, the control unit 60 controls the flasher semiconductor switch 52 and the buzzer semiconductor switch 54 to turn on and off so that the flasher blinks according to the flasher driving condition. Accordingly, when the user inputs the operation signal for operating the flasher function device 50 into the system with using the input element 82, the control unit 60 determines that the flasher driving condition is satisfied. Here, the operation signal is a switching control signal.

Here, the combination lever provides the input element 82 for inputting the operation signal. The hazard lamp switch provides the input element 82. The mobile device provides the input element 82.

Figure 21:
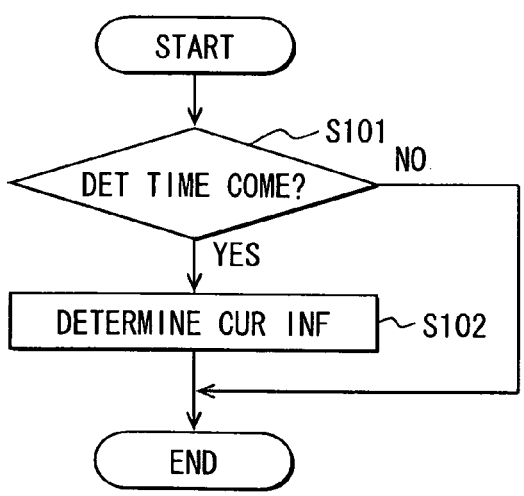
FIG. 21 is a flow chart showing a first noise generating process.
Figure 22:
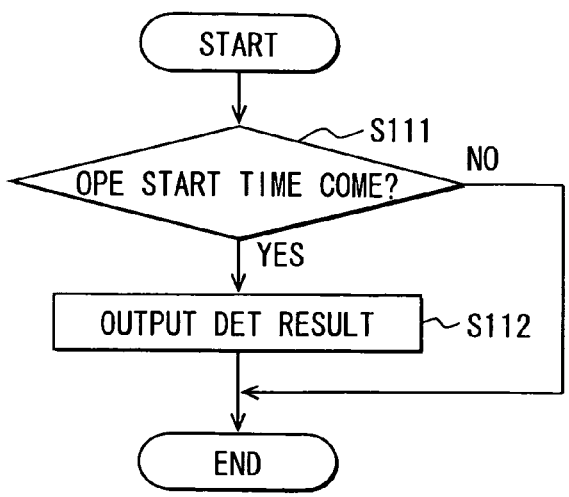
FIG. 22 is a flow chart showing a second noise generating process.

In view of the above difficulty, the control unit 60 controls the detection time at which the inductive voltage is detected in step S92 and the operation start time at which the flasher function device 50 starts to operate. Specifically, the operation start time is controlled such that the generation period of the inductive noise is disposed within the detection interval. The specific control process will be explained with reference to FIGS. 21-23. FIG. 21 shows a first noise generation function process, and FIG. 22 shows a second noise generation function process. FIG. 23 shows a timing chart of the operation of the flasher function device 50.

The first noise generation function process will be explained. The control unit 60 executes the first noise generation function process. The first noise generation function process is repeatedly executed in a short time under a condition that the control unit 60 executes the ZPD process in FIG. 20. When the process starts, in step S101, the control unit 60 determines whether the determination time has come. When the control unit 60 determines that the determination time has come, the control unit 60 proceeds to step S102. When the control unit 60 determines that the determination time has not come, the process ends. Here, at the detection time, the control unit 60 determines whether the operation signal for operating the flasher function device 50 is input at each determination interval, which is preliminary set. Specifically, the control unit 60 determines whether the determination period has elapsed since the last determination has been performed. The determination period is set to be longer than the detection period for detecting the inductive voltage.

In step S102, since the detection time has come, the control unit 60 determines the information of the current operation signal. Then, the process ends. Specifically, the control unit 60 determines whether the determination of the current information is different from the previous information, which is determined at the last determination time. For example, the operation signal of the flasher function device 50 is "low" at the last determination time. At the present time, the operation signal is "high," which is different from the last determination time. In this case, it is necessary to input the operation signal into the flasher function device 50. The control unit 60 functions as a determination element for determining whether the operation signal is input at every determination interval.

Next, the second noise generation function process will be explained. The second noise generation function process shown in FIG. 22 is executed by the control unit 60. The second noise generation function process is repeatedly executed in a short time under a condition that the control unit 60 executes the ZPD process in FIG. 20. In step S111, the control unit 60 determines whether the operation starting time has come. When the control unit 60 determines that the operation starting time has come, the unit 60 proceeds to step S112. When the control unit 60 determines that the operation start-ing time has not come, the process ends. Here, the operation starting time is arranged such that the starting time of the generation period of the inductive noise is after the starting time of the detection interval, and the ending time of the generation period of the inductive noise is before the ending time of the detection interval. Specifically, the operation signal time is defined such that there is no detection time from the operation signal time to the ending time of the generation period of the inductive noise. In the present embodiment, the operation starting time is set to be just after the detection time. For example, the operation starting time is set to be later by 0.1 milliseconds than the detection time.

In step S112, since the operation starting time has come, the control unit 60 outputs a determination result according to the determination result in the first noise generation function process. Then, the process ends. The output of the determination result means that the control unit 60 inputs the operation signal into the flasher function device 50 when the determination result represents the information showing that it is necessary to input the operation signal to the flasher function device 50. When the information shows that it is not necessary to input the operation signal to the flasher function device 50, the control unit 60 does not control the flasher function device 50. Thus, when the operation signal for operating the flasher function device 50 is input by the user, the control unit 60 does not input the operation signal to the flasher function device 50 immediately. Instead, the control unit 60 controls the operation timing such that the control unit 60 controls to operate the flasher function device 50 after the detection time. Thus, the flasher function device 50 is operated after the detection time. Thus, the generation period of the inductive noise starting from the operation starting time ends during the detection interval. Specifically, the generation period of the inductive noise ends before the next detection time. The detection time is not arranged in the generation period of the inductive noise.

The control timing of the noise generation function processes in FIGS. 21 and 22 will be explained with reference to FIG. 23. At the time t0, the operation signal for operating the flasher function device 50 is a low state (i.e., "L"). The determination time has come after a predetermined determination time interval T1 such as 50 milliseconds has elapsed since the previous determination time. After the determination time elapses, the first noise generation function process is executed. Thus, the determination of the operation signal is executed at every determination time interval T1.

The detection time has come after a predetermined detection time interval T2 such as 10 milliseconds has elapsed since the previous detection time. After the detection time elapses, the inductive voltage is detected. Thus, the detection of the inductive voltage is executed at every detection time interval T2. The detection time interval T2 is set to be shorter than the determination time interval T1. The generation period T3 of the inductive noise starts at a time when the operation signal is input into the flasher function device 50. The generation period T3 such as 2 milliseconds is shorter than the detection time interval T2.

At, the time t1 after the time t0, the operation signal is switched from the low state to the high state (i.e., "H"). Accordingly, at the time t1, the operation signal is input by the user. Thus, at the time t2, which is the next determination time after the time t1, the first noise generation function process is executed. Actually, the first noise generation function process is executed at the time t3 since there is a time lag until the control unit 60 starts to execute the first noise generation function process. The time t3 is disposed later by 0.1 milliseconds than the time t2. At the time t3, since the operation signal (i.e., "H") is different from the previous operation signal (i.e., "L"), the determination result is such that the operation signal is changed from L to H. Then, at the time t4, which is the next detection time after the time t3, the inductive voltage is detected. Actually, the inductive voltage is detected at the time t5 since there is a time lag until the control unit 60 starts to execute the detection process. The time t4 is disposed later by 0.1 milliseconds than the time t3. At this moment, since the flasher function device 50 does not function, the detection of the inductive voltage is not affected by the inductive noise. At the time t6, which is the operation starting time just after the time t5, the second noise generation function process is executed. At the time t6, it is necessary to operate the flasher function device 50 based on the determination result, the operation signal is input into the flasher function device 50. When the operation signal is input into the flasher function device 50, the inductive noise is generated during the generation period T3 fro the time t6 to the time t7. Since the generation period T3 of the inductive noise is shorter than the detection time interval T2, the inductive noise is not generated at the next detection time t8.

Since the process is repeatedly executed with the process timing, even when the operation signal is switched from H to L at the time t9, the first noise generation function process is executed at the time t11, which is after the determination time t10. Then, at the next operation starting time t12, the operation signal is input into the flasher function device 50. Thus, since the next detection time t14 is not disposed in the generation period T3 from the time t12 to the time t13, the inductive noise is not generated at the detection time t14.

When the flasher function device 50 is operated periodically, i.e., when the generation period of the noise and the interval, in which the inductive noise is not generated, are alternately repeated, the control unit 60 controls the operation starting time of the flasher function device 50 so that the length of the interval of the noise is controlled. The length of the interval of the noise is controlled such that the generation period is disposed in the detection interval, i.e., the detection time is not disposed in the generation period. Specifically, even when the flasher function device 50 is operated periodically, the period of the operation of the device 50 is temporally shifted so that the detection of the inductive voltage is not affected by the inductive noise. Thus, the zero point stopper position detection operation is executed with using the inductive voltage, which is not affected by the inductive noise. Here; a case where the flasher function device 50 is periodically operated is such that, for example, the indicator 51 blinks.

The detection time interval T1 will be explained. The detection time interval T1 is set to be larger than a total of the generation period T3 of the inductive noise and the period from the activation of the detection process to the end of the second noise generation function process. The period from the activation of the detection process of the inductive voltage to the end of the second noise generation function process is much smaller than the generation period T3 of the inductive noise. Thus, this period may be negligible.

Thus, in the meter system 1 according to the present embodiment, when the operation signal for operating the flasher function device 50 is input, the control unit 60 inputs the operation signal into the flasher function device 50 at the operation starting time, which is defined such that the starting time of the generation period T3 of the noise is after the starting time of the detection interval T2, and the end of the generation period T3 is before the end of the detection interval T2. Accordingly, even when the operation signal is input into, the control unit 60 does not operate the flasher function device 50 immediately, but the control unit 60 operates the flasher function device 50 at the operation starting time, which satisfies a predetermined condition. Since the generation period T3 is shorter than the detection time interval T2, when the flasher function device 50 is operated at the operation starting time, which is defined such that the starting time of the generation period T3 is after the starting time of the detection time interval T2, and the end of the generation period T3 is before the end of the detection time interval T2, the detection time at which the zero position detection circuit 81 detects the inductive voltage is not disposed in the generation period T3. Since the inductive noise is not generated at the detection time, the zero point stopper position detection operation is performed with using the inductive voltage, which is not affected by the noise. Accordingly, since the incorrect zero point is not set to be the standard of the driving signal. The vehicle speed value is correctly indicated.

In the present embodiment, in view of the length of the generation period of the inductive noise and the periodic control of the zero position detection, the inductive noise is forcibely generated in the detection interval. Thus, the zero point stopper position detection operation is not affected by the noise.

In the present embodiment, when the operation signal is input, the control unit 60 inputs the operation signal into the flasher function device 50 at the operation starting time, which is disposed between the detection time and the end of the detection time interval T2, the detection time at which the inductive voltage is firstly detected after the operation signal is input. If the time period from the input of the operation signal to the operation starting time is long, the user may misunderstand that failure occurs in the meter system. In the present embodiment, after the operation signal is input, the operation signal is input into the flasher function device 50 until the detection interval T2 elapses from the first detection time. Thus, the inductive noise is not generated at the detection time. Further, the flasher function device 50 is operated comparatively quickly. Thus, the time difference from the input of the operation signal to the operation of the flasher function device 50 is shortened.

The control unit 60 determines whether the operation signal is input at every determination time interval T1. When the control unit 60 determines that the operation signal is input, the control unit 60 input the operation signal into the flasher function device 50 at the operation starting time. Accordingly, even when the operation signal is input, the control unit 50 executes a process corresponding to the input of the operation signal after the determination time interval T1 has elapsed. When the detection time interval T2 is set to be longer than the determination time interval T1, and the control unit 60 determines periodically whether the operation signal is input, the process load of the control unit 60 is reduced. In this case, it is not necessary for the control unit 60 to monitor always whether the operation signal is input.

(Other Embodiments)

The A-phase and B-phase driving signals may be provided by a cosine wave function or a sine wave function. Alternatively, the driving signals may be provided by a trapezoid wave function or a triangle wave function. The driving signals may be signals alternately oscillated with a phase difference of 90 degrees. The vehicle condition value to be indicated by the pointer 20 may be various values of vehicle conditions. For example, the vehicle condition value may be temperature of cooling water. Thus, the lower limit may be zero, a negative value. The lower limit may be set according to the vehicle condition value.

The vehicle, on which the meter system is mounted, may be an automobile, a bus, an automotive truck, or a motor cycle.

The above disclosure has the following aspects.

According to a first aspect of the present disclosure, a meter system for a vehicle includes: an indicator including a pointer, a step motor, a stopper mechanism and a driving control unit; and a flasher function unit including a flasher semiconductor switch, a flasher and a flasher control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element executes a pointer moving away operation for controlling the driving signal to rotate the pointer toward a moving away direction opposite to the zero point returning direction when a predetermined stopper position detection operation executing condition is satisfied. The stopper position detection operation executing element executes further executes a voltage detection type zero point stopper position detection operation after the stopper position detection operation executing element executes the pointer moving away operation. The voltage detection type zero point stopper position detection operation provides to control the driving signal for rotating the pointer toward the zero point returning direction, and provides to detect an inductive voltage generated in the field winding. The voltage detection type zero point stopper position detection operation provides to determine based on the induction voltage whether the pointer stops at the stopper position. The zero point setting element sets the zero point to be an electric angle corresponding to the stopper position, which is detected in the voltage detection type zero point stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The flasher semiconductor switch is disposed adjacent to the field winding. The stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position. The stopper position detection operation executing element executes the zero point return enforcement type zero point stopper position detection operation when the stopper position detection operation executing condition is satisfied, and the flasher semiconductor switch turns on and off to blink the flasher. The stopper position detection operation executing element executes the voltage detection type zero point stopper position detection operation when the stopper position detection operation executing condition is satisfied, and the flasher semiconductor switch does not turn on and off to blink the flasher.

In the above system, when there is a low possibility that the induction voltage of the field winding is influenced by the induction noise generated by the flasher semiconductor switch, the voltage detection type zero point stopper position detection operation is performed. Then, the electric angle corresponding to the stopper position detected in the voltage detection type zero point stopper position detection operation is set as the zero point. When there is a high possibility that the induction voltage of the field winding is influenced by the induction noise generated by the flasher semiconductor switch, the zero point return enforcement type zero point stopper position detection operation is performed. Then, the zero point in the zero point return enforcement type zero point stopper position detection operation is set. Thus, the user pays attention to the blink of the flasher, the user does not feel strangeness even if the vibration and abnormal noise of the pointer are generated. Thus, the system is integrated, and the indication of the vehicle speed is improved, and further, the strange feeling of the user is reduced.

Alternatively, the zero point setting element may not set the zero point to be the electric angle corresponding to the stopper position, which is detected in the voltage detection type zero point stopper position detection operation, and the driving control unit further executes the zero point return enforcement type zero point stopper position detection operation after the voltage detection type zero point stopper position detection operation when the flasher semiconductor switch turns on and off to blink the flasher while the stopper position detection operation executing element executes the voltage detection type zero point stopper position detection operation. Thus, even if the flasher semiconductor switch turns on and off while the voltage detection type zero point stopper position detection operation is performed, the indication of the vehicle speed is improved, and further, the strange feeling of the user is reduced. Further, the zero point return enforcement type zero point stopper position detection operation is performed only when the flasher semiconductor switch turns on and off during such a comparatively short period, in which the voltage detection type zero point stopper position detection operation is performed. The zero point return enforcement type zero point stopper position detection operation is not performed even when the flasher semiconductor switch turns on and off during a period, in which the pointer moving away operation is performed. Thus, the period, in which the pointer moving away operation is performed, is effectively utilized. Alternatively, the driving control unit may further execute the zero point return enforcement type zero point stopper position detection operation just after the flasher semiconductor switch turns on and off to blink the flasher while the stopper position detection operation executing element executes the voltage detection type zero point stopper position detection operation.

Alternatively, the flasher semiconductor switch and the field winding of the step motor may be disposed on a same substrate. Alternatively, the driving control unit and the flasher control unit may be provided by a same controller.

According to a second aspect of the present disclosure, a meter system for a vehicle includes: an indicator including a pointer, a step motor, a stopper mechanism and a driving control unit; and a flasher function unit including a flasher semiconductor switch, a flasher, a flasher control unit, a buzzer semiconductor switch, a buzzer and a buzzer control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element executes a pointer moving away operation for controlling the driving signal to rotate the pointer toward a moving away direction opposite to the zero point returning, direction when a predetermined stopper position detection operation executing condition is satisfied. The stopper position detection operation executing element executes further executes a voltage detection type zero point stopper position detection operation after the stopper position detection operation executing element executes the pointer moving away operation. The voltage detection type zero point stopper position detection operation provides to control the driving signal for rotating the pointer toward the zero point returning direction, and provides to detect an inductive voltage generated in the field winding. The voltage detection type zero point stopper position detection operation provides to determine based on the induction voltage whether the pointer stops at the stopper position. The zero point setting element sets the zero point to be an electric angle corresponding to the stopper position, which is detected in the voltage detection type zero point stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The buzzer outputs sound when the buzzer semiconductor switch turns on and off. The buzzer control unit controls the buzzer semiconductor switch to turn on and off in association with the flasher semiconductor switch. At least one of the flasher semiconductor switch and the buzzer semiconductor switch is disposed adjacent to the field winding. The stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position. The stopper position detection operation executing element executes the zero point return enforcement type zero point stopper position detection operation when the stopper position detection operation executing condition is satisfied, and the at least one of the flasher semiconductor switch and the buzzer semiconductor switch turns on and off to blink the flasher or to output the sound from the buzzer. The stopper position detection operation executing element executes the voltage detection type zero point stopper position detection operation when the stopper position detection operation executing condition is satisfied, and the at least one of the flasher semiconductor switch and the buzzer semiconductor switch does not turn on and off to blink the flasher or to output the sound from the buzzer.

In the above system, when there is a low possibility that the induction voltage of the field winding is influenced by the induction noise generated by the at least one of the flasher semiconductor switch and the buzzer semiconductor switch turns on and off to blink the flasher or to output the sound from the buzzer, the voltage detection type zero point stopper position detection operation is performed. Then, the electric angle corresponding to the stopper position detected in the voltage detection type zero point stopper position detection operation is set as the zero point. When there is a high possibility that the induction voltage of the field winding is influenced by the induction noise generated by the at least one of the flasher semiconductor switch and the buzzer semiconductor switch turns on and off to blink the flasher or to output the sound from the buzzer, the zero point return enforcement type zero point stopper position detection operation is performed. Then, the zero point in the zero point return enforcement type zero point stopper position detection operation is set. Thus, the user pays attention to the blink of the flasher or the output of the sound, the user does not feel strangeness even if the vibration and abnormal noise of the pointer are generated. Thus, the system is integrated, and the indication of the vehicle speed is improved, and further, the strange feeling of the user is reduced.

Alternatively, the zero point setting element may not set the zero point to be the electric angle corresponding to the stopper position, which is detected in the voltage detection type zero point stopper position detection operation, and the driving control unit further executes the zero point return enforcement type zero point stopper position detection operation after the voltage detection type zero point stopper position detection operation when the at least one of the flasher semiconductor switch and the buzzer semiconductor switch turns on and off to blink the flasher or to output the sound from the buzzer while the stopper position detection operation executing element executes the voltage detection type zero point stopper position detection operation. Thus, even if the at least one of the flasher semiconductor switch and the buzzer semiconductor switch turns on and off while the voltage detection type zero point stopper position detection operation is performed, the indication of the vehicle speed is improved, and further, the strange feeling of the user is reduced. Further, the zero point return enforcement type zero point stopper position detection operation is performed only when the at least one of the flasher semiconductor switch and the buzzer semiconductor switch turns on and off during such a comparatively short period, in which the voltage detection type zero point stopper position detection operation is performed. The zero point return enforcement type zero point stopper position detection operation is not performed even when the at least one of the flasher semiconductor switch and the buzzer semiconductor switch turns on and off during a period, in which the pointer moving away operation is performed. Thus, the period, in which the pointer moving away operation is performed, is effectively utilized. Alternatively, the driving control unit may further execute the zero point return enforcement type zero point stopper position detection operation just after the at least one of the flasher semiconductor switch and the buzzer semiconductor switch turns on and off to blink the flasher while the stopper position detection operation executing element executes the voltage detection type zero point stopper position detection operation.

Alternatively, at least one of the flasher semiconductor switch and the buzzer semiconductor switch and the field winding of the step motor may be disposed on a same substrate. Alternatively, the driving control unit and at least one of the flasher control unit and the buzzer control unit may be provided by a same controller.

According to a third aspect of the present disclosure, a meter system for a vehicle includes: an indicator including a pointer, a step motor, a stopper mechanism and a driving control unit; and a flasher function unit including a flasher semiconductor switch, a flasher and a flasher control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element controls the driving signal to rotate the pointer toward the zero point returning direction when a predetermined stopper position detection operation executing condition is satisfied, detects an inductive voltage generated in the field winding of the step motor, and determines based on the inductive voltage whether the pointer stops at the stopper position. The zero point setting element sets the zero point to be an electric angle corresponding to the stopper position, which is detected in the stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The flasher semiconductor switch is disposed adjacent to the field winding. The stopper position detection operation is not executed when the flasher semiconductor switch turns on and off.

Thus, the stopper position is detected by the stopper position detection operation without being affected by the inductive noise generated by the on and off operation of the flasher semiconductor switch. Thus, the driving control unit sets the zero point to be the electric angle corresponding to the stopper position, which has a low possibility to be affected by the inductive noise. Thus, the possibility that an inaccurate zero point becomes the standard of the driving signal is low. The system indicates the vehicle condition value accurately. Accordingly, the system is integrated, and further, indicates the accurate vehicle condition value.

Alternatively, the flasher control unit may not control the flasher semiconductor switch to turn on and off when the driving control unit executes the stopper position detection operation.

Alternatively, the driving control unit may not execute the stopper position detection operation when the flasher control unit controls the flasher semiconductor switch to turn on and off.

Alternatively, the flasher semiconductor switch and the field winding of the step motor may be disposed on a same substrate. Thus, the system is much integrated.

Alternatively, the driving control unit and the flasher control unit may be provided by a same controller. Thus, the system is much integrated. IN this case, the flasher semiconductor switch and the field winding of the step motor may be disposed on a same substrate.

Alternatively, the flasher control unit may control the flasher semiconductor switch to turn on and off after the driving control unit completes the stopper position detection operation. Further, the flasher control unit may not determine whether the flasher driving condition is satisfied when the driving control unit executes the stopper position detection operation. Alternatively, although the flasher control unit determines whether the flasher driving condition is satisfied when the driving control unit executes the stopper position detection operation, the flasher control unit may control the flasher semiconductor switch to turn on and off after the driving control unit completes the stopper position detection operation even if the flasher control unit determines that the flasher driving condition is satisfied.

Alternatively, the stopper position detection operation executing condition may include a high necessity executing condition having high necessity for executing the stopper position detection operation and a confirmation executing condition having low necessity for executing the stopper position detection operation. The driving control unit executes the stopper position detection operation without depending on the flasher driving condition when the driving control unit determines that the high necessity executing condition is satisfied. The flasher control unit does not control the flasher semiconductor switch to turn on and off while the driving control unit executes the stopper position detection operation. Specifically, the stopper position detection operation is executed with priority. The flasher control unit controls the flasher semiconductor switch to turn on and off when the driving control unit determines that both of the high necessity executing condition and the confirmation executing condition are satisfied simultaneously. The driving control unit does not execute the stopper position detection operation while the flasher control unit controls the flasher semiconductor switch to turn on and off. Specifically, the on and off operation of the flasher semiconductor switch is executed with high priority. Thus, even when the high necessity executing condition is satisfied, and/or when the confirmation executing condition is satisfied, the stopper position detection operation and the on and off operation of the flasher semiconductor switch are not executed at the same time. Accordingly, the stopper position detected by the stopper position detection operation is not affected by the inductive noise generated by the on and off operation of the flasher semiconductor switch. Thus, the electric angle corresponding to the stopper position is set to be the zero point, the stopper position having low possibility of the influence of the inductive noise. Thus, the possibility that an inaccurate zero point becomes the standard of the driving signal is low. The system indicates the vehicle condition value accurately. Accordingly, the system is integrated, and further, indicates the accurate vehicle condition value. Further, the user does not feel strangeness.

Alternatively, the high necessity executing condition may be satisfied when the driving control unit is activated under a condition that a supply voltage supplied to the driving control unit is lower than a predetermined threshold voltage. In this case, when the activation is the recovery from the low voltage reset process, the stopper position detection operation is executed in priority to the on and off operation of the flash semiconductor switch.

Alternatively, the confirmation executing condition may be satisfied when the driving control unit is activated under a condition that a supply voltage supplied to the driving control unit is equal to or higher than a predetermined threshold voltage. In this case, when the system is activated normally, the on and off operation of the flash semiconductor switch is executed in priority to the stopper position detection operation.

Alternatively, the flasher driving condition may include a misjudge protection flasher driving condition and a low necessity flasher driving condition. The misjudge protection flasher driving condition has high necessity for controlling the flasher semiconductor switch to turn on and off rapidly so that the meter system protects the user from misjudging malfunction of the meter system. The low necessity flasher driving condition has low necessity for controlling the flasher semiconductor switch to turn on and off rapidly. The flasher control unit controls the flasher semiconductor switch to turn on and off without depending on the stopper position detection operation executing condition when the flasher control unit determines that the misjudge protection flasher driving condition is satisfied. The driving control unit does not execute the stopper position detection operation while the flasher control unit controls the flasher semiconductor switch to turn on and off. Specifically, the on and off operation of the flasher semiconductor switch is performed in priority. When the low necessity flasher driving condition is satisfied, the flasher control unit does not control the flasher semiconductor switch to turn on and off while the driving control unit executes the stopper position detection operation. Specifically, the stopper position detection operation is performed in priority. When the flasher control unit determines that the flasher driving condition is satisfied, the on and off operation of the flasher semiconductor switch is executed in priority to the stopper position detection operation. Thus, the delay of the blinking of the flasher is reduced. Thus, the misjudge of the user that the user misjudges the flasher malfunctions is reduced. Even when the misjudge protection flasher driving condition is satisfied, or even when the low necessity flasher driving condition is satisfied, the stopper position detection operation and the on and off operation of the flasher semiconductor switch are not executed simultaneously. Accordingly, the stopper position detected by the stopper position detection operation is not affected by the inductive noise generated by the on and off operation of the switch. Thus, the electric angle corresponding to the stopper position is set to be the zero point, the stopper position having low possibility that the stopper position is affected by the inductive noise. Accordingly, the possibility that the inaccurate zero point becomes the standard of the driving signal is low. The system indicates the vehicle condition value accurately. Accordingly, the system is integrated, and further, indicates the accurate vehicle condition value. Furthermore, the occurrence of the misjudge of the user is reduced.

Alternatively, the stopper position detection operation executing condition may include a high necessity executing condition having high necessity for executing the stopper position detection operation rapidly and a confirmation executing condition having low necessity for executing the stopper position detection operation rapidly. The driving control unit executes the stopper position detection operation when both of the high necessity executing condition and the low necessity flasher driving condition are satisfied simultaneously. The flasher control unit does not control the flasher semiconductor switch to turn on and off while the driving control unit executes the stopper position detection operation. The flasher control unit controls the flasher semiconductor switch to turn on and off when both of the low necessity flasher driving condition and the confirmation executing condition are simultaneously satisfied. The driving control unit does not execute the stopper position detection operation while the flasher control unit controls the flasher semiconductor switch to turn on and off. In this case, when the system is activated from the low voltage reset state, the stopper position detection operation is executed in priority to the on and off operation of the switch. Further, when the system is activated from the normal state, the on and off operation of the switch is executed in priority to the stopper position detection operation. Here, the high necessity stopper position detection operation executing condition is satisfied when the system is activated from the low voltage reset state since the supply voltage increases after the driving control unit stops operating because the supply voltage to the driving control unit is reduced. Specifically, the high necessity stopper position detection operation executing condition is such that the driving control unit is activated under a condition that the supply voltage to the driving control unit is lower than the threshold value. The confirmation stopper position detection operation executing condition is satisfied when the system is activated from the normal state; Specifically, the confirmation stopper position detection operation executing condition is such that the driving control unit is activated under a condition that the supply voltage to the driving control unit is equal to or larger than the threshold value.

Alternatively, the misjudge protection flasher driving condition may include a condition whether an instruction signal transmitted from a mobile device wirelessly is input into the flasher control unit. The mobile device remote-controls the vehicle, on which the meter system is mounted. Thus, the automatic response function of the vehicle is executed in priority to the stopper position detection operation.

Alternatively, the misjudge protection flasher driving condition may include a condition whether a combination lever is set to be a turn lamp blinking position. The combination lever is disposed in the vehicle, on which the meter system is mounted. Thus, the turning operation is executed in priority to the stopper position detection operation. Specifically, the blinking of the turn lamp can be performed within one minute after the user manually operation the turn lamp.

Alternatively, the low necessity flasher driving condition may include a condition whether a hazard lamp switch is set to be a hazard blinking position. The hazard lamp switch is disposed in the vehicle, on which the meter system is mounted. Thus, the hazard operation is executed in priority to the stopper position detection operation.

According to a fourth aspect of the present disclosure, a meter system for a vehicle includes: an indicator including a pointer, a step motor, a stopper mechanism and a driving control unit; and a flasher function unit including a flasher semiconductor switch, a flasher and a flasher control unit, a buzzer semiconductor switch, a buzzer and a buzzer control unit. The pointer indicates a vehicle condition value according to a rotation position of the pointer. The pointer is rotatable along with a display surface of a scale plate for displaying the vehicle condition value. The step motor rotates the pointer when a driving signal is applied to a field winding of the step motor. The driving signal is alternately oscillated according to an electric angle. The stopper mechanism stops rotating the pointer at a stopper position, which is disposed within a predetermined range from a zero point position toward a zero point returning direction, when the pointer rotates toward the zero point returning direction. The zero point position shows a zero point of the vehicle condition value. The driving control unit has a stopper position detection operation executing element, a zero point setting element and an applying element. The stopper position detection operation executing element controls the driving signal to rotate the pointer toward the zero point returning direction when a predetermined stopper position detection operation executing condition is satisfied, detects an inductive voltage generated in the field winding of the step motor, and determines based on the inductive voltage whether the pointer stops at the stopper position. The zero point setting element sets the zero point to be an electric angle corresponding to the stopper position, which is detected in the stopper position detection operation. The applying element applies the driving signal to the field winding, the driving signal having the zero point set by the zero point setting element as a standard. The flasher blinks when the flasher semiconductor switch turns on and off. The flasher control unit determines based on a manual operation of an user whether a predetermined flasher driving condition is satisfied. The flasher control unit controls the flasher semiconductor switch to turn on and off so that the flasher blinks according to the flasher driving condition when the flasher control unit determines that the predetermined flasher driving condition is satisfied. The buzzer outputs sound when the buzzer semiconductor switch turns on and off. The buzzer control unit controls the buzzer semiconductor switch to turn on and off in association with the flasher semiconductor switch. At least one of the flasher semiconductor switch and the buzzer semiconductor switch is disposed adjacent to the field winding. The stopper position detection operation is not executed when the at least one of the flasher semiconductor switch and the buzzer semiconductor switch turns on and off.

Thus, the stopper position is detected by the stopper position detection operation without being affected by the inductive noise generated by the on and off operation of the at least one of the flasher semiconductor switch and the buzzer semiconductor switch, which is disposed adjacent to the field winding. Thus, the driving control unit sets the zero point to be the electric angle corresponding to the stopper position, which has a low possibility to be affected by the inductive noise. Thus, the possibility that an inaccurate zero point becomes the standard of the driving signal is low. The system indicates the vehicle condition value accurately. Accordingly, the system is integrated, and further, indicates the accurate vehicle condition value.

Alternatively, the at least one of the flasher semiconductor switch and the buzzer semiconductor switch may not controlled to turn on and off when the driving control unit executes the stopper position detection operation.

Alternatively, the driving control unit may not execute the stopper position detection operation when the at least one of the flasher semiconductor switch and the buzzer semiconductor switch is controlled to turn on and off.

Alternatively, at least one of the flasher semiconductor switch and the buzzer semiconductor switch and the field winding of the step motor may be disposed on a same substrate. Thus, the system is much integrated.

Alternatively, the driving control unit and at least one of the flasher control unit and the buzzer control unit may be provided by a same controller. Thus, the system is much integrated. In this case, at least one of the flasher semiconductor switch and the buzzer semiconductor switch and the field winding of the step motor may be disposed on a same substrate.

Alternatively, the at least one of the flasher semiconductor switch and the buzzer semiconductor switch may be controlled to turn on and off after the driving control unit completes the stopper position detection operation. Further, the flasher control unit may not determine whether the flasher driving condition is satisfied when the driving control unit executes the stopper position detection operation. Alternatively, although the flasher control unit determines whether the flasher driving condition is satisfied when the driving control unit executes the stopper position detection operation, the at least one of the flasher semiconductor switch and the buzzer semiconductor switch may be controlled to turn on and off after the driving control unit completes the stopper position detection operation even if the flasher control unit determines that the flasher driving condition is satisfied.

Alternatively, the stopper position detection operation executing condition may include a high necessity executing condition having high necessity for executing the stopper position detection operation and a confirmation executing condition having low necessity for executing the stopper position detection operation. The driving control unit executes the stopper position detection operation without depending on the flasher driving condition when the driving control unit determines that the high necessity executing condition is satisfied. The at least one of the flasher semiconductor switch and the buzzer semiconductor switch is not controlled to turn on and off while the driving control unit executes the stopper position detection operation. Specifically, the stopper position detection operation is executed with priority. The flasher control unit controls the flasher semiconductor switch to turn on and off, and the buzzer control unit controls the buzzer semiconductor switch to turn on and off when the driving control unit determines that both of the high necessity executing condition and the confirmation executing condition are satisfied simultaneously. The driving control unit does not execute the stopper position detection operation while at least one of the flasher semiconductor switch and the buzzer semiconductor switch is controlled to turn on and off. Specifically, the on and off operation of the at least one of the flasher semiconductor switch and the buzzer semiconductor switch is executed with priority. Thus, even when the high necessity executing condition is satisfied, and/or when the confirmation executing condition is satisfied, the stopper position detection operation and the on and off operation of the flasher semiconductor switch are not executed at the same time. Accordingly, the stopper position detected by the stopper position detection operation is not affected by the inductive noise generated by the on and off operation of the at least one of the flasher semiconductor switch and the buzzer semiconductor switch. Thus, the electric angle corresponding to the stopper position is set to be the zero point, the stopper position having low possibility of the influence of the inductive noise. Thus, the possibility that an inaccurate zero point becomes the standard of the driving signal is low. The system indicates the vehicle condition value accurately. Accordingly, the system is integrated, and further, indicates the accurate vehicle condition value. Further, the user does not feel strangeness.

Alternatively, the high necessity executing condition may be satisfied when the driving control unit is activated under a condition that a supply voltage supplied to the driving control unit is lower than a predetermined threshold voltage. In this case, when the activation is the recovery from the low voltage reset process, the stopper position detection operation is executed in priority to the on and off operation of the flash semiconductor switch.

Alternatively, the confirmation executing condition may be satisfied when the driving control unit is activated under a condition that a supply voltage supplied to the driving control unit is equal to or higher than a predetermined threshold voltage. In this case, when the system is activated normally, the on and off operation of the flash semiconductor switch is executed in priority to the stopper position detection operation.

Alternatively, the flasher driving condition may include a misjudge protection flasher driving condition and a low necessity flasher driving condition. The misjudge protection flasher driving condition has high necessity for controlling the flasher semiconductor switch and the buzzer semiconductor switch to turn on and off rapidly so that the meter system protects the user from misjudging malfunction of the meter system. The low necessity flasher driving condition has low necessity for controlling the flasher semiconductor switch and the buzzer semiconductor switch to turn on and off rapidly. The flasher control unit controls the flasher semiconductor switch to turn on and off and the buzzer control unit controls the buzzer semiconductor switch to turn on and off without depending on the stopper position detection operation executing condition when the flasher control unit determines that the misjudge protection flasher driving condition is satisfied. The driving control unit does not execute the stopper position detection operation while the at least one of the flasher semiconductor switch and the buzzer semiconductor switch is controlled to turn on and off. Thus, the on and off operation is executed in priority to the stopper position detection operation. When the low necessity flasher driving condition is satisfied, the at least one of the flasher semiconductor switch and the buzzer semiconductor switch is not controlled to turn on and off while the driving control unit executes the stopper position detection operation. Thus, the stopper position detection operation is executed in priority to the on and off operation. When the flasher control unit determines that the misjudge protection flasher driving condition is satisfied, the on and off operation of the flasher semiconductor switch is executed in priority to the stopper position detection operation. Thus, the delay of the blinking of the flasher is reduced. Thus, the misjudge of the user that the user misjudges the flasher malfunctions is reduced. Even when the misjudge protection flasher driving condition is satisfied, or even when the low necessity flasher driving condition is satisfied, the stopper position detection operation and the on and off operation of the flasher semiconductor switch are not executed simultaneously. Accordingly, the stopper position detected by the stopper position detection operation is not affected by the inductive noise generated by the on and off operation of the switch. Thus, the electric angle corresponding to the stopper position is set to be the zero point, the stopper position having low possibility that the stopper position is affected by the inductive noise. Accordingly, the possibility that the inaccurate zero point becomes the standard of the driving signal is low. The system indicates the vehicle condition value accurately. Accordingly, the system is integrated, and further, indicates the accurate vehicle condition value. Furthermore, the occurrence of the misjudge of the user is reduced.

Alternatively, the stopper position detection operation executing condition may include a high necessity executing condition having high necessity for executing the stopper position detection operation rapidly and a confirmation executing condition having low necessity for executing the stopper position detection operation rapidly. The driving control unit executes the stopper position detection operation when both of the high necessity executing condition and the low necessity flasher driving condition are satisfied simultaneously. The at least one of the flasher semiconductor switch and the buzzer semiconductor switch is not controlled to turn on and off while the driving control unit executes the stopper position detection operation. The flasher control unit controls the flasher semiconductor switch to turn on and off and the buzzer control unit controls the buzzer semiconductor switch to turn on and off when both of the low necessity flasher driving condition and the confirmation executing condition are simultaneously satisfied. The driving control unit does not execute the stopper position detection operation while the at least one of the flasher semiconductor switch and the buzzer semiconductor switch is controlled to turn on and off. In this case, when the system is activated from the low voltage, reset state, the stopper position detection operation is executed in priority to the on and off operation of the switch. Further, when the system is activated from the normal state, the on and off operation of the switch is executed in priority to the stopper position detection operation.

Alternatively, the misjudge protection flasher driving condition may include a condition whether an instruction signal transmitted from a mobile device wirelessly is input into the flasher control unit. The mobile device remote-controls the vehicle, on which the meter system is mounted. Thus, the automatic response function of the vehicle is executed in priority to the stopper position detection operation.

Alternatively, the misjudge protection flasher driving condition may include a condition whether a combination lever is set to be a turn lamp blinking position. The combination lever is disposed in the vehicle, on which the meter system is mounted. Thus, the turning operation is executed in priority to the stopper position detection operation. Specifically, the blinking of the turn lamp can be performed within one minute after the user manually operation the turn lamp.

Alternatively, the low necessity flasher driving condition may include a condition whether a hazard lamp switch is set to be a hazard blinking position. The hazard lamp switch is disposed in the vehicle, on which the meter system is mounted. Thus, the hazard operation is executed in priority to the stopper position detection operation.

According to a fifth aspect of the present disclosure, a meter system for a vehicle includes: a pointer for indicating a vehicle condition value according to a rotation position of the pointer, wherein the pointer is rotatable along with a display surface of a scale plate for displaying the vehicle condition value; a step motor for rotating the pointer, wherein the step motor includes a stator and a magnet rotor, the stator has a field winding for generating a first magnetic field when a driving signal is applied to the field winding in accordance with the vehicle condition value, and the magnet rotor is supported coaxially with the stator and is rotatable according to the first magnetic field; a stopper mechanism for stopping rotating the pointer at a stopper position, which is disposed within a predetermined range from a zero point position toward a zero point returning direction, when the pointer rotates toward the zero point returning direction, wherein the zero point position shows a zero point of the vehicle condition value; a detection element for detecting an inductive voltage at predetermined detection intervals, wherein the inductive voltage is generated in the field winding; a driving control unit for controlling the driving signal with using the zero point as a standard, wherein the driving control unit executes a zero point stopper position detection operation for detecting an electric angle of the pointer based on the inductive voltage when the pointer stops at the, stopper position, and the driving control unit sets the zero point to be equal to the electric angle; and a noise generating element for generating a second magnetic field during a generation period when a noise generating signal is input into the noise generating element, wherein the generation period has a starting time, at which the noise generating signal is input into the noise generating element. The detection time interval is longer than the generation period, and the driving control unit controls the noise generating signal to input into the noise generating element in such a manner that the generation period is disposed in the detection time interval.

In the above system, the driving control unit controls the driving signal to be applied to the field winding according to the vehicle condition value with using the zero point as a standard. When the driving signal is controlled with using the zero point as the standard, the pointer rotates to a certain position, which corresponds to the vehicle condition value. The driving control unit executes the zero point stopper position detection operation for detecting the electric angle of the pointer, which stops at the stopper position, with using the inductive voltage. The driving control unit sets the zero point to be equal to the electric angle. The driving control unit detects the inductive voltage at detection time intervals. When the noise generating element generates an inductive noise, the inductive voltage may be affected by the inductive noise so that the inductive voltage is not proper. Thus, the system may not detect accurately that the pointer stops at the stopper position. However, the driving control unit inputs the noise generating signal into the noise generating element so that the generation period of the noise is disposed in the detection interval, in which the detection is not performed. Accordingly, even when the noise generating signal is input from the external element, the driving control unit does not operate the noise generating element immediately. Instead, the driving control unit operates the noise generating element to satisfy a predetermined condition. Since the generation period of the inductive noise is shorter than the detection interval, the control unit controls the generation period in the detection interval, in which the detection is not performed. Thus, the detection time is not disposed in the generation period. For example, when the noise generating signal is input into the noise generating element just after the detection element detects the inductive voltage, the generation period ends before the next detection time. Thus, the time difference between the end of the generation period and the next detection time exists. Thus, the inductive noise is not generated at the detection time. Thus, the inductive voltage is detected without influence of the inductive noise. The zero point stopper position detection operation is executed with using the inductive voltage, which is not affected by the noise. Accordingly, the correct zero point becomes the standard of the driving signal. The vehicle condition value is accurately indicated.

Alternatively, the noise, generating element may generate the second magnetic field at predetermined generation time intervals when the noise generating signal is input into the noise generating element, and the driving control unit controls a length of the generation time interval in such a manner that the generation period is disposed in the detection time interval. In this case, even when the noise generating element is periodically operated, by shifting a period temporally, the zero point stopper position detection operation is executed with using the inductive voltage, which is not affected by the noise.

Alternatively, the driving control unit may input the noise generating signal into the noise generating element in such a manner that the generation period is disposed in the detection time interval, and the detection time interval starts from a detection time, at which the detection element detects the inductive voltage for the first time after the noise generating signal is input into the driving control unit from an external element.

Alternatively, the driving control unit may determine at predetermined determination time intervals whether the noise generating signal is input into the noise generating element from an external element. The determination time interval is shorter than the detection time interval, and the driving control unit inputs the noise generating signal into the noise generating element in such a manner that the generation period is disposed in the detection time interval when the driving control unit determines that the noise generating signal is input into the driving control unit.

Alternatively, the noise generating element may include a semiconductor switch, and an operation unit. The operation unit functions and stops functioning according to a switching operation of the semiconductor switch. The semiconductor switch turns on and off when the noise generating signal is input into the noise generating element, and the semiconductor switch generates the second magnetic field when the semiconductor switch turns on and off.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A meter system for a vehicle comprising:
an indicator including a pointer, a step motor, a stopper mechanism and a driving control unit; and
a flasher function unit including a flasher semiconductor switch, a flasher and a flasher control unit,
wherein the pointer indicates a vehicle condition value according to a rotation position of the pointer,
wherein the pointer is rotatable along with a display surface of a scale plate for displaying the vehicle condition value,
wherein the step motor rotates the pointer, when a driving signal is applied to a field winding of the step motor,
wherein the driving signal is alternately oscillated according to an electric angle,
wherein the stopper mechanism stops rotating the pointer at a stopper position, which is disposed within a predetermined range from a zero point position toward a zero point returning direction, when the pointer rotates toward the zero point returning direction,
wherein the zero point position shows a zero point of the vehicle condition value,
wherein the driving control unit has a stopper position detection operation executing element, a zero point setting element and an applying element,
wherein the stopper position detection operation executing element executes a pointer moving away operation for controlling the driving signal to rotate the pointer toward a moving away direction opposite to the zero point returning direction when a predetermined stopper position detection operation executing condition is satisfied,
wherein the stopper position detection operation executing element executes further executes a voltage detection type zero point stopper position detection operation after the stopper position detection operation executing element executes the pointer moving away operation, wherein the voltage detection type zero point stopper position detection operation provides to control the driving signal for rotating the pointer toward the zero point returning direction, and provides to detect an inductive voltage generated in the field winding, wherein the voltage detection type zero point stopper position detection operation provides to determine based on the induction voltage whether the pointer stops at the stopper position, wherein the zero point setting element sets the zero point to be an electric angle corresponding to the stopper position, which is detected in the voltage detection type zero point stopper position detection operation, wherein the applying element applies the driving signal to the field winding, the driving signal having the zero point set by the zero point setting element as a standard, wherein the flasher blinks when the flasher semiconductor switch turns on and off, wherein the flasher control unit determines based on a manual operation of an user whether a predetermined flasher driving condition is satisfied, wherein the flasher control unit controls the flasher semiconductor switch to turn on and off so that the flasher blinks according to the flasher driving condition when the flasher control unit determines that the predetermined flasher driving condition is satisfied, wherein the flasher semiconductor switch is disposed adjacent to the field winding, wherein the stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position, wherein the stopper position detection operation executing element executes the zero point return enforcement type zero point stopper position detection operation when the stopper position detection operation executing condition is satisfied, and the flasher semiconductor switch turns on and off to blink the flasher, and wherein the stopper position detection operation executing element executes the voltage detection type zero point stopper position detection operation when the stopper position detection operation executing condition is satisfied, and the flasher semiconductor switch does not turn on and off to blink the flasher.

2. The meter system according to claim 1,
wherein the zero point setting element does not set the zero point to be the electric angle corresponding to the stopper position, which is detected in the voltage detection type zero point stopper position detection operation, and the driving control unit further executes the zero point return enforcement type zero point stopper position detection operation after the voltage detection type zero point stopper position detection operation when the flasher semiconductor switch turns on and off to blink the flasher while the stopper position detection operation executing element executes the voltage detection type zero point stopper position detection operation.

3. The meter system according to claim 1,
wherein the flasher semiconductor switch and the field winding of the step motor are disposed on a same substrate.

4. The meter system according to claim 1,
wherein the driving control unit and the flasher control unit are provided by a same controller.

5. A meter system for a vehicle comprising:
an indicator including a pointer, a step motor, a stopper mechanism and a driving control unit; and
a flasher function unit including a flasher semiconductor switch, a flasher, a flasher control unit, a buzzer semiconductor switch, a buzzer and a buzzer control unit, wherein the pointer indicates a vehicle condition value according to a rotation position of the pointer, wherein the pointer is rotatable along with a display surface of a scale plate for displaying the vehicle condition value, wherein the step motor rotates the pointer when a driving signal is applied to a field winding of the step motor, wherein the driving signal is alternately oscillated according to an electric angle, wherein the stopper mechanism stops rotating the pointer at a stopper position, which is disposed within a predetermined range from a zero point position toward a zero point returning direction, when the pointer rotates toward the zero point returning direction, wherein the zero point position shows a zero point of the vehicle condition value, wherein the driving control unit has a stopper position detection operation executing element, a zero point setting element and an applying element, wherein the stopper position detection operation executing element executes a pointer moving away operation for controlling the driving signal to rotate the pointer toward a moving away direction opposite to the zero point returning direction when a predetermined stopper position detection operation executing condition is satisfied, wherein the stopper position detection operation executing element executes further executes a voltage detection type zero point stopper position detection operation after the stopper position detection operation executing element executes the pointer moving away operation, wherein the voltage detection type zero point stopper position detection operation provides to control the driving signal for rotating the pointer toward the zero point returning direction, and provides to detect an inductive voltage generated in the field winding, wherein the voltage detection type zero point stopper position detection operation provides to determine based on the induction voltage whether the pointer stops at the stopper position, wherein the zero point setting element sets the zero point to be an electric angle corresponding to the stopper position, which is detected in the voltage detection type zero point stopper position detection operation, wherein the applying element applies the driving signal to the field winding, the driving signal having the zero point set by the zero point setting element as a standard, wherein the flasher blinks when the flasher semiconductor switch turns on and off, wherein the flasher control unit determines based on a manual operation of an user whether a predetermined flasher driving condition is satisfied, wherein the flasher control unit controls the flasher semiconductor switch to turn on and off so that the flasher blinks according to the flasher driving condition when the flasher control unit determines that the predetermined flasher driving condition is satisfied, wherein the buzzer outputs sound when the buzzer semiconductor switch turns on and off, wherein the buzzer control unit controls the buzzer semiconductor switch to turn on and off in association with the flasher semiconductor switch, wherein at least one of the flasher semiconductor switch and the buzzer semiconductor switch is disposed adjacent to the field winding, wherein the stopper position detection operation executing element further executes a zero point return enforcement type zero point stopper position detection operation, which provides to control the driving signal for rotating the pointer by a predetermined zero point returning angle toward the zero point returning direction so that it is determined that the pointer stops rotating at the stopper position, wherein the stopper position detection operation executing element executes the zero point return enforcement type zero point stopper position detection operation when the stopper position detection operation executing condition is satisfied, and the at least one of the flasher semiconductor switch and the buzzer semiconductor switch turns on and off to blink the flasher or to output the sound from the buzzer, and wherein the stopper position detection operation executing element executes the voltage detection type zero point stopper position detection operation when the stopper position detection operation executing condition is satisfied, and the at least one of the flasher semiconductor switch and the buzzer semiconductor switch does not turn on and off to blink the flasher or to output the sound from the buzzer.

6. The meter system according to claim 5, wherein the zero point setting element does not set the zero point to be the electric angle corresponding to the stopper position, which is detected in the voltage detection type zero point stopper position detection operation, and the driving control unit further executes the zero point return enforcement type zero point stopper position detection operation after the voltage detection type zero point stopper position detection operation when the at least one of the flasher semiconductor switch and the buzzer semiconductor switch turns on and off to blink the flasher or to output the sound from the buzzer while the stopper position detection operation executing element executes the voltage detection type zero point stopper position detection operation.

7. The meter system according to claim 5, wherein at least one of the flasher semiconductor switch and the buzzer semiconductor switch and the field winding of the step motor are disposed on a same substrate.

8. The meter system according to claim 5, wherein the driving control unit and at least one of the flasher control unit and the buzzer control unit are provided by a same controller.

9. A meter system for a vehicle comprising:

an indicator including a pointer, a step motor, a stopper mechanism and a driving control unit; and a flasher function unit including a flasher semiconductor switch, a flasher and a flasher control unit, wherein the pointer indicates a vehicle condition value according to a rotation position of the pointer, wherein the pointer is rotatable along with a display surface of a scale plate for displaying the vehicle condition value, wherein the step motor rotates the pointer when a driving signal is applied to a field winding of the step motor, wherein the driving signal is alternately oscillated according to an electric angle, wherein the stopper mechanism stops rotating the pointer at a stopper position, which is disposed within a predetermined range from a zero point position toward a zero point returning direction, when the pointer rotates toward the zero point returning direction, wherein the zero point position shows a zero point of the vehicle condition value, wherein the driving control unit has a stopper position detection operation executing element, a zero point setting element and an applying element, wherein the stopper position detection operation executing element executes a stopper position detection operation when a predetermined stopper position detection operation executing condition is satisfied, wherein the stopper position detection operation includes a step of controlling the driving signal to rotate the pointer toward the zero point returning direction, a step of detecting an inductive voltage generated in the field winding of the step motor, and a step of determining based on the inductive voltage whether the pointer stops at the stopper position, wherein the zero point setting element sets the zero point to be an electric angle corresponding to the stopper position, which is detected in the stopper position detection operation, wherein the applying element applies the driving signal to the field winding, the driving signal having the zero point set by the zero point setting element as a standard, wherein the flasher blinks when the flasher semiconductor switch turns on and off, wherein the flasher control unit determines based on a manual operation of an user whether a predetermined flasher driving condition is satisfied, wherein the flasher control unit controls the flasher semiconductor switch to turn on and off so that the flasher blinks according to the flasher driving condition when the flasher control unit determines that the predetermined flasher driving condition is satisfied, wherein the flasher semiconductor switch is disposed adjacent to the field winding, and wherein the stopper position detection operation is not executed when the flasher semiconductor switch turns on and off.

10. The meter system according to claim 9, wherein the flasher control unit does not control the flasher semiconductor switch to turn on and off when the driving control unit executes the stopper position detection operation.

11. The meter system according to claim 10, wherein the flasher control unit controls the flasher semiconductor switch to turn on and off after the driving control unit completes the stopper position detection operation.

12. The meter system according to claim 9, wherein the driving control unit does not executes the stopper position detection operation when the flasher control unit controls the flasher semiconductor switch to turn on and off.

13. The meter system according to claim 9, wherein the flasher semiconductor switch and the field winding of the step motor are disposed on a same substrate.

14. The meter system according to claim 9, wherein the driving control unit and the flasher control unit are provided by a same controller.

15. The meter system according to claim 9,
wherein the stopper position detection operation executing condition includes a high necessity executing condition having high necessity for executing the stopper position detection operation and a confirmation executing condition having low necessity for executing the stopper position detection operation,
wherein the driving control unit executes the stopper position detection operation without depending on the flasher driving condition when the driving control unit determines that the high necessity executing condition is satisfied,
wherein the flasher control unit does not control the flasher semiconductor switch to turn on and off while the driving control unit executes the stopper position detection operation,
wherein the flasher control unit controls the flasher semiconductor switch to turn on and off when the driving control unit determines that both of the high necessity executing condition and the confirmation executing condition are satisfied simultaneously, and
wherein the driving control unit does not execute the stopper position detection operation while the flasher control unit controls the flasher semiconductor switch to turn on and off.

16. The meter system according to claim 15,
wherein the high necessity executing condition is satisfied when the driving control unit is activated under a condition that a supply voltage supplied to the driving control unit is lower than a predetermined threshold voltage.

17. The meter system according to claim 15,
wherein the confirmation executing condition is satisfied when the driving control unit is activated under a condition that a supply voltage supplied to the driving control unit is equal to or higher than a predetermined threshold voltage.

18. The meter system according to claim 9,
wherein the flasher driving condition includes a misjudge protection flasher driving condition and a low necessity flasher driving condition,
wherein the misjudge protection flasher driving condition has high necessity for controlling the flasher semiconductor switch to turn on and off rapidly so that the meter system protects the user from misjudging malfunction of the meter system,
wherein the low necessity flasher driving condition has low necessity for controlling the flasher semiconductor switch to turn on and off rapidly,
wherein the flasher control unit controls the flasher semiconductor switch to turn on and off without depending on the stopper position detection operation executing condition when the flasher control unit determines that the misjudge protection flasher driving condition is satisfied,
wherein the driving control unit does not execute the stopper position detection operation while the flasher control unit controls the flasher semiconductor switch to turn on and off,
wherein, when the low necessity flasher driving condition is satisfied, the flasher control unit does not control the flasher semiconductor switch to turn on and off while the driving control unit executes the stopper position detection operation.

19. The meter system according to claim 18,
wherein the stopper position detection operation executing condition includes a high necessity executing condition having high necessity for executing the stopper position detection operation rapidly and a confirmation executing condition having low necessity for executing the stopper position detection operation rapidly,
wherein the driving control unit executes the stopper position detection operation when both of the high necessity executing condition and the low necessity flasher driving condition are satisfied simultaneously,
wherein the flasher control unit does not control the flasher semiconductor switch to turn on and off while the driving control unit executes the stopper position detection operation,
wherein the flasher control unit controls the flasher semiconductor switch to turn on and off when both of the low necessity flasher driving condition and the confirmation executing condition are simultaneously satisfied, and
wherein the driving control unit does not execute the stopper position detection operation while the flasher control unit controls the flasher semiconductor switch to turn on and off.

20. The meter system according to claim 18,
wherein the misjudge protection flasher driving condition includes a condition whether an instruction signal transmitted from a mobile device wirelessly is input into the flasher control unit, and
wherein the mobile device remote-controls the vehicle, on which the meter system is mounted.

21. The meter system according to claim 18,
wherein the misjudge protection flasher driving condition includes a condition whether a combination lever is set to be a turn lamp blinking position, and
wherein the combination lever is disposed in the vehicle, on which the meter system is mounted.

22. The meter system according to claim 18,
wherein the low necessity flasher driving condition includes a condition whether a hazard lamp switch is set to be a hazard blinking position, and
wherein the hazard lamp switch is disposed in the vehicle, on which the meter system is mounted.

23. A meter system for a vehicle comprising:
an indicator including a pointer, a step motor, a stopper mechanism and a driving control unit; and
a flasher function unit including a flasher semiconductor switch, a flasher and a flasher control unit, a buzzer semiconductor switch, a buzzer and a buzzer control unit,
wherein the pointer indicates a vehicle condition value according to a rotation position of the pointer,
wherein the pointer is rotatable along with a display surface of a scale plate for displaying the vehicle condition value,
wherein the step motor rotates the pointer when a driving signal is applied to a field winding of the step motor,
wherein the driving signal is alternately oscillated according to an electric angle,
wherein the stopper mechanism stops rotating the pointer at a stopper position, which is disposed within a predetermined range from a zero point position toward a zero point returning direction, when the pointer rotates toward the zero point returning direction,
wherein the zero point position shows a zero point of the vehicle condition value,
wherein the driving control unit has a stopper position detection operation executing element, a zero point setting element and an applying element,
wherein the stopper position detection operation executing element executes a stopper position detection operation when a predetermined stopper position detection operation executing condition is satisfied, wherein the stopper position detection operation includes a step of controlling the driving signal to rotate the pointer toward the zero point returning direction, a step of detecting an inductive voltage generated in the field winding of the step motor, and a step of determining based on the inductive voltage whether the pointer stops at the stopper position, wherein the zero point setting element sets the zero point to be an electric angle corresponding to the stopper position, which is detected in the stopper position detection operation, wherein the applying element applies the, driving signal to the field winding, the driving signal having the zero point set by the zero point setting element as a standard, wherein the flasher blinks when the flasher semiconductor switch turns on and off, wherein the flasher control unit determines based on a manual operation of an user whether a predetermined flasher driving condition is satisfied, wherein the flasher control unit controls the flasher semiconductor switch to turn on and off so that the flasher blinks according to the flasher driving condition when the flasher control unit determines that the predetermined flasher driving condition is satisfied, wherein the buzzer outputs sound when the buzzer semiconductor switch turns on and off, wherein the buzzer control unit controls the buzzer semiconductor switch to turn on and off in association with the flasher semiconductor switch, wherein at least one of the flasher semiconductor switch and the buzzer semiconductor switch is disposed adjacent to the field winding, and wherein the stopper position detection operation is not executed when the at least one of the flasher semiconductor switch and the buzzer semiconductor switch turns on and off.

24. The meter system according to claim 23,
wherein the at least one of the flasher semiconductor switch and the buzzer semiconductor switch is not controlled to turn on and off when the driving control unit executes the stopper position detection operation.

25. The meter system according to claim 24,
wherein the at least one of the flasher semiconductor switch and the buzzer semiconductor switch is controlled to turn on and off after the driving control unit completes the stopper position detection operation.

26. The meter system according to claim 23,
wherein the driving control unit does not execute the stopper position detection operation when the at least one of the flasher semiconductor switch and the buzzer semiconductor switch is controlled to turn on and off.

27. The meter system according to claim 23,
wherein at least one of the flasher semiconductor switch and the buzzer semiconductor switch and the field winding of the step motor are disposed on a same substrate.

28. The meter system according to claim 23,
wherein the driving control unit and at least one of the flasher control unit and the buzzer control unit are provided by a same controller.

29. The meter system according to claim 23,
wherein the stopper position detection operation executing condition includes a high necessity executing condition having high necessity for executing the stopper position detection operation and a confirmation executing condition having low necessity for executing the stopper position detection operation, wherein the driving control unit executes the stopper position detection operation without depending on the flasher driving condition when the driving control unit determines that the high necessity executing condition is satisfied, wherein the at least one of the flasher semiconductor switch and the buzzer semiconductor switch is not controlled to turn on and off while the driving control unit executes the stopper position detection operation, wherein the flasher control unit controls the flasher semiconductor switch to turn on and off, and the buzzer control unit controls the buzzer semiconductor switch to turn on and off when the driving control unit determines that both of the high necessity executing condition and the confirmation executing condition are satisfied simultaneously, and wherein the driving control unit does not execute the stopper position detection operation while at least one of the flasher semiconductor switch and the buzzer semiconductor switch is controlled to turn on and off.

30. The meter system according to claim 29,
wherein the high necessity executing condition is satisfied when the driving control unit is activated under a condition that a supply voltage supplied to the driving control unit is lower than a predetermined threshold voltage.

31. The meter system according to claim 29,
wherein the confirmation executing condition is satisfied when the driving control unit is activated under a condition that a supply voltage supplied to the driving control unit is equal to or higher than a predetermined threshold voltage.

32. The meter system according to claim 23,
wherein the flasher driving condition includes a misjudge protection flasher driving condition and a low necessity flasher driving condition, wherein the misjudge protection flasher driving condition has high necessity for controlling the flasher semiconductor switch and the buzzer semiconductor switch to turn on and off rapidly so that the meter system protects the user from misjudging malfunction of the meter system, wherein the low necessity flasher driving condition has low necessity for controlling the flasher semiconductor switch and the buzzer semiconductor switch to turn on and off rapidly, wherein the flasher control unit controls the flasher semiconductor switch to turn on and off and the buzzer control unit controls the buzzer semiconductor switch to turn on and off without depending on the stopper position detection operation executing condition when the flasher control unit determines that the misjudge protection flasher driving condition is satisfied, wherein the driving control unit does not execute the stopper position detection operation while the at least one of the flasher semiconductor switch and the buzzer semiconductor switch is controlled to turn on and off, and wherein, when the low necessity flasher driving condition is satisfied, the at least one of the flasher semiconductor switch and the buzzer semiconductor switch is not controlled to turn on and off while the driving control unit executes the stopper position detection operation.

33. The meter system according to claim 32,
wherein the stopper position detection operation executing condition includes a high necessity executing condition having high necessity for executing the stopper position detection operation rapidly and a confirmation executing condition having low necessity for executing the stopper position detection operation rapidly, wherein the driving control unit executes the stopper position detection operation when both of the high necessity executing condition and the low necessity flasher driving condition are satisfied simultaneously, wherein the at least one of the flasher semiconductor switch and the buzzer semiconductor switch is not controlled to turn on and off while the driving control unit executes the stopper position detection operation, wherein the flasher control unit controls the flasher semiconductor switch to turn on and off and the buzzer control unit controls the buzzer semiconductor switch to turn on and off when both of the low necessity flasher driving condition and the confirmation executing condition are simultaneously satisfied, and wherein the driving control unit does not execute the stopper position detection operation while the at least one of the flasher semiconductor switch and the buzzer semiconductor switch is controlled to turn on and off.

34. The meter system according to claim 32, wherein the misjudge protection flasher driving condition includes a condition whether an instruction signal transmitted from a mobile device wirelessly is input into the flasher control unit, and wherein the mobile device remote-controls the vehicle, on which the meter system is mounted.

35. The meter system according to claim 32, wherein the misjudge protection flasher driving condition includes a condition whether a combination lever is set to be a turn lamp blinking position, and wherein the combination lever is disposed in the vehicle, on which the meter system is mounted.

36. The meter system according to claim 32, wherein the low necessity flasher driving condition includes a condition whether a hazard lamp switch is set to be a hazard blinking position, and wherein the hazard lamp switch is disposed in the vehicle, on which the meter system is mounted.

37. A meter system for a vehicle comprising:

a pointer for indicating a vehicle condition value according to a rotation position of the pointer, wherein the pointer is rotatable along with a display surface of a scale plate for displaying the vehicle condition value;

a step motor for rotating the pointer, wherein the step motor includes a stator and a magnet rotor, the stator has a field winding for generating a first magnetic field when a driving signal is applied to the field winding in accordance with the vehicle condition value, and the magnet rotor is supported coaxially with the stator and is rotatable according to the first magnetic field;

a stopper mechanism for stopping rotating the pointer at a stopper position, which is disposed within a predetermined range from a zero point position toward a zero point returning direction, when the pointer rotates toward the zero point returning direction, wherein the zero point position shows a zero point of the vehicle condition value;

a detection element for detecting an inductive voltage at predetermined detection intervals, wherein the inductive voltage is generated in the field winding;

a driving control unit for controlling the driving signal with using the zero point as a standard, wherein the driving control unit executes a zero point stopper position detection operation for detecting an electric angle of the pointer based on the inductive voltage when the pointer stops at the stopper position, and the driving control unit sets the zero point to be equal to the electric angle; and a noise generating element for generating a second magnetic field during a generation period when a noise generating signal is input into the noise generating element, wherein the generation period has a starting time, at which the noise generating signal is input into the noise generating element;

wherein the detection time interval is longer than the generation period, and wherein the driving control unit controls the noise generating signal to input into the noise generating element in such a manner that the generation period is disposed in the detection time interval.

38. The meter system according to claim 37, wherein the noise generating element generates the second magnetic field at predetermined generation time intervals when the noise generating signal is input into the noise generating element, and wherein the driving control unit controls a length of the generation time interval in such a manner that the generation period is disposed in the detection time interval.

39. The meter system according to claim 37, wherein the driving control unit inputs the noise generating signal into the noise generating element in such a manner that the generation period is disposed in the detection time interval, and wherein the detection time interval starts from a detection time, at which the detection element detects the inductive voltage for the first time after the noise generating signal is input into the driving control unit from an external element.

40. The meter system according to claim 37, wherein the driving control unit determines at predetermined determination time intervals whether the noise generating signal is input into the noise generating element from an external element, wherein the determination time interval is shorter than the detection time interval, and wherein the driving control unit inputs the noise generating signal into the noise generating element in such a manner that the generation period is disposed in the detection time interval when the driving control unit determines that the noise generating signal is input into the driving control unit.

41. The meter system according to claim 37, wherein the noise generating element includes a semiconductor switch, and an operation unit, wherein the operation unit functions and stops functioning according to a switching operation of the semiconductor switch, wherein the semiconductor switch turns on and off when the noise generating signal is input into the noise generating element, and wherein the semiconductor switch generates the second magnetic field when the semiconductor switch turns on and off.

* * * * *